(12) United States Patent
Kang et al.

(10) Patent No.: US 12,063,767 B2
(45) Date of Patent: Aug. 13, 2024

(54) SEMICONDUCTOR DEVICE AND METHOD OF FABRICATING THE SAME

(71) Applicant: Samsung Electronics Co., Ltd., Suwon-si (KR)

(72) Inventors: Myung Gil Kang, Suwon-si (KR); Seunghun Lee, Hwaseong-si (KR); Sangdeok Kwon, Seoul (KR); Keun Hwi Cho, Seoul (KR); Sung Gi Hur, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 475 days.

(21) Appl. No.: 17/541,790

(22) Filed: Dec. 3, 2021

(65) Prior Publication Data

US 2022/0328496 A1 Oct. 13, 2022

(30) Foreign Application Priority Data

Apr. 13, 2021 (KR) .................. 10-2021-0047789

(51) Int. Cl.
| | | |
|---|---|---|
| *H01L 27/11* | (2006.01) | |
| *H01L 29/36* | (2006.01) | |
| *H01L 29/423* | (2006.01) | |
| *H01L 29/786* | (2006.01) | |
| *H10B 10/00* | (2023.01) | |

(52) U.S. Cl.
CPC ....... *H10B 10/12* (2023.02); *H01L 29/42392* (2013.01); *H01L 29/78618* (2013.01); *H01L 29/78696* (2013.01)

(58) Field of Classification Search
None
See application file for complete search history.

(56) References Cited

U.S. PATENT DOCUMENTS

| | | |
|---|---|---|
| 10,510,620 B1 | 12/2019 | Chanemougame et al. |
| 10,672,879 B2 | 6/2020 | Tsai et al. |
| 10,672,910 B2 | 6/2020 | Zhou et al. |
| 10,832,916 B1 | 11/2020 | Xie et al. |
| 10,840,146 B1 | 11/2020 | Paul et al. |
| 2020/0066725 A1 | 2/2020 | Bhuwalka et al. |

*Primary Examiner* — Asok K Sarkar
(74) *Attorney, Agent, or Firm* — MORGAN, LEWIS & BOCKIUS LLP

(57) ABSTRACT

A semiconductor device includes a first active pattern on a substrate, a pair of first source/drain patterns on the first active pattern and a first channel pattern between the pair of first source/drain patterns, wherein the first channel pattern includes a plurality of semiconductor patterns that are stacked and spaced apart from each other, a first gate electrode on the first channel pattern, a first gate cutting pattern that is adjacent to the first channel pattern and penetrates the first gate electrode, and a first residual pattern between the first gate cutting pattern and the first channel pattern. The first residual pattern covers an outermost sidewall of at least one semiconductor pattern of the plurality of semiconductor patterns of the first channel pattern. The first gate electrode includes, on an upper portion of the first gate electrode, a first extension that vertically overlaps the first residual pattern.

20 Claims, 40 Drawing Sheets

FIG. 8

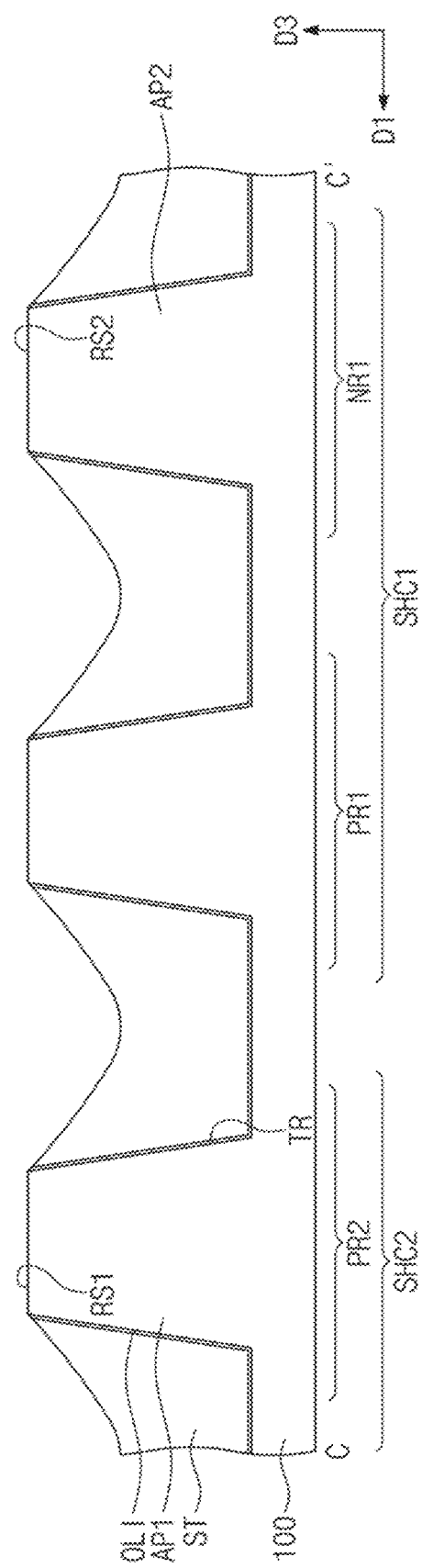

ID-2021-0047789 filed on Apr. 13, 2021 in the Korean

SEMICONDUCTOR DEVICE AND METHOD OF FABRICATING THE SAME

CROSS-REFERENCE TO RELATED APPLICATION

This U.S. nonprovisional application claims priority under 35 U.S.C. § 119 to Korean Patent Application No. 10-2021-0047789 filed on Apr. 13, 2021 in the Korean Intellectual Property Office, the disclosure of which is hereby incorporated by reference in its entirety.

BACKGROUND

The present inventive concepts relate to a semiconductor device and a method of fabricating the same, and more particularly, to a semiconductor device including a field effect transistor and a method of fabricating the same.

A semiconductor device includes an integrated circuit including metal oxide semiconductor field effect transistors (MOSFETs). As sizes and design rules of the semiconductor device are gradually decreased, sizes of the MOSFETs are also increasingly scaled down. The scale down of MOSFETs may deteriorate operating characteristics of the semiconductor device. Accordingly, various studies have been conducted to develop methods of fabricating semiconductor devices having superior performances while overcoming limitations caused by high integration of the semiconductor devices.

SUMMARY

Some example embodiments of the present inventive concepts provide a semiconductor device having increased reliability and improved electrical characteristics.

Some example embodiments of the present inventive concepts provide a method of fabricating a semiconductor device having increased reliability and improved electrical characteristics.

According to some example embodiments of the present inventive concepts, a semiconductor device may comprise: a first active pattern on a substrate; a pair of first source/drain patterns on the first active pattern and a first channel pattern between the pair of first source/drain patterns, the first channel pattern including a plurality of semiconductor patterns that are stacked and spaced apart from each other; a first gate electrode on the first channel pattern; a first gate cutting pattern that is adjacent to the first channel pattern and penetrates the first gate electrode; and a first residual pattern between the first gate cutting pattern and the first channel pattern. The first residual pattern may cover an outermost sidewall of at least one semiconductor pattern of the plurality of semiconductor patterns of the first channel pattern. The first gate electrode may include a first extension on an upper portion of the first gate electrode, and the first extension may vertically overlap the first residual pattern.

According to some example embodiments of the present inventive concepts, a semiconductor device may comprise: a logic region including a logic cell; and a memory region including a static random access memory (SRAM) cell. The logic cell may include: a first active pattern; a first channel pattern on the first active pattern, the first channel pattern including a plurality of semiconductor patterns that are stacked and spaced apart from each other; a first gate electrode on the first channel pattern; and a first gate cutting pattern that is adjacent to the first channel pattern and penetrates the first gate electrode. The SRAM cell may include: a second active pattern; a second channel pattern on the second active pattern, the second channel pattern including a separate plurality of semiconductor patterns that are stacked and spaced apart from each other; a second gate electrode on the second channel pattern; a second gate cutting pattern that is adjacent to the second channel pattern and penetrates the second gate electrode; and a residual pattern between the second gate cutting pattern and the second channel pattern. The first gate electrode may have a gate-all-around structure in which the first gate electrode surrounds the plurality of semiconductor patterns of the first channel pattern. The residual pattern may cover an outermost sidewall of at least one semiconductor pattern of the separate plurality of semiconductor patterns of the second channel pattern. The second gate electrode may be on a top surface, a bottom surface, and a sidewall of the at least one semiconductor pattern of the separate plurality of semiconductor patterns of the second channel pattern, and may not be on the outermost sidewall of the at least one of the semiconductor patterns included in the second channel pattern.

According to some example embodiments of the present inventive concepts, a semiconductor device may comprise: a first active pattern and a second active pattern on a substrate; a pair of first source/drain patterns on the first active pattern and a first channel pattern between the pair of first source/drain patterns; a pair of second source/drain patterns on the second active pattern and a second channel pattern between the pair of second source/drain patterns, the first channel pattern including a plurality of semiconductor patterns that are stacked and spaced apart from each other, the second channel pattern including a separate plurality of semiconductor patterns that are stacked and spaced apart from each other; a gate electrode on the first and second channel patterns; a gate dielectric layer between the gate electrode and the first and second channel patterns; a gate spacer on at least one sidewall of the gate electrode; a first gate cutting pattern that is adjacent to the first channel pattern and penetrates the gate electrode; a second gate cutting pattern that is adjacent to the second channel pattern and penetrates the gate electrode; a first residual pattern between the first gate cutting pattern and the first channel pattern; a gate capping pattern on the gate electrode and the first and second gate cutting patterns; an interlayer dielectric layer on the gate capping pattern; an active contact that penetrates the interlayer dielectric layer and has electrical connection with at least one source/drain pattern of the pair of first source/drain patterns and/or the pair of second source/drain patterns; a gate contact that penetrates the interlayer dielectric layer and the gate capping pattern and has electrical connection with the gate electrode; a first metal layer on the interlayer dielectric layer, the first metal layer including a first power line on the first gate cutting pattern, a second power line on the second gate cutting pattern, and a plurality of first wiring lines between the first and second power lines, the first wiring lines being correspondingly electrically connected to the active contact and the gate contact; and a second metal layer on the first metal layer. The second metal layer may include a plurality of second wiring lines electrically connected to the first metal layer. The first residual pattern may cover a first outermost sidewall of at least one semiconductor pattern of the plurality of semiconductor patterns of the first channel pattern. A top surface of the first residual pattern may have a height that increases in a direction from the first channel pattern toward the first gate cutting pattern.

According to some example embodiments of the present inventive concepts, a method of fabricating a semiconductor device may comprise: forming a stack pattern on an active pattern of a substrate, the stack pattern including a plurality of sacrificial layers and a plurality of semiconductor patterns that are alternately stacked on the active pattern; forming on the stack pattern a sacrificial pattern that extends across the stack pattern; forming an interlayer dielectric layer on the sacrificial pattern; forming a gate cutting pattern that penetrates a partial region of the sacrificial pattern; using an etching process to selectively etch the sacrificial pattern to form an outer area that exposes the stack pattern; forming a residual pattern during the etching process of the sacrificial pattern based on allowing a portion of the sacrificial pattern to remain between the gate cutting pattern and the stack pattern; forming inner areas between the plurality of semiconductor patterns of the stack pattern based on selectively removing the sacrificial layers of the stack pattern, the sacrificial layers being exposed to the outer area; and forming a gate electrode that fills the inner areas and the outer area.

BRIEF DESCRIPTION OF THE DRAWINGS

FIGS. 8 and 9 illustrate cross-sectional views taken along line E-E' of FIG. 4, showing a semiconductor device according to some example embodiments of the present inventive concepts.

FIGS. 10A, 10B, 11A, 11B, 12A, 12B, 12C, 12D, 13A, 13B, 13C, 13D, 14A, 14B, 14C, 14D, 15A, 15B, 15C, 15D, 16A, 16B, 16C, and 16D illustrate cross-sectional views showing a method of fabricating a semiconductor device according to some example embodiments of the present inventive concepts.

DETAILED DESCRIPTION

Figure 1:
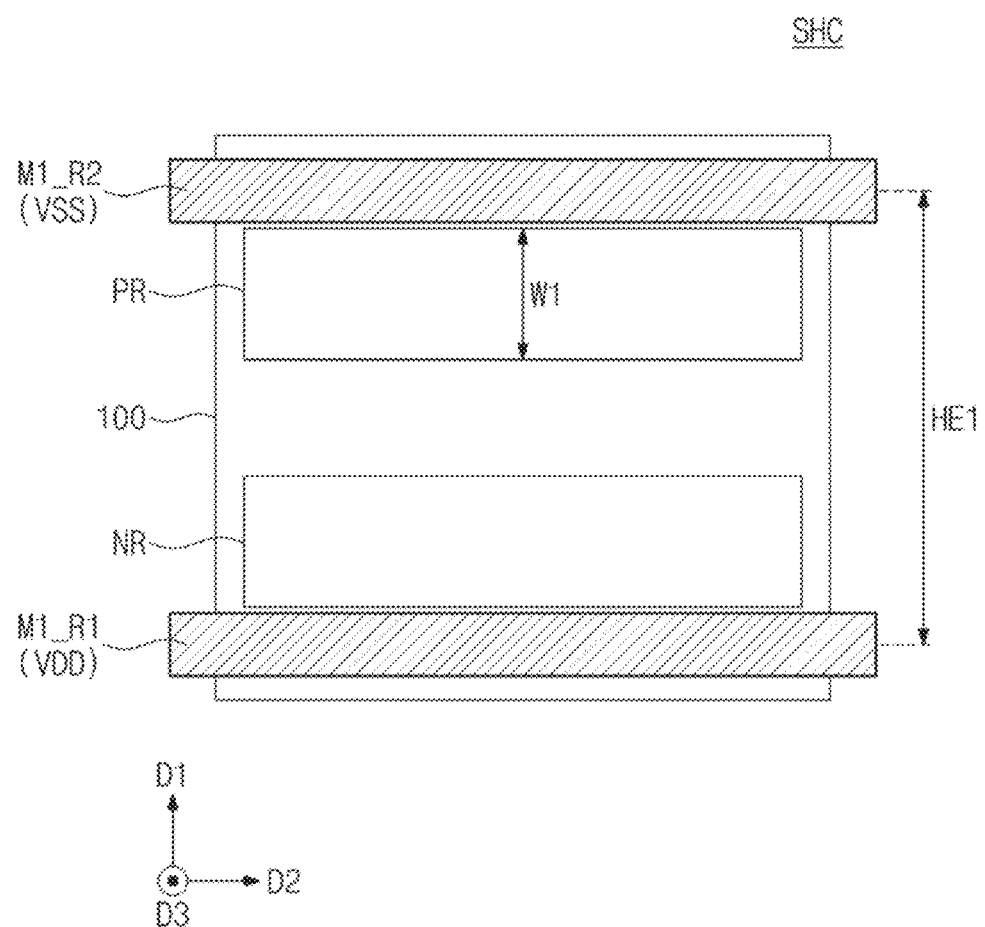
FIGS. 1, 2, and 3 illustrate conceptual views showing logic cells of a semiconductor device according to some example embodiments of the present inventive concepts.

Hereinafter, some example embodiments of the present inventive concepts will be described with reference to the accompanying drawings.

It will be understood that when an element such as a layer, film, region, or substrate is referred to as being "on" another element, it may be directly on the other element or intervening elements may also be present. In contrast, when an element is referred to as being "directly on" another element, there are no intervening elements present. It will further be understood that when an element is referred to as being "on" another element, it may be above or beneath or adjacent (e.g., horizontally adjacent) to the other element.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a. tolerance of ±10%).

Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a. tolerance of ±10%).

Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of ±10%)).

It will be understood that elements and/or properties thereof may be recited herein as being "the same" or "equal" as other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same.

It will be understood that elements and/or properties thereof described herein as being "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

Figure 2:
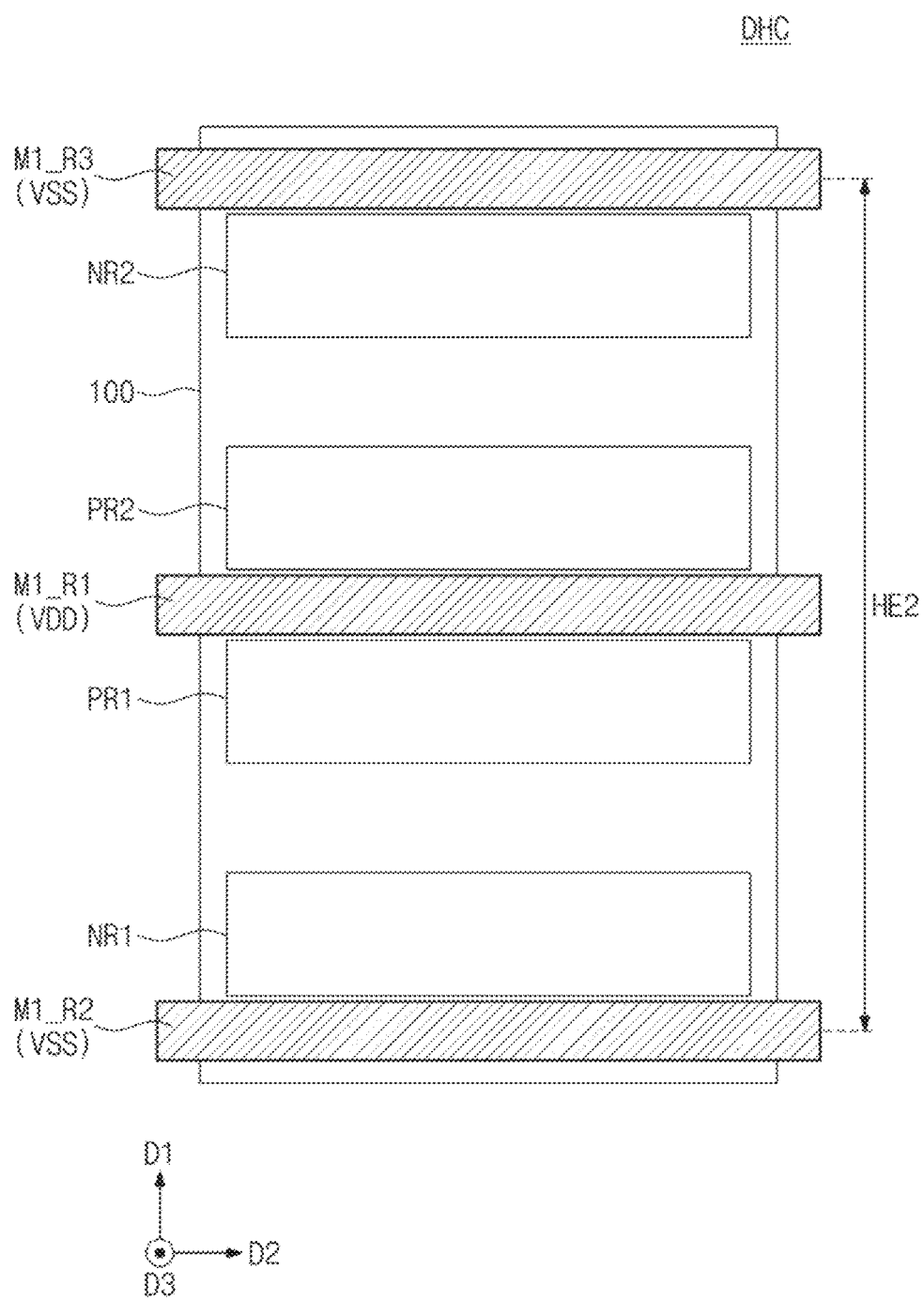
Figure 3:
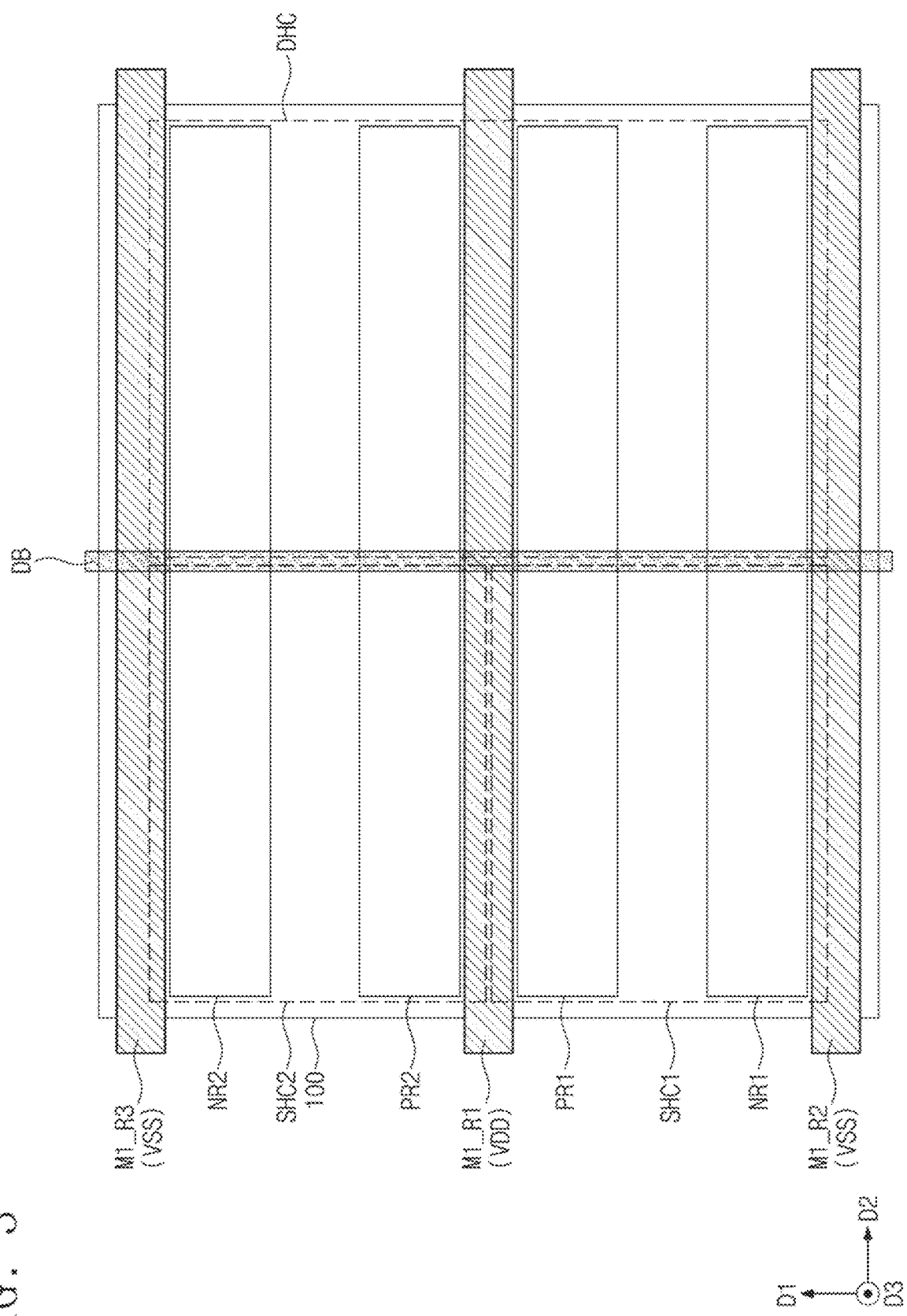

FIGS. 1, 2, and 3 illustrate conceptual views showing logic cells of a semiconductor device according to some example embodiments of the present inventive concepts.

Referring to FIG. 1, a single height cell SHC may be provided. For example, a substrate 100 may be provided thereon with a first power line M1_R1 and a second power line M1_R2. The first power line M1_R1 may be a path for providing a drain voltage VDD, for example, a power voltage. The second power line M1_R2 may be a path for providing a source voltage VSS, for example, a ground voltage.

The single height cell SHC may be defined between the first power line M1_R1 and the second power line M1_R2. The single height cell SHC may include one PMOSFET region PR and one NMOSFET region NR. For example, the single height cell SHC may have a CMOS structure provided between the first power line M1_R1 and the second power line M1_R2.

Each of the PMOSFET and NMOSFET regions PR and NR may have a first width W1 in a first direction D1. A first height HE1 may be defined as a length in the first direction D1 of the single height cell SHC. The first height HE1 may be the same or substantially the same as a distance (e.g., pitch) between the first power line M1_R1 and the second power line M1_R2.

The single height cell SHC may constitute one logic cell. In this description, the logic cell may mean a logic device, such as AND, OR, XOR, XNOR, and inverter, that performs a specific function. For example, the logic cell may include transistors for constituting a logic device and wiring lines that connect the transistors to each other.

Referring to FIG. 2, a double height cell DHC may be provided. For example, a substrate 100 may be provided thereon with a first power line M1_R1, a second power line M1_R2, and a third power line M1_R3. The first power line M1_R1 may be located between the second power line M1_R2 and the third power line M1_R3. The third power line M1_R3 may be a path for providing a drain voltage VDD.

The double height cell DHC may be defined between the second power line M1_R2 and the third power line M1_R3. The double height cell DHC may include a first PMOSFET region PR1, a second PMOSFET region PR2, a first NMOSFET region NR1, and a second NMOSFET region NR2.

The first NMOSFET region NR1 may be adjacent to the second power line M1_R2. The second NMOSFET region NR2 may be adjacent to the third power line M1_R3. The first and second PMOSFET regions PR1 and PR2 may be adjacent to the first power line M1_R1. When viewed in plan, the first power line M1_R1 may be located between the first and second PMOSFET regions PR1 and PR2.

A second height HE2 may be defined as a length in the first direction D1 of the double height cell DHC. The second height HE2 may be about twice the first height HE1 of FIG. 1. The first and second PMOSFET regions PR1 and PR2 of the double height cell DHC may collectively operate as a single PMOSFET region.

Therefore, the double height cell DHC may have a PMOS transistor whose channel size is greater than that of a PMOS transistor included in the single height cell SHC discussed above in FIG. 1. For example, the channel size of the PMOS transistor included in the double height cell DHC may be about twice that of the PMOS transistor included in the single height cell SHC. In conclusion, the double height cell DHC may operate at a higher speed than that of the single height cell SHC. In the present inventive concepts, the double height cell DHC shown in FIG. 2 may be defined as a multi-height cell. Although not shown, the multi-height cell may include a triple height cell whose cell height is about three times that of the single height cell SHC.

Referring to FIG. 3, a substrate 100 may be provided thereon with a first single height cell SHC1, a second single height cell SHC2, and a double height cell DHC that are two-dimensionally located. The first single height cell SHC1 may be located between a first power line M1_R1 and a second power line M1_R2. The second single height cell SHC2 may be located between the first power line M1_R1 and a third power line M1_R3. The second single height cell SHC2 may be adjacent in the first direction D1 to the first single height cell SHC1.

The double height cell DHC may be located between the second power line M1_R2 and the third power line M1_R3. The double height cell DHC may be adjacent in a second direction D2 to the first and second single height cells SHC1 and SHC2.

A separation structure DB may be provided between the first single height cell SHC1 and the double height cell DHC and between the second single height cell SHC2 and the double height cell DHC. The separation structure DB may electrically separate an active region of the double height cell DHC from an active region of each of the first and second single height cells SHC1 and SHC2.

Figure 4:
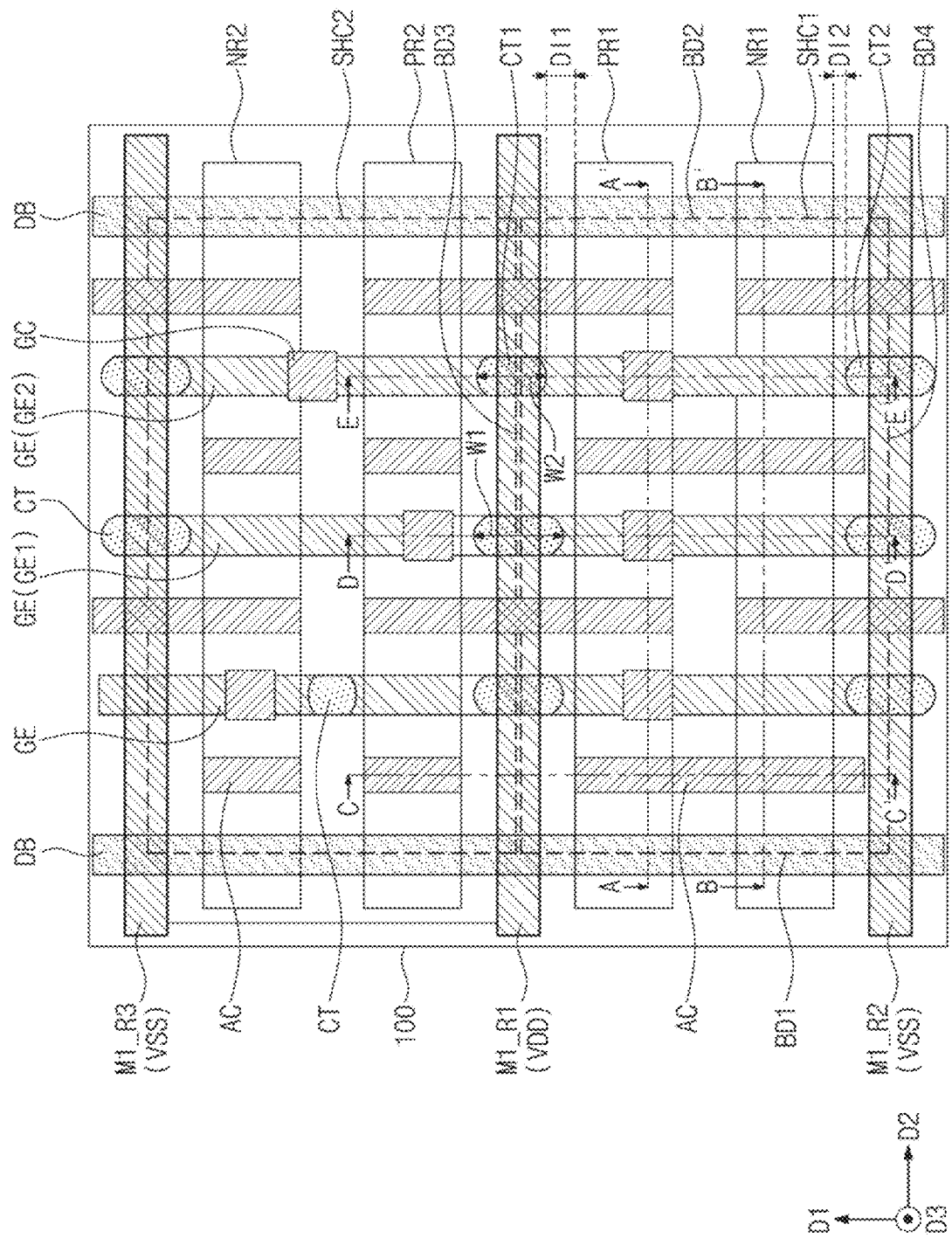
FIG. 4 illustrates a plan view showing a semiconductor device according to some example embodiments of the present inventive concepts.

FIG. 4 illustrates a plan view showing a semiconductor device according to some example embodiments of the present inventive concepts. FIGS. 5A, 5B, 5C, 5D, and 5E illustrate cross-sectional views respectively taken along lines A-A', B-B', C-C', D-D', and E-E' of FIG. 4. FIG. 6 illustrates an enlarged view showing an example of section M depicted in FIG. 5D. A semiconductor device shown in FIGS. 4 and 5A to 5E is a detailed example of the first and second single height cells SHC1 and SHC2 of FIG. 3.

Referring to FIGS. 4 and 5A to 5E, first and second single height cells SHC1 and SHC2 may be provided on a substrate 100. Each of the first and second single height cells SHC1 and SHC2 may include logic transistors included in a logic circuit. The substrate 100 may be a compound semiconductor substrate or a semiconductor substrate including silicon, germanium, or silicon-germanium. For example, the substrate 100 may be a silicon substrate.

The substrate 100 may have a first PMOSFET region PR1, a second PMOSFET region PR2, a first NMOSFET region NR1, and a second NMOSFET region NR2. Each of the first PMOSFET region PR1, the second PMOSFET region PR2, the first NMOSFET region NR1, and the second NMOSFET region NR2 may extend in the second direction D2. The first single height cell SHC1 may include the first NMOSFET region NR1 and the first PMOSFET region PR1, and the second single height cell SHC2 may include the second PMOSFET region PR2 and the second NMOSFET region NR2.

A first active pattern AP1 and a second active pattern AP2 on a substrate 100 may be defined by a trench TR formed on an upper portion of the substrate 100. The first active pattern AP1 may be provided on each of the first and second PMOSFET regions PR1 and PR2. The second active pattern AP2 may be provided on each of the first and second NMOSFET regions NR1 and NR2. The first and second active patterns AP1 and AP2 may extend in the second direction D2. The first and second active patterns AP1 and AP2 may be vertically protruding portions of the substrate 100. In some example embodiments, at least one of the first active pattern AP1 or the second active pattern AP2 may be in a static random access memory (SRAM) cell. In some example embodiments, at least one of the first active pattern AP1 or the second active pattern AP2 may be in a logic cell.

The trench TR may be filled with a device isolation layer ST. The device isolation layer ST may include a silicon oxide layer. The device isolation layer ST may not cover any of first and second channel patterns CH1 and CH2 which will be discussed below.

A liner layer OLI may be interposed between the device isolation layer ST and the first and second active patterns AP1 and AP2. The liner layer OLI may directly cover a sidewall of each of the first and second active patterns AP1 and AP2. For example, the liner layer OLI may directly cover a sidewall of the trench TR. The liner layer OLI may directly cover a bottom surface of the trench TR. For example, the liner layer OLI may include a silicon oxide layer, a silicon nitride layer, or a combination thereof. In some example embodiments of the present inventive concepts, the liner layer OLI may include the same material as that of the device isolation layer ST, and in this case, no boundary may appear between the liner layer OLI and the device isolation layer ST.

A first channel pattern CH1 may be provided on the first active pattern AP1. A second channel pattern CH2 may be provided on the second active pattern AP2. Each of the first and second channel patterns CH1 and CH2 may include a first semiconductor pattern SP1, a second semiconductor pattern SP2, and a third semiconductor pattern SP3 that are sequentially stacked (e.g., a plurality of semiconductor patterns that are stacked and spaced apart from each other). The first, second, and third semiconductor patterns SP1, SP2, and SP3 may be spaced apart from each other in a vertical direction or a third direction D3. It will be understood that elements that are "spaced apart" from each other may be isolated from direct contact with each other.

Each of the first, second, and third semiconductor patterns SP1, SP2, and SP3 may include silicon (Si), germanium (Ge), or silicon-germanium (SiGe). For example, each of the first, second, and third semiconductor patterns SP1, SP2, and SP3 may include crystalline silicon.

A plurality of first source/drain patterns SD1 may be provided on the first active pattern AP1. A plurality of first recessions RS1 may be formed on the upper portion of the first active pattern AP1. The first source/drain patterns SD1 may be provided in corresponding first recessions RS1. The first source/drain patterns SD1 may be impurity regions having a first conductivity type (e.g., p-type). The first channel pattern CH1 may be interposed between a pair of first source/drain patterns SD1. For example, the pair of first source/drain patterns SD1 may be connected to each other through the stacked first, second, and third semiconductor patterns SP1, SP2, and SP3.

A plurality of second source/drain patterns SD2 may be provided on the second active pattern AP2. A plurality of second recessions RS2 may be formed on an upper portion of the second active pattern AP2. The second source/drain patterns SD2 may be provided in corresponding second recessions RS2. The second source/drain patterns SD2 may be impurity regions having a second conductivity type (e.g., n-type). The second channel pattern CH2 may be interposed between a pair of second source/drain patterns SD2. For example, the pair of second source/drain patterns SD2 may be connected to each other through the stacked first, second, and third semiconductor patterns SP1, SP2, and SP3 that are stacked and spaced apart from each other (which may be referred to as a separate plurality of semiconductor patterns of the second channel pattern CH2).

The first and second source/drain patterns SD1 and SD2 may be epitaxial patterns formed by a selective epitaxial growth process. For example, each of the first and second source/drain patterns SD1 and SD2 may have a top surface at a level the same or substantially the same as that of a top surface of the third semiconductor pattern SP3. For another example, each of the first and second source/drain patterns SD1 and SD2 may have a top surface at a level higher than that of a top surface of the third semiconductor pattern SP3.

As described herein, a "level" or "height" of a surface, end, structure, or the like may refer to a distance from a common (e.g., same) reference location in the third direction D3 (e.g., an upper and/or lower surface of the substrate 100). Therefore, when a first element is described herein to be at a higher level or height than a second element, the first element may be further from the common reference location in the third direction D3 (e.g., an upper and/or lower surface of the substrate 100) than the second element. Furthermore, when a first element is described herein to be at a lower level or height than a second element, the first element may be closer to the common reference location in the third direction D3 (e.g., an upper and/or lower surface of the substrate 100) than the second element. Furthermore, when a first element is described herein to be at a same or substantially same level as a second element, the first element may be equally distant from/close to the common reference location in the third direction D3 (e.g., an upper and/or lower surface of the substrate 100) as the second element.

The first source/drain patterns SD1 may include a semiconductor element (e.g., SiGe) whose lattice constant is greater than that of a semiconductor element of the substrate 100. Therefore, a pair of first source/drain patterns SD1 may provide the first channel pattern CH1 with compressive stress. The second source/drain patterns SD2 may include the same semiconductor element (e.g., Si) as that of the substrate 100.

Each of the first source/drain patterns SD1 may include a first semiconductor layer SEL1 and a second semiconductor layer SEL2 on the first semiconductor layer SELL. With reference back to FIG. 5A, the following will describe a cross-sectional shape in the second direction D2 of the first source/drain pattern SD1.

The first semiconductor layer SEL1 may cover an inner wall of the first recession RS1. The first semiconductor layer SEL1 may have a thickness that decreases in a direction toward an upper portion thereof from a lower portion thereof. For example, a thickness in the third direction D3 of the first semiconductor layer SEL1 on a bottom surface of the first recession RS1 may be greater than a thickness in the second direction D2 of the first semiconductor layer SEL1 on an upper portion of the first recession RS1. The first semiconductor layer SEL1 may be shaped like U along a profile of the first recession RS1.

The second semiconductor layer SEL2 may fill a remaining portion of the first recession RS1 filled with the first semiconductor layer SEL1. The second semiconductor layer SEL2 may have a volume greater than that of the first semiconductor layer SEL1. For example, a ratio of the volume of the second semiconductor layer SEL2 to a total volume of the first source/drain pattern SD1 may be greater than a ratio of the volume of the first semiconductor layer SEL1 to a total volume of the first source/drain pattern SD1.

Each of the first and second semiconductor layers SEL1 and SEL2 may include silicon-germanium (SiGe). For example, the first semiconductor layer SEL1 may contain germanium (Ge) whose concentration is relatively low. In some example embodiments of the present inventive concepts, the first semiconductor layer SEL1 may include silicon (Si) and may not include germanium (Ge). The first semiconductor layer SEL1 may have a germanium concentration of about 0 at % to about 10 at %.

The second semiconductor layer SEL2 may contain germanium (Ge) whose concentration is relatively high. For example, the second semiconductor layer SEL2 may have a germanium (Ge) concentration of about 30 at % to about 75 at %. The germanium concentration of the second semiconductor layer SEL2 may increase in the third direction D3. For example, the second semiconductor layer SEL2 adjacent to the first semiconductor layer SEL1 may have a germanium concentration of about 40 at %, but an upper portion of the second semiconductor layer SEL2 may have a germanium concentration of about 60 at %.

The first and second semiconductor layers SEL1 and SEL2 may include impurities (e.g., boron) that cause the first source/drain pattern SD1 to have a p-type conductivity type. An impurity concentration (e.g., atomic percent) of the second semiconductor layer SEL2 may be greater than that of the first semiconductor layer SEL1.

The first semiconductor layer SEL1 may reduce or prevent stacking faults between the substrate 100 and the second semiconductor layer SEL2 and between the second semiconductor layer SEL2 and the first, second, and third semiconductor patterns SP1, SP2, and SP3. The occurrence of stacking faults may increase a channel resistance. The stacking faults may easily occur at a floor of the first recession RS1. Accordingly, it may be preferable that the first semiconductor layer SEL1 adjacent to the floor of the first recession RS1 has a relatively large thickness to reduce or prevent the stacking faults.

The first semiconductor layer SEL1 may protect the second semiconductor layer SEL2 while sacrificial layers SAL are replaced with first, second, and third parts PO1, PO2, and PO3 of a gate electrode GE which will be discussed below. For example, the first semiconductor layer SEL1 may reduce or prevent the second semiconductor layer SEL2 from being etched with an etching material that etches the sacrificial layers SAL.

Gate electrodes GE may be provided to extend in the first direction D1, while running across the first and second channel patterns CH1 and CH2. The gate electrodes GE may be arranged at a first pitch in the second direction D2. Each of the gate electrodes GE may vertically overlap the first and second channel patterns CH1 and CH2. A gate electrode GE vertically overlapping a first channel pattern CH1 may be referred to herein as a first gate electrode on the first channel pattern CH1.

The gate electrode GE may include a first part PO1 interposed between the first semiconductor pattern SP1 and the active pattern AP1 or AP2, a second part PO2 interposed between the first semiconductor pattern SP1 and the second semiconductor pattern SP2, a third part PO3 interposed between the second semiconductor pattern SP2 and the third semiconductor pattern SP3, and a fourth part PO4 on the third semiconductor pattern SP3.

Referring again to FIG. 5A, on the PMOSFET region PR, the gate electrode GE may have different widths at the first, second, and third parts PO1, PO2, and PO3 thereof. For example, a maximum width in the second direction D2 of the third part PO3 may be greater than that in the second direction D2 of the second part PO2. A maximum width in the second direction D2 of the first part PO1 may be greater than that in the second direction D2 of the third part PO3.

Referring back to FIGS. 5D and 5E, the gate electrode GE may be provided on a top surface TS, a bottom surface BS, and at least one of sidewalls SW1 and SW2 of each of the first, second, and third semiconductor patterns SP1, SP2, and SP3. In this sense, a transistor according to some example embodiments may be a three-dimensional field effect transistor (e.g., MBCFET or GAAFET) in which the gate electrode GE three-dimensionally surrounds the first and second channel patterns CH1 and CH2.

For example, the first single height cell SHC1 may have a first boundary BD1 and a second boundary BD2 that are opposite to each other in the second direction D2. The first and second boundaries BD1 and BD2 may extend in the first direction D1. The first single height cell SHC1 may have a third boundary BD3 and a fourth boundary BD4 that are opposite to each other in the first direction D1. The third and fourth boundaries BD3 and BD4 may extend in the second direction D2.

Gate cutting patterns CT may be located on a boundary in the second direction D2 of each of the first and second single height cells SHC1 and SHC2. For example, the gate cutting patterns CT may be located on the third and fourth boundaries BD3 and BD4 of the first single height cell SHC1. The gate cutting patterns CT may be arranged at the first pitch along the third boundary BD3. The gate cutting patterns CT may be arranged at the first pitch along the fourth boundary BD4. When viewed in plan, the gate cutting patterns CT on the third and fourth boundaries BD3 and BD4 may be located to overlap corresponding gate electrodes GE. The gate cutting patterns CT may include a dielectric material, such as a silicon oxide layer, a silicon nitride layer, or a combination thereof.

The gate cutting pattern CT may separate the gate electrode GE on the first single height cell SHC1 from the gate electrode GE on the second single height cell SHC2. The gate cutting pattern CT may be interposed between the gate electrode GE on the first single height cell SHC1 and the gate electrode GE on the second single height cell SHC2, which gate electrodes GE are aligned with each other in the first direction D1. For example, the gate cutting patterns CT may divide the gate electrode GE, which extends in the first direction D1, into a plurality of gate electrodes GE.

Referring back to FIG. 4, at least one of the gate cutting patterns CT may not be positioned on a boundary of a cell, but may be positioned within the cell. For example, the gate cutting pattern CT may be located between the second PMOSFET region PR2 and the second NMOSFET region NR2 of the second single height cell SHC2.

The gate cutting pattern CT may be spaced apart at various distances from its adjacent one of the regions PR1, PR2, NR1, and NR2. For example, a first gate cutting pattern CT1 may penetrate a second gate electrode GE2 and may be spaced apart at a first distance DI1 from the first PMOSFET region PR1 adjacent thereto. A second gate cutting pattern CT2 may penetrate the second gate electrode GE2 and may be spaced apart at a second distance DI2 from the first NMOSFET region NR1 adjacent thereto. The first distance DI1 may be greater than the second distance DI2.

Referring back to FIGS. 4 and 5A to 5E, a pair of gate spacers GS may be located on opposite sidewalls of the fourth part PO4 of the gate electrode GE. The gate spacers GS may extend in the first direction D1 along the gate electrode GE. The gate spacers GS may have their top surfaces higher than that of the gate electrode GE. The top surfaces of the gate spacers GS may be coplanar with that of a first interlayer dielectric layer 110 which will be discussed below. The gate spacers GS may include at least one selected from SiCN, SiCON, and SiN.

Alternatively, the gate spacers GS may each include a multi-layer formed of at least two selected from SiCN, SiCON, and SiN.

A gate capping pattern GP may be provided on the gate electrode GE and may be understood to be on the first and second gate cutting patterns CT1 and CT2. The gate capping pattern GP may extend in the first direction D1 along the gate electrode GE. The gate capping pattern GP may include a material having an etch selectivity with respect to first and second interlayer dielectric layers 110 and 120 which will be discussed below. For example, the gate capping pattern GP may include at least one selected from SiON, SiCN, SiCON, and SiN.

A gate dielectric layer GI may be interposed between the gate electrode GE and the first channel pattern CH1 and between the gate electrode GE and the second channel pattern CH2. The gate dielectric layer GI may cover the top surface TS, the bottom surface BS, and the opposite sidewalls SW1 and SW2 of each of the first, second, and third semiconductor patterns SP1, SP2, and SP3. The gate dielectric layer GI may cover a top surface of the device isolation layer ST below the gate electrode GE. The gate dielectric layer GI may cover a sidewall of the gate cutting pattern CT (see FIGS. 5D and 5E).

In some example embodiments of the present inventive concepts, the gate dielectric layer GI may include one or more of a silicon oxide layer, a silicon oxynitride layer, and a high-k dielectric layer. The high-k dielectric layer may include a material whose dielectric constant is greater than that of a silicon oxide layer. For example, the high-k dielectric material may include at least one selected from hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and lead zinc niobate.

In some example embodiments, a semiconductor device according to the present inventive concepts may include a negative capacitance field effect transistor that uses a negative capacitor. For example, the gate dielectric layer GI may include a ferroelectric material layer that exhibits ferroelectric properties and a paraelectric material layer that exhibits paraelectric properties.

The ferroelectric material layer may have a negative capacitance, and the paraelectric material layer may have a positive capacitance. For example, when two or more capacitors are connected in series, and when each capacitor has a positive capacitance, an overall capacitance may be reduced to be less than the capacitance of each capacitor. In contrast, when at least one of two or more capacitors connected in series has a negative capacitance, an overall capacitance may have a positive value that is increased to be greater than an absolute value of the capacitance of each capacitor.

When the ferroelectric material layer having a negative capacitance is connected in series to the paraelectric material layer having a positive capacitance, there may be an increase in overall capacitance of the ferroelectric and paraelectric material layers that are connected in series. The increase in overall capacitance may be used to allow a transistor including the ferroelectric material layer to have a sub-threshold swing of less than about 60 mV/decade at room temperature.

The ferroelectric material layer may have ferroelectric properties. The ferroelectric material layer may include, for example, at least one selected from hafnium oxide, hafnium zirconium oxide, barium strontium titanium oxide, and lead zirconium titanium oxide. For example, the hafnium zirconium oxide may be a material in which hafnium oxide is doped with zirconium (Zr). For another example, the hafnium zirconium oxide may be a compound of hafnium (Hf), zirconium (Zr), and oxygen (O).

The ferroelectric material layer may further include impurities doped thereinto. For example, the impurities may include at least one selected from aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and tin (Sn). The type of impurities included in the ferroelectric material layer may be changed depending on what ferroelectric material is included in the ferroelectric material layer.

When the ferroelectric material layer includes hafnium oxide, the ferroelectric material layer may include at least one of impurities such as gadolinium (Gd), silicon (Si), zirconium (Zr), aluminum (Al), and yttrium (Y).

When the impurities are aluminum (Al), the ferroelectric material layer may include about 3 to about 8 atomic percent aluminum. In this description, the ratio of impurities may be a ratio of aluminum to the sum of hafnium and aluminum.

When the impurities are silicon (Si), the ferroelectric material layer may include about 2 to about 10 atomic percent silicon. When the impurities are yttrium (Y), the ferroelectric material layer may include about 2 to about 10 atomic percent yttrium. When the impurities are gadolinium (Gd), the ferroelectric material layer may include about 1 to about 7 atomic percent gadolinium. When the impurities are zirconium (Zr), the ferroelectric material layer may include about 50 to about 80 atomic percent zirconium.

The paraelectric material layer may have paraelectric properties. The paraelectric material layer may include, for example, at least one selected from silicon oxide and high-k metal oxide. The metal oxide included in the paraelectric material layer may include, for example, at least one selected from hafnium oxide, zirconium oxide, and aluminum oxide, but inventive concepts are not limited thereto.

The ferroelectric and paraelectric material layers may include the same material. The ferroelectric material layer may have ferroelectric properties, but the paraelectric material layer may not have ferroelectric properties. For example, when the ferroelectric material layer and the paraelectric material layer include hafnium oxide, the hafnium oxide included in the ferroelectric material layer may have a crystal structure different from that of the hafnium oxide included in the paraelectric material layer.

The ferroelectric material layer may have a thickness having ferroelectric properties. The thickness of the ferroelectric material layer may range, for example, from about 0.5 nm to about 10 nm. Because ferroelectric materials have their own critical thickness that exhibits ferroelectric properties, the thickness of the ferroelectric material layer may depend on ferroelectric material.

For example, the gate dielectric layer GI may include a single ferroelectric material layer. For another example, the gate dielectric layer GI may include a plurality of ferroelectric layers that are spaced apart from each other. The gate dielectric layer GI may have a stack structure in which a plurality of ferroelectric material layers are alternately stacked with a plurality of paraelectric material layers.

The gate electrode GE may include a first metal pattern and a second metal pattern on the first metal pattern. The first metal pattern may be provided on the gate dielectric layer GI and may be adjacent to the first, second, and third semiconductor patterns SP1, SP2, and SP3. The first metal pattern may include a work-function metal that controls a threshold voltage of a transistor. A thickness and composition of the first metal pattern may be adjusted to achieve a desired threshold voltage of a transistor. For example, the first, second, and third parts PO1, PO2, and PO3 of the gate electrode GE may be formed of the first metal pattern or a work-function metal.

The first metal pattern may include a metal nitride layer. For example, the first metal pattern may include nitrogen (N) and at least one metal selected from titanium (Ti), tantalum (Ta), aluminum (Al), tungsten (W), and molybdenum (Mo). In addition, the first metal pattern may further include carbon (C). The first metal pattern may include a plurality of stacked work-function metal layers.

The second metal pattern may include metal whose resistance is less than that of the first metal pattern. For example, the second metal pattern may include at least one metal selected from tungsten (W), aluminum (Al), titanium (Ti), and tantalum (Ta). For example, the fourth part PO4 of the gate electrode GE may include a first metal pattern and a second metal pattern on the first metal pattern.

Referring back to FIG. 5B, inner spacers IP may be provided on the first and second NMOSFET regions NR1 and NR2. The inner spacers IP may be correspondingly interposed between the second source/drain pattern SD2 and the first, second, and third parts PO1, PO2, and PO3 of the gate electrode GE. The inner spacers IP may be in direct contact with the second source/drain pattern SD2. The inner spacer IP may separate the second source/drain pattern SD2 from each of the first, second, and third parts PO1, PO2, and PO3 of the gate electrode GE.

A first interlayer dielectric layer 110 may be provided on the substrate 100. The first interlayer dielectric layer 110 may cover the gate spacers GS and the first and second source/drain patterns SD1 and SD2. The first interlayer dielectric layer 110 may have a top surface coplanar or substantially coplanar with that of the gate capping pattern GP and that of the gate spacer GS. The first interlayer dielectric layer 110 may be provided thereon with a second interlayer dielectric layer 120 that is on, and covers, the gate capping pattern GP. A third interlayer dielectric layer 130 may be provided on the second interlayer dielectric layer 120. A fourth interlayer dielectric layer 140 may be provided on the third interlayer dielectric layer 130. For example, the first to fourth interlayer dielectric layers 110 to 140 may include a silicon oxide layer.

Each of the first and second single height cells SHC1 and SHC2 may be provided on its opposite sides with a pair of separation structures DB that are opposite to each other in the second direction D2. For example, the pair of separation structures DB may be correspondingly provided on the first and second boundaries BD1 and BD2 of the first single height cell SHC1. The separation structure DB may extend in the first direction D1 parallel to the gate electrodes GE. A pitch between the separation structure DB and its adjacent gate electrode GE may be the same as the first pitch.

The separation structure DB may penetrate the first and second interlayer dielectric layers 110 and 120, and may extend into the first and second active patterns AP1 and AP2. The separation structure DB may penetrate the upper portion of each of the first and second active patterns AP1 and AP2. The separation structure DB may electrically separate an active region of each of the first and second single height cells SHC1 and SHC2 from an active region of another cell.

Active contacts AC may be provided to penetrate the first and second interlayer dielectric layers 110 and 120 and to correspondingly have electrical connection with the first and second source/drain patterns SD1 and SD2. A pair of active contacts AC may be provided on opposite sides of the gate electrode GE. When viewed in plan, the active contact AC may have a bar shape that extends in the first direction D1.

The active contact AC may be a self-aligned contact. For example, the gate capping pattern GP and the gate spacer GS may be used to form the active contact AC in a self-alignment manner. The active contact AC may cover, for example, at least a portion of a sidewall of the gate spacer GS. Although not shown, the active contact AC may cover a portion of the top surface of the gate capping pattern GP.

Silicide patterns SC may be correspondingly interposed between the active contact AC and the first source/drain pattern SD1 and between the active contact AC and the second source/drain pattern SD2. The active contact AC may be electrically connected through the silicide pattern SC to one of the first and second source/drain patterns SD1 and SD2. The silicide pattern SC may include metal silicide, for example, at least one selected from titanium silicide, tantalum silicide, tungsten silicide, nickel silicide, and cobalt silicide.

Referring back to FIG. 5C, at least one active contact AC on the first single height cell SHC1 may electrically connect the first source/drain pattern SD1 of the first PMOSFET region PR1 to the second source/drain pattern SD2 of the first NMOSFET region NR1. The active contact AC may extend in the first direction D1 from the second source/drain pattern SD2 of the first NMOSFET region NR1 to the first source/drain pattern SD1 of the first PMOSFET region PR1. The active contact AC may include a first body BP1 on the first source/drain pattern SD1 and a second body BP2 on the second source/drain pattern SD2. The first body BP1 may be connected through the silicide pattern SC to a top surface of the first source/drain pattern SD1, and the second body BP2 may be connected through the silicide pattern SC to a top surface of the second source/drain pattern SD2. A first active contact AC1 may further include a protruding part PRP interposed between the first body BP1 and the second body BP2. The protruding part PRP may be provided on the device isolation layer ST between the first PMOSFET region PR1 and the first NMOSFET region NR1.

The protruding part PRP may extend from the first body BP1 toward the device isolation layer ST, while running along an inclined sidewall of the first source/drain pattern SD1. The protruding part PRP may extend from the second body BP2 toward the device isolation layer ST, while running along an inclined sidewall of the second source/drain pattern SD2. The protruding part PRP may have a bottom surface lower than that of each of the first and second bodies BP1 and BP2. The bottom surface of the protruding part PRP may be located higher than the device isolation layer ST. For example, the protruding part PRP may be spaced apart from the device isolation layer ST across the first interlayer dielectric layer 110.

According to some example embodiments of the present inventive concepts, the active contact AC may not only be connected through the first body BP1 to the top surface of the first source/drain pattern SD1, but may also be connected through the protruding part PRP to the inclined sidewall of the first source/drain pattern SD1. For example, the protruding part PRP may increase a contact area between the active contact AC and the first source/drain pattern SD1. Therefore, there may be a reduction in resistance between the active contact AC and the first source/drain pattern SD1. Likewise, the protruding part PRP may induce a reduction in resistance between the active contact AC and the second source/drain pattern SD2. In conclusion, it may be possible to increase an operating speed of a semiconductor device according to some example embodiments of the present inventive concepts.

Gate contacts GC may be provided to penetrate the second interlayer dielectric layer 120 and the gate capping pattern GP and to have electrical connection with (e.g., is electrically connected with and/or is configured to be electrically connected with) corresponding gate electrodes GE. When viewed in plan, the gate contacts GC on the first single height cell SHC1 may be located to overlap the first PMOSFET region PR1. For example, the gate contacts GC on the first single height cell SHC1 may be provided on the first active pattern AP1 (see FIG. 5A).

On the gate electrode GE, the gate contact GC may be freely located with no limitation of position. For example, the gate contacts GC on the second single height cell SHC2 may be located on the device isolation layer ST that fills the second PMOSFET region PR2, the second NMOSFET region NR2, and the second trench TR2 (see FIG. 4).

Figure 5A:
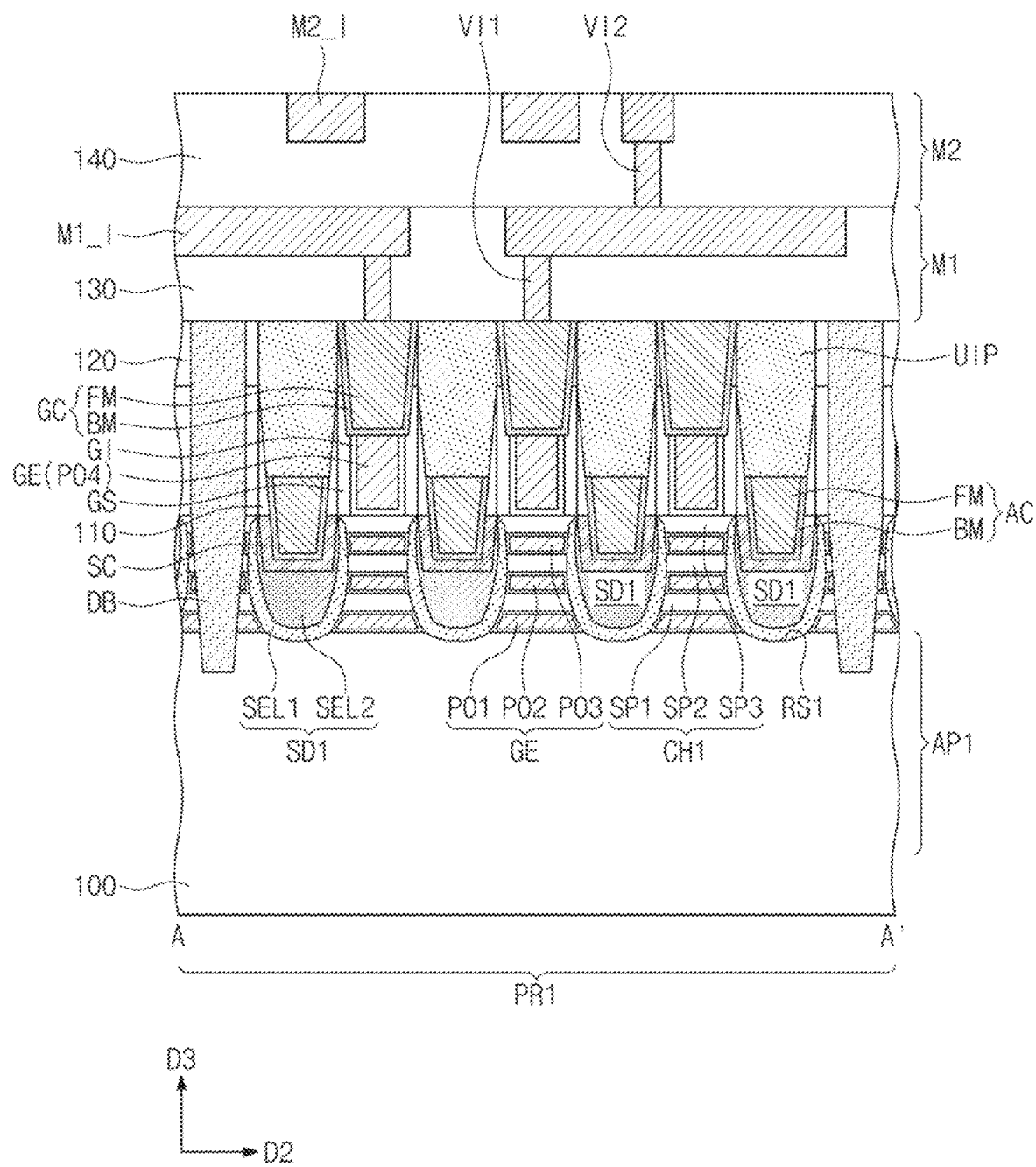
FIGS. 5A, 5B, 5C, 5D, and 5E illustrate cross-sectional views respectively taken along lines A-A', B-B', C-C', D-D', and E-E' of FIG. 4.
Figure 5B:
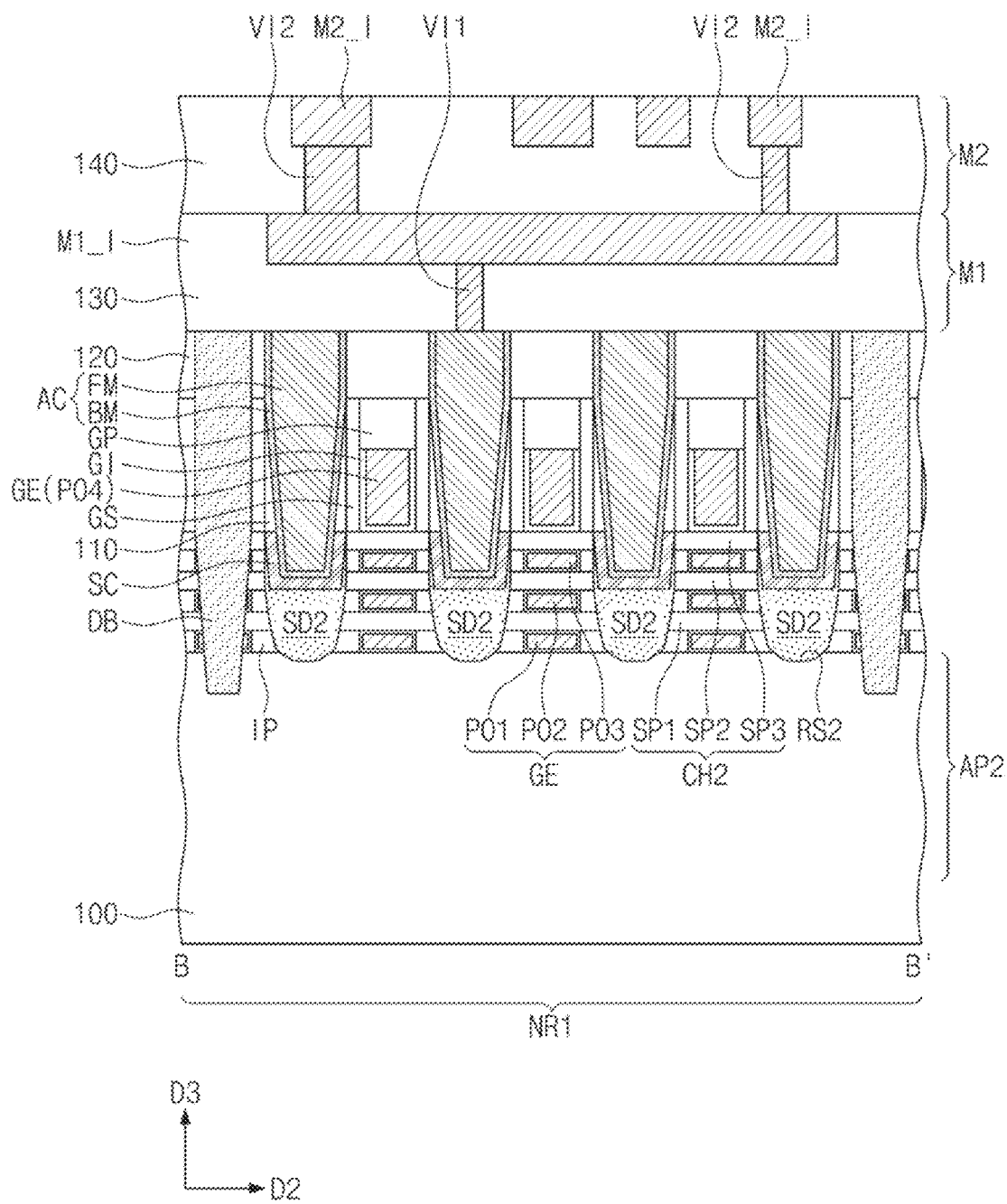
Figure 5C:
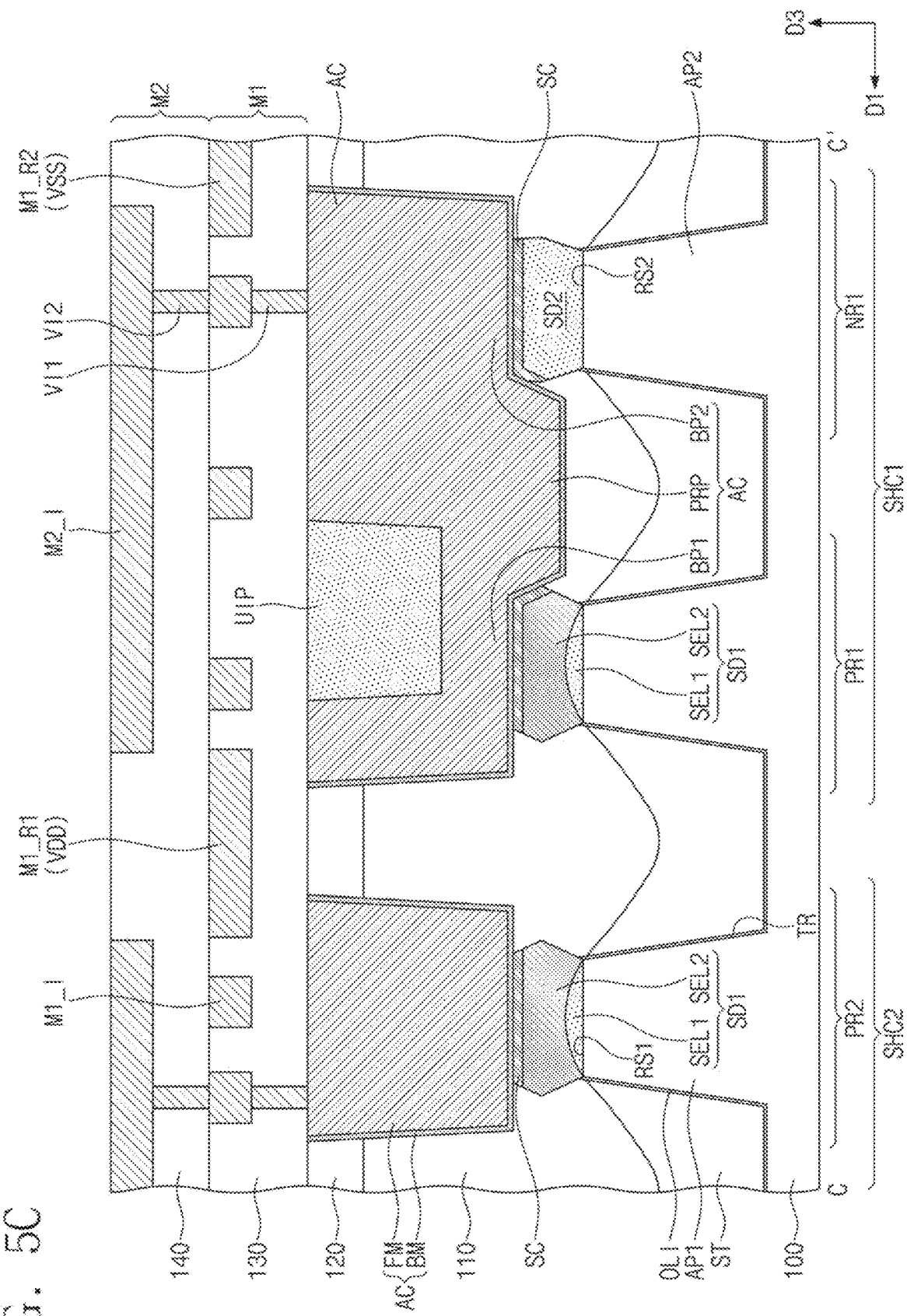
Figure 6:
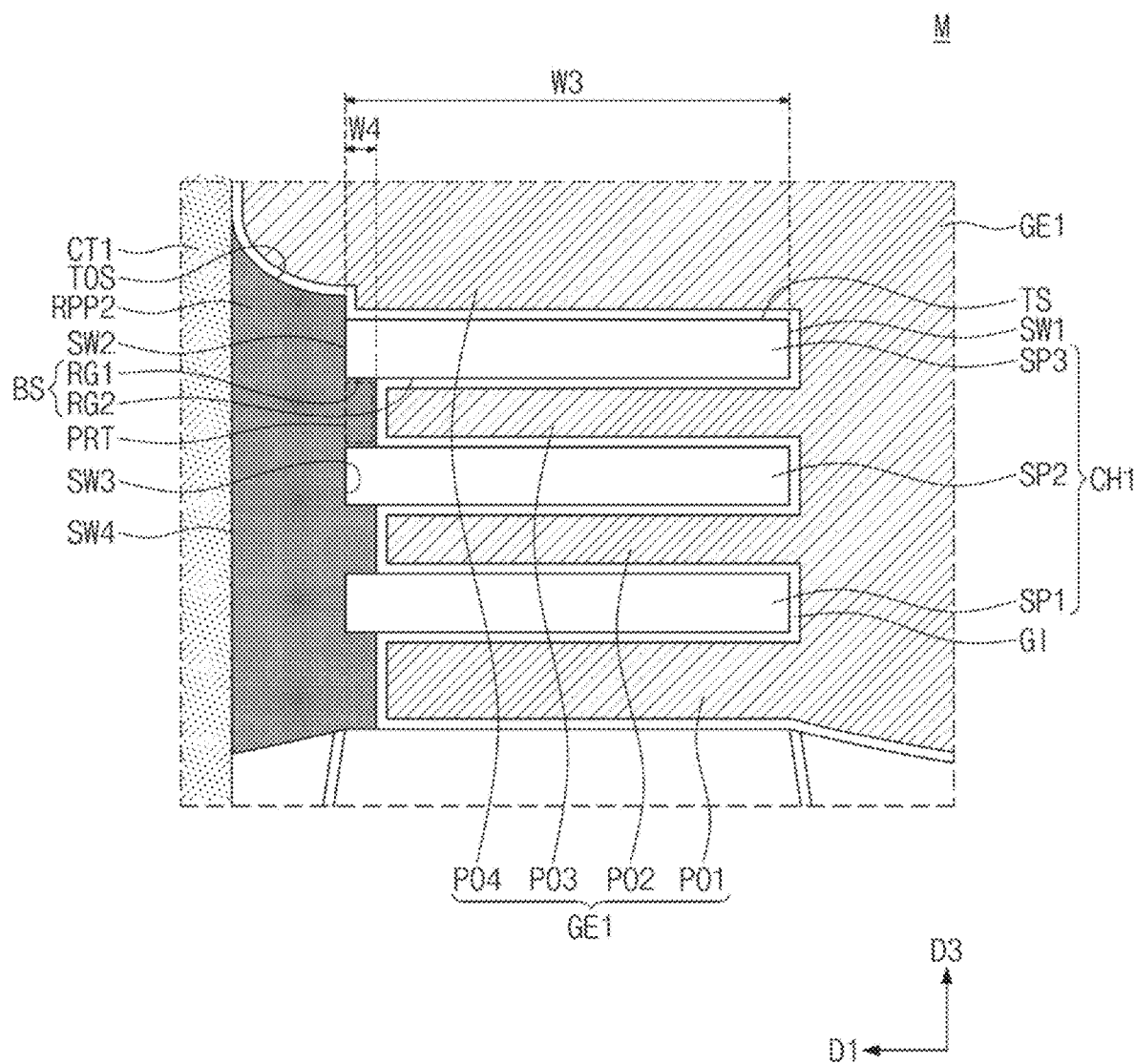
FIG. 6 illustrates an enlarged view showing an example of section M depicted in FIG. 5D.

In some example embodiments of the present inventive concepts, referring to FIGS. 5A and 5C, the active contact AC may have an upper portion adjacent to the gate contact GC, and the upper portion of the active contact AC may be filled with an upper dielectric pattern UIP. The upper dielectric pattern UIP may have a bottom surface lower than that of the gate contact GC. For example, the upper dielectric pattern UIP may cause the active contact AC adjacent to the gate contact GC to have a top surface lower than the bottom surface of the gate contact GC. Therefore, it may be possible to reduce or prevent a short circuit resulting from contact between the gate contact GC and its adjacent active contact AC.

Each of the active contact AC and the gate contact GC may include a conductive pattern FM and a barrier pattern BM that surrounds the conductive pattern FM. For example, the conductive pattern FM may include at least one metal selected from aluminum, copper, tungsten, molybdenum, and cobalt. The barrier pattern BM may cover sidewalls and a bottom surface of the conductive pattern FM. The barrier pattern BM may include a combination of a metal layer and a metal nitride layer. The metal layer may include at least one selected from titanium, tantalum, tungsten, nickel, cobalt, and platinum. The metal nitride layer may include at least one selected from a titanium nitride (TiN) layer, a tantalum nitride (TaN) layer, a tungsten nitride (WN) layer, a nickel nitride (NiN) layer, a cobalt nitride (CoN) layer, and a platinum nitride (PtN) layer.

A first metal layer M1 may be provided in the third interlayer dielectric layer 130 and thus on the second interlayer dielectric layer 120. For example, the first metal layer M1 may include a first power line M1_R1, a second power line M1_R2, a third power line M1_R3, and first wiring lines M1_I. The lines M1_R1, M1_R2, M1_R3, and M1_I of the first metal layer M1 may extend parallel to each other in the second direction D2. The first power line M1_R1 may be on (e.g., vertically overlap with) the first gate cutting pattern CT1, the second power line M1_R2 may be on the second gate cutting pattern CT2, and the first wiring lines M1_I may be correspondingly electrically connected to the active contact AC and the gate contact GC (e.g., separate first wiring lines M1_I may be electrically connected to a separate one of the active contact AC or the gate contact GC).

For example, the first and second power lines M1_R1 and M1_R2 may be correspondingly provided on the third and fourth boundaries BD3 and BD4 of the first single height cell SHC1. The first power line M1_R1 may extend in the second direction D2 along the third boundary BD3. The second power line M1_R2 may extend in the second direction D2 along the fourth boundary BD4.

The first wiring lines M1_I of the first metal layer M1 may be arranged along the first direction D1 at a second pitch. The second pitch may be less than the first pitch. Each of the first wiring lines M1_I may have a line-width less than that of each of the first, second, and third power lines M1_R1, M1_R2, and M1_R3.

The first metal layer M1 may further include first vias VI1. The first vias VI1 may be correspondingly provided below the lines M1_R1, M1_R2, M1_R3, and M1_I of the first metal layer M1. The first via VI1 may electrically connect the active contact AC to one of the lines M1_R1, M1_R2, M1_R3, and M1_I of the first metal layer M1. The first via VI1 may electrically connect the gate contact GC to one of the lines M1_R1, M1_R2, M1_R3, and M1_I of the first metal layer M1.

A certain line and its underlying first via VI1 of the first metal layer M1 may be formed by individual processes. For example, the certain line and its underlying first via VI1 of the first metal layer M1 may each be formed by a single damascene process. A sub-20 nm process may be employed to fabricate a semiconductor device according to some example embodiments.

A second metal layer M2 may be provided in the fourth interlayer dielectric layer 140 and thus may be on the first metal layer M1. The second metal layer M2 may include a plurality of second wiring lines M2_I that may be electrically connected to the first metal layer M1. The second wiring lines M2_I of the second metal layer M2 may each have a linear or bar shape that extends in the first direction D1. For example, the second wiring lines M2_I may parallel extend in the first direction D1.

The second metal layer M2 may further include second vias VI2 correspondingly provided below the second wiring lines M2_I. A certain line of the first metal layer M1 may be electrically through the second via VI2 to a corresponding line of the second metal layer M2. A certain line and its underlying second via VI2 of the second metal layer M2 may be simultaneously formed by a dual damascene process.

The first and second metal layers M1 and M2 may have their lines that include the same or different conductive materials. For example, the first and second metal layers M1 and M2 may have their lines that include at least one metallic material selected from aluminum, copper, tungsten, molybdenum, and cobalt. Although not shown, other metal layers (e.g., M3, M4, M5, etc.) may be additionally stacked on the fourth interlayer dielectric layer 140. Each of the stacked metal layers may include wiring lines for routing between cells.

With reference back to FIG. 5D, the following will describe in detail a first gate electrode GE1 of the gate electrodes GE, gate cutting patterns CT1 and CT2, and residual patterns RPP1, RPP2, and RPP3. The first gate electrode GE1 may be on the first channel pattern CH1. The first gate electrode GE1 may be on both the first and second channel patterns CH1 and CH2.

A first gate cutting pattern CT1, which penetrates the first gate electrode GE1, may be provided on the third boundary BD3 between the first PMOSFET region PR1 and the second PMOSFET region PR2. The first gate cutting pattern CT1 may be adjacent (e.g., in the first and/or second directions D1 and/or D2) to the first channel pattern CH1. A second gate cutting pattern CT2, which penetrates the first gate electrode GE1, may be provided on the fourth boundary BD4 adjacent to the first NMOSFET region NR1. The second gate cutting pattern CT2 may be adjacent (e.g., in the first and/or second directions D1 and/or D2) to the second channel pattern CH2.

A first residual pattern RPP1 may be interposed between the first gate cutting pattern CT1 and the first channel pattern CH1 on the second PMOSFET region PR2. A second residual pattern RPP2 may be interposed between the first gate cutting pattern CT1 and the first channel pattern CH1 on the first PMOSFET region PR1. A third residual pattern RPP3 may be interposed between the second gate cutting pattern CT2 and the second channel pattern CH2 on the first NMOSFET region NR1. As shown in at least FIG. 5D, the third residual pattern RPP3 may cover an outermost sidewall of at least one semiconductor pattern of the separate plurality of semiconductor patterns SP1 to SP3 of the second channel pattern CH2.

Each of the first to third residual patterns RPP1 to RPP3 may include polysilicon, silicon oxide, or any combination thereof. In some example embodiments, at least one selected from the first to third residual patterns RPP1 to RPP3 may be configured such that a zone adjacent one of the first and second channel patterns CH1 and CH2 may include polysilicon, and that a zone adjacent to the gate cutting pattern CT may include silicon oxide.

For example, each of the first, second, and third semiconductor patterns SP1, SP2, and SP3 of the first channel pattern CH1 on the first PMOSFET region PR1 may include a top surface TS, a first sidewall SW1, a second sidewall SW2 opposite to the first sidewall SW1, and a bottom surface BS. The second sidewall SW2 may be an outermost sidewall of a semiconductor pattern. As shown, the second residual pattern RPP2 may cover an outermost sidewall SW1 of at least one semiconductor pattern (or all semiconductor patterns) of the semiconductor patterns SP1 to SP1 of the first channel pattern CH1. The gate electrode GE (e.g., first gate electrode GE1) may cover (and thus may be on) the top surface TS, the first sidewall SW1, and the bottom surface BS. The gate electrode GE may not cover but instead may expose the second sidewall SW2. It will be understood that an element that "covers" a surface of another element may directly contact the surface of the other element so as to obscure the surface from exposure.

The top surface TS, the bottom surface BS, and the first sidewall SW1 may be covered with the gate dielectric layer GI. The top surface TS, the bottom surface BS, and the first sidewall SW1 may face the gate electrode GE across the gate dielectric layer GI. The second sidewall SW2 may not be covered with the gate dielectric layer GI. The second sidewall SW2 may be covered with the second residual pattern RPP2.

The second residual pattern RPP2 may have a third sidewall SW3 in direct contact with the second sidewalls SW2 of the first, second, and third semiconductor patterns SP1, SP2, and SP3. The second residual pattern RPP2 may have a fourth sidewall SW4 that is opposite to the third sidewall SW and is in direct contact with the first gate cutting pattern CT1. The third sidewall SW3 of the second residual pattern RPP2 may have a portion that is not in contact (e.g., not in direct contact) with any of the first, second, and third semiconductor patterns SP1, SP2, and SP3, and the portion of the third sidewall SW3 may be covered with the gate dielectric layer GI.

A detailed description of the first residual pattern RPP1 and the third residual pattern RPP3 may be the same or substantially the same as or similar to that of the second residual pattern RPP2 discussed above.

The first gate electrode GE1 on the first single height cell SHC1 may include, on an upper portion thereof (e.g., an upper portion of the first gate electrode GE1, which may be a distal portion of the first gate electrode GE1 in relation to the substrate 100), a first extension EXP1, a second extension EXP2, and a main part MIP between the first and second extensions EXP1 and EXP2. The first extension EXP1 may be provided on and vertically overlap (e.g., overlap in the third direction D3) the second residual pattern RPP2. The first extension EXP1 may be adjacent to the first gate cutting pattern CT1 across the gate dielectric layer GI.

The second extension EXP2 may be provided on and vertically overlap the third residual pattern RPP3. The second extension EXP2 may be adjacent to the second gate cutting pattern CT2 across the gate dielectric layer GI. As the first gate electrode GE1 on the first single height cell SHC1 includes the first extension EXP1 and the second extension EXP2, the first gate electrode GE1 may be shaped like T.

The main part MIP may be a portion that covers the first channel pattern CH1 and the second channel pattern CH2 of the first gate electrode GE1. The main part MIP may have a first length L1 in the first direction D1. The first length L1 may be less than a second length L2 that is a distance between the first gate cutting pattern CT1 and the second gate cutting pattern CT2. According to some example embodiments of the present inventive concepts, the second and third residual patterns RPP2 and RPP3 may cause the main part MIP of the first gate electrode GE1 to have a length (e.g., the first length L1) less than a maximum length (e.g., the second length L2) of the first gate electrode GE1.

As discussed above, the first length L1, which is relatively small, may be given to the gate electrode GE of a semiconductor device according to some example embodiments of the present inventive concepts. A reduction in length of the gate electrode GE may reduce a volume of the gate electrode GE. As a result, a parasitic capacitance may be reduced between the gate electrodes GE and its adjacent active contact AC. In addition, a parasitic capacitance may also be reduced between the gate electrode GE and its adjacent first and second source/drain patterns SD1 and SD2. The reduction in parasitic capacitance may induce an increase in operating speed and electrical characteristics of the semiconductor device.

Figure 5D:
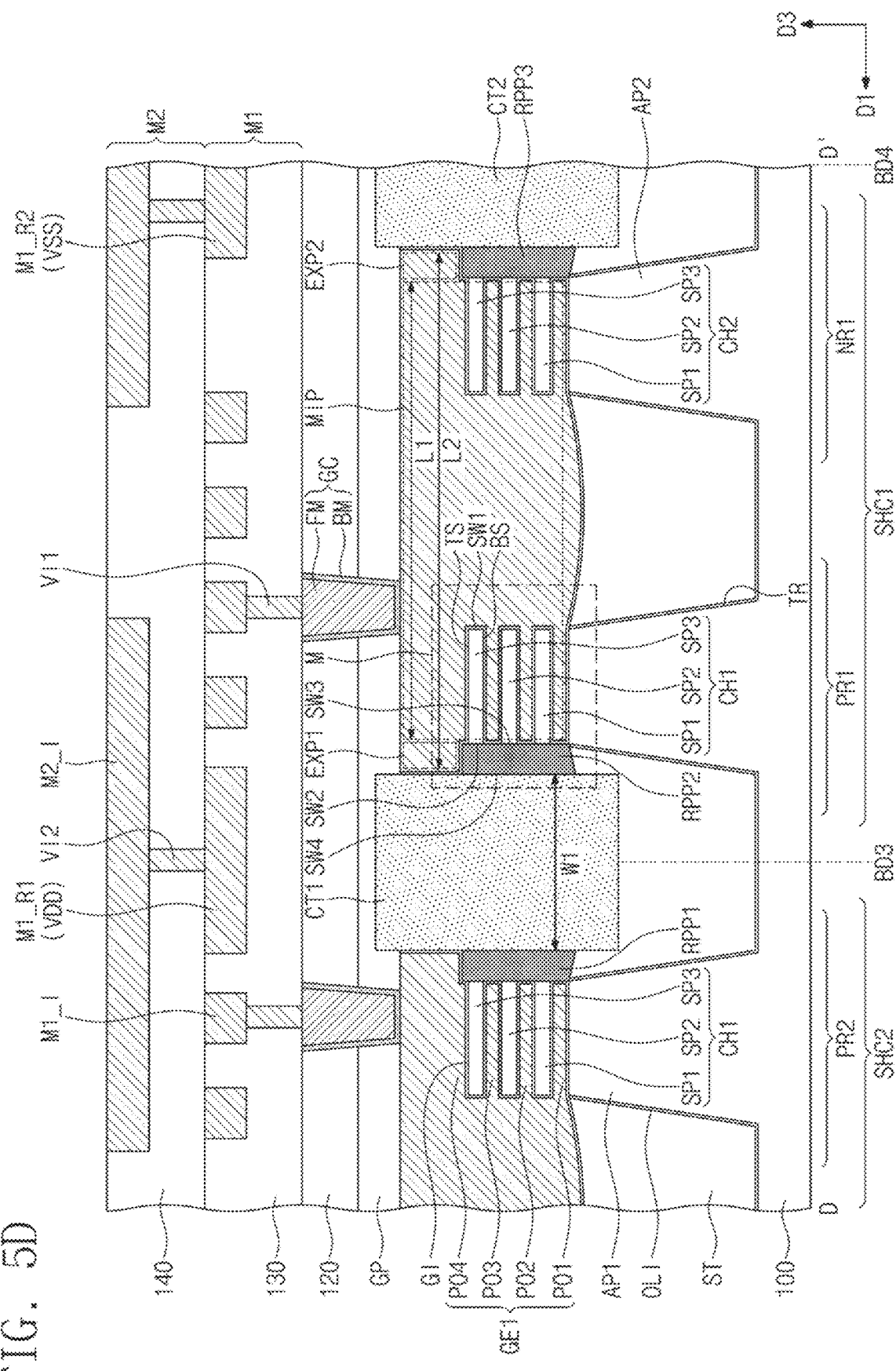

According to some example embodiments, each of the first and second channel patterns CH1 and CH2 may be formed of the first, second, and third semiconductor patterns SP1, SP2, and SP3 (or extremely thin nano-sheets), and thus may have a thin body structure. The semiconductor device according to some example embodiments may have fully-depleted device properties. Even when the first gate electrode GE1 according to some example embodiments do not cover the second sidewalls SW2 of the first, second, and third semiconductor patterns SP1, SP2, and SP3 as shown in FIG. 5D, no punch-through may occur between source and drain. Therefore, the first, second, and third semiconductor patterns SP1, SP2, and SP3 may operate as normal transistor bodies.

With reference back to FIG. 5E, the following will describe in detail a second gate electrode GE2 of the gate electrodes GE, gate cutting patterns CT1 and CT2, and residual patterns RPP1, RPP2, and RPP3.

A first gate cutting pattern CT1, which penetrates the second gate electrode GE2, may be provided on the third boundary BD3 between the first PMOSFET region PR1 and the second PMOSFET region PR2. A second gate cutting pattern CT2, which penetrates the second gate electrode GE2, may be provided on the fourth boundary BD4 adjacent to the first NMOSFET region NR1.

A first residual pattern RPP1 may be interposed between the first gate cutting pattern CT1 and the first channel pattern CH1 on the second PMOSFET region PR2. A third residual pattern RPP3 may be interposed between the second gate cutting pattern CT2 and the second channel pattern CH2 on the first NMOSFET region NR1. According to some example embodiments, a second residual pattern RPP2 may be omitted between the first gate cutting pattern CT1 and the first channel pattern CH1 on the first PMOSFET region PR1. In this sense, a semiconductor device according to some example embodiments may be configured such that a residual pattern RPP may be interposed or omitted between the gate cutting pattern CT and one of the channel patterns CH1 and CH2.

Each of the first, second, and third semiconductor patterns SP1, SP2, and SP3 of the first channel pattern CH1 on the first PMOSFET region PR1 may include a top surface TS, a first sidewall SW1, a second sidewall SW2 opposite to the first sidewall SW1, and a bottom surface BS. As the second residual pattern RPP2 is omitted, the second gate electrode GE2 may cover all of the top surface TS, the bottom surface BS, the first sidewall SW1, and the second sidewall SW2 of each of the first, second, and third semiconductor patterns SP1, SP2, and SP3 and thus the second gate electrode GE2 may surround each semiconductor pattern of the plurality of semiconductor patterns SP1 to SP3 of the first channel pattern CH1. For example, the second gate electrode GE2 on the first PMOSFET region PR1 may have a gate-all-around structure where the second gate electrode GE2 completely surrounds a channel.

The first gate cutting pattern CT1 that penetrates the second gate electrode GE2 may have a width W2 less than a width (see W1 of FIG. 5D) of the first gate cutting pattern CT1 that penetrates the first gate electrode GE1. When a distance (e.g., DI1) between the first gate cutting pattern CT1 and the first channel pattern CH1 on the first PMOSFET region PR1 is increased by a width of the first gate cutting pattern CT1, the second residual pattern RPP2 may be omitted.

For example, a first distance DI1 may be given as the distance between the first gate cutting pattern CT1 and its adjacent first channel pattern CH1 on the first PMOSFET region PR1. A second distance DI2 may be given as a distance between the second gate cutting pattern CT2 and the second channel pattern CH2 on the first NMOSFET region NR1. The first distance DI1 may be greater the second distance DI2. As the first distance DI1 has a relatively large value, a residual pattern RPP may not be formed between the first gate cutting pattern CT1 and the first channel pattern CH1 on the first PMOSFET region PR1. As the second distance DI2 has a relatively small value, the third residual pattern RPP3 may be formed between the second gate cutting pattern CT2 and the second channel pattern CH2 on the first NMOSFET region NR1.

According to the present inventive concepts, an interval between the gate cutting pattern CT and the channel pattern CH1 or CH2 may be adjusted to control whether the residual pattern RPP is formed or not and also to control a size of the residual pattern RPP. In some example embodiments of the present inventive concepts, the first distance DI1 and the second distance DI2 may be the same or substantially the same as each other.

Figure 5E:
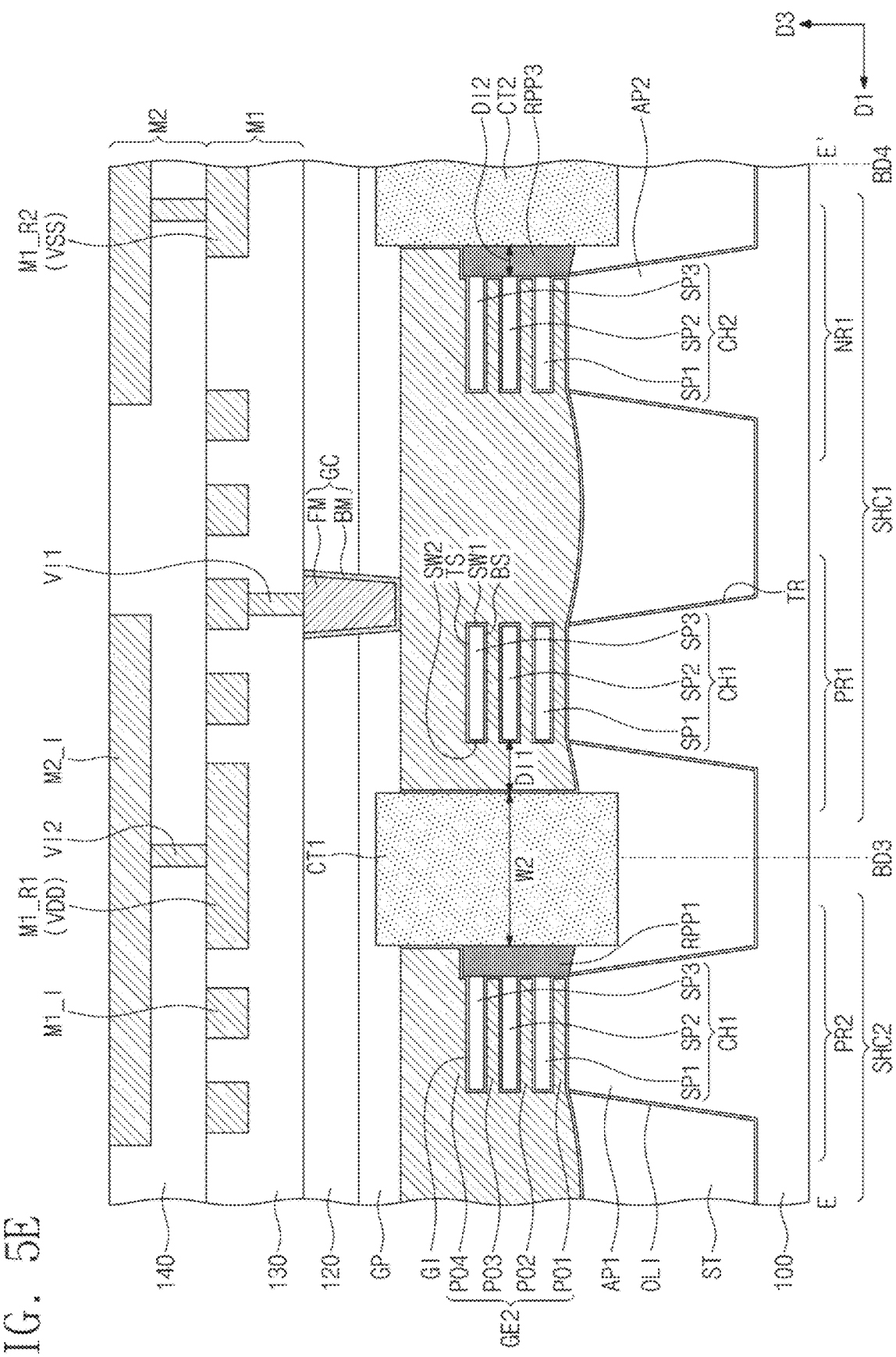

When the second gate electrode GE2 has a gate-all-around structure where the second gate electrode GE2 completely covers a circumference of a channel pattern as illustrated on the first PMOSFET region PR1 of FIG. 5E, the second gate electrode GE2 may increase in channel control capacity. However, a parasitic capacitance may increase due to an increase in length and volume of the second gate electrode GE2.

Therefore, according to some example embodiments of the present inventive concepts, on a transistor region where an operating speed is more important than a channel control capacity, the residual pattern RPP may be provided to cause the gate electrode GE to have a reduced length, and on a transistor region where a channel control capacity is more important than an operating speed, the residual pattern RPP may be omitted to cause the gate electrode GE to have a gate-all-around structure.

With reference to FIG. 6, the following will describe in detail an example of the second residual pattern RPP2. The second residual pattern RPP2 may include protruding regions PRT.

The protruding regions PRT of the second residual pattern RPP2 may protrude from the third sidewall SW3 of the second residual pattern RPP2 toward the first, second, and third parts PO1, PO2, and PO3 of the first gate electrode GE1. A protruding region PRT may thus at least partially vertically overlap (e.g., overlap in the third direction D3) one or more of the semiconductor patterns SP1 to SP3 of the first channel pattern CH1, as shown in at least FIG. 6.

For example, an uppermost one of the protruding regions PRT may directly cover a first region RG1 of the bottom surface BS of the third semiconductor pattern SP3. A remaining second region RG2 of the bottom surface BS of the third semiconductor pattern SP3 may be covered with the gate dielectric layer GI.

The third semiconductor pattern SP3 may have a third width W3 in the first direction D1. A first region RG1 of the third semiconductor pattern SP3 may have a fourth width W4 in the first direction D1. The fourth width W4 may be the same or substantially the same as a width of the uppermost protruding region PRT. A ratio (W4/W3) of the fourth width W4 to the third width W3 may range from about 0.05 to about 0.2. As shown in FIG. 5, the protruding regions PRT may be omitted.

Figure 7:
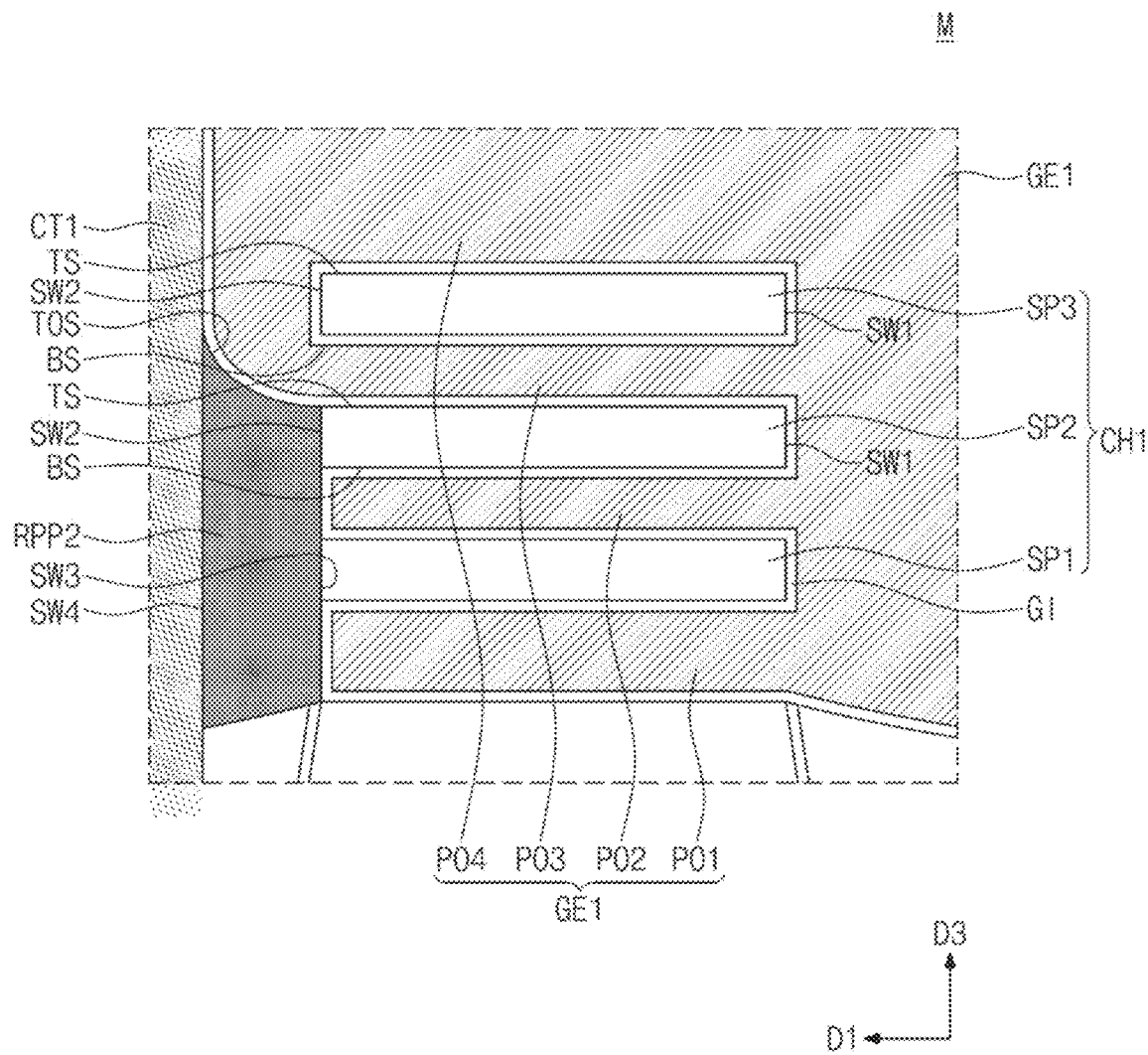
FIG. 7 illustrates an enlarged view showing an example of section M depicted in FIG. 5D.

As shown in at least FIGS. 6-7, a top surface TOS of the second residual pattern RPP2 may have a concave profile. For example, the top surface TOS of the second residual pattern RPP2 may have a height (level) that increases in a direction from the third semiconductor pattern SP3 toward the first gate cutting pattern CT1.

FIG. 7 illustrates an enlarged view showing an example of section M depicted in FIG. 5D. Referring to FIG. 7, the top surface TOS of the second residual pattern RPP2 may be lower (e.g., at a lower level or height) than the bottom surface BS of the third semiconductor pattern SP3 and thus may be at a lower height than the uppermost semiconductor pattern (e.g., third semiconductor pattern SP3) of the first channel pattern CH1. For example, the second residual pattern RPP2 may not cover the second sidewall SW2 of the third semiconductor pattern SP3. As shown in FIG. 7, the second residual pattern RPP2 may cover the outermost sidewall (e.g., SW2) of at least one semiconductor pattern (e.g., SP1 and SP2) that are below the uppermost semiconductor pattern (e.g., SP3) of the first channel pattern CH1. As further shown, the first gate electrode GE1 may surround (e.g., completely surround in at least the first and third directions D1 and D3) the uppermost semiconductor pattern (e.g., SP3). The uppermost semiconductor pattern may be isolated from direct contact with the second residual pattern.

The first gate electrode GE1 may cover all of the top surface TS, the bottom surface BS, the first sidewall SW1, and the second sidewall SW2 of the third semiconductor pattern SP3. The first gate electrode GE1 may have a gate-all-around structure in which the first gate electrode GE1 completely surrounds the third semiconductor pattern SP3. However, the first gate electrode GE1 may not cover the second sidewalls SW2 of the first and second semiconductor patterns SP1 and SP2.

According to some example embodiments, the top surface TOS of the second residual pattern RPP2 may be adjusted to configure at least one selected from the first, second, and third semiconductor patterns SP1, SP2, and SP3 to completely surround the first gate electrode GE1. Therefore, it may be possible to increase an operating speed of a transistor without significantly reducing a channel control capacity.

Figure 8:
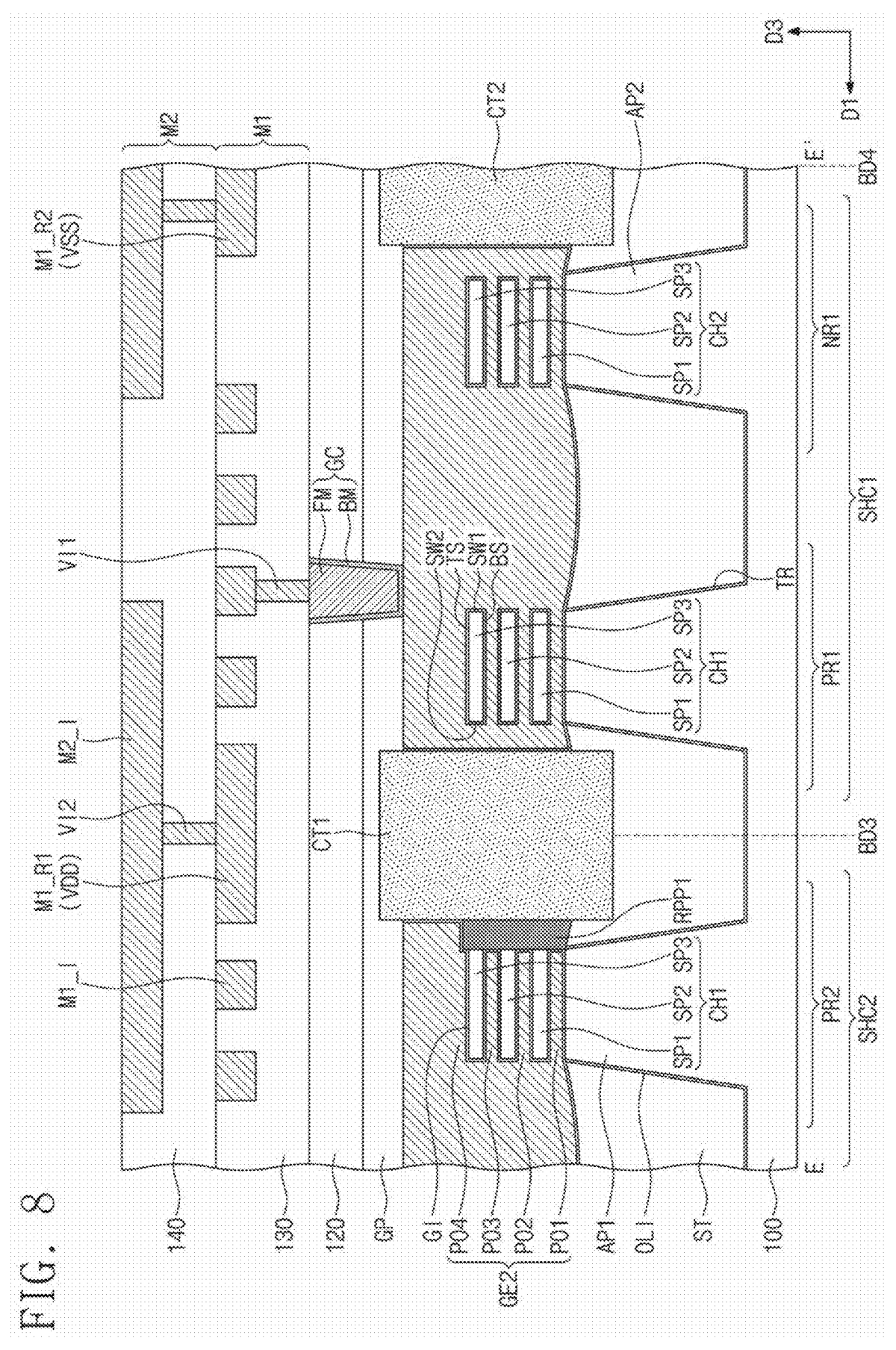
Figure 9:
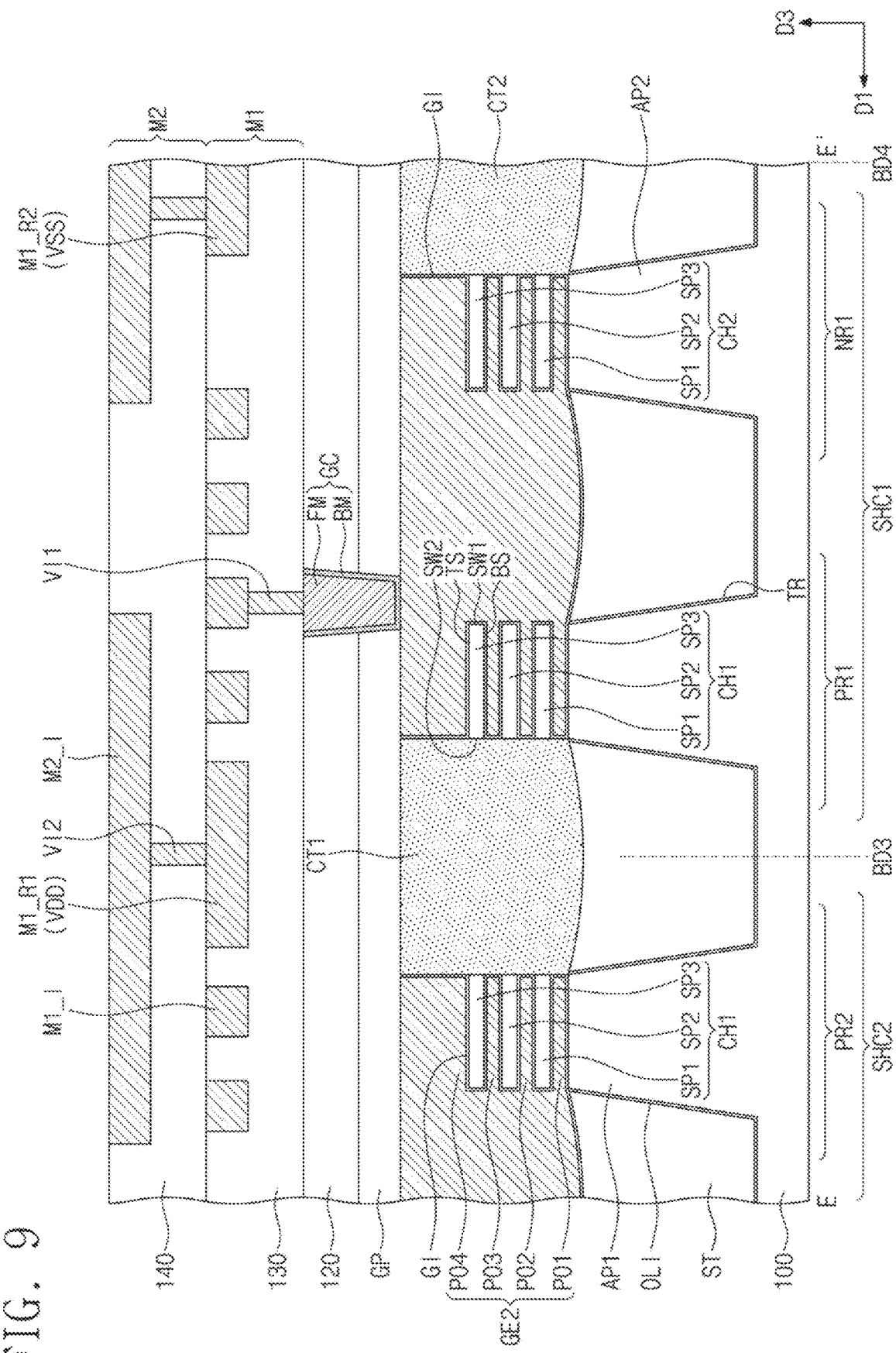

FIGS. 8 and 9 illustrate cross-sectional views taken along line E-E' of FIG. 4, showing a semiconductor device according to some example embodiments of the present inventive concepts. In the description of the example embodiments shown in FIGS. 8-9 that follows, a detailed description of technical features repetitive to those discussed above with reference to FIGS. 4 and 5A to 5E will be omitted, and a difference thereof will be discussed in detail.

Referring to FIG. 8, the first residual pattern RPP1 may be interposed between the first gate cutting pattern CT1 and the first channel pattern CH1 on the second PMOSFET region PR2. According to some example embodiments, the second residual pattern RPP2 may be interposed between the first gate cutting pattern CT1 and the first channel pattern CH1 on the first PMOSFET region PR1. The third residual pattern RPP3 may be omitted between the second gate cutting pattern CT2 and the second channel pattern CH2 on the first NMOSFET region NR1. For example, neither the second residual pattern RPP2 nor the third residual pattern RPP3 may be provided on the first single height cell SHC1.

When the first single height cell SHC1 has cell properties in which a channel control capacity is required more than an operating speed in comparison with the second single height cell SHC2, the second and third residual patterns RPP2 and RPP3 may be selectively omitted only on the first single height cell SHC1. Therefore, the second gate electrode GE2 on the first single height cell SHC1 may have a gate-all-around structure in which the second gate electrode GE2 surrounds the semiconductor patterns SP1 to SP3 of the first channel pattern CH1.

Referring to FIG. 9, each of the first and second gate cutting patterns CT1 and CT2 may have an increased width in the first direction D1. For example, the first gate cutting pattern CT1 may have one sidewall in direct contact with that of the first channel pattern CH1 on the second PMOSFET region PR2. The first gate cutting pattern CT1 may have an opposite sidewall in direct contact with that of the first channel pattern CH1 on the first PMOSFET region PR1.

The first gate cutting pattern CT1 may be in direct contact with the second sidewall SW2 of each of the first, second, and third semiconductor patterns SP1, SP2, and SP3 included in the first channel pattern CH1. As the first gate cutting pattern CT1 is in direct contact with the first, second, and third semiconductor patterns SP1, SP2, and SP3, the aforementioned residual patterns RPP1, RPP2, and RPP3 may be omitted.

According to some example embodiments, the gate cutting pattern CT may have an increased width, and thus even though the residual pattern RPP is absent, the gate electrode GE may not cover the second sidewalls SW2 of the first, second, and third semiconductor patterns SP1, SP2, and SP3. As the gate electrode GE does not cover the second sidewalls SW2 of the first, second, and third semiconductor patterns SP1, SP2, and SP3, it may be possible to reduce a parasitic capacitance caused by the gate electrode GE.

According to some example embodiments, the gate cutting pattern CT having an increased width may induce omission of the first and second extensions EXP1 and EXP2 discussed above in FIG. 5D. Therefore, it may be possible to further reduce a parasitic capacitance caused by the gate electrode GE.

FIGS. 10A, 10B, 11A, 11B, 12A, 12B, 12C, 12D, 13A, 13B, 13C, 13D, 14A, 14B, 14C, 14D, 15A, 15B, 15C, 15D, 16A, 16B, 16C, and 16D illustrate cross-sectional views showing a method of fabricating a semiconductor device according to some example embodiments of the present inventive concepts. In detail, FIGS. 10A, 11A, 12A, 13A, 14A, 15A, and 16A illustrate cross-sectional views taken along line A-A' of FIG. 4. FIGS. 12B, 13B, 14B, 15B, and 16B illustrate cross-sectional views taken along line B-B' of FIG. 4. FIGS. 12C, 13C, 14C, 15C, and 16C illustrate cross-sectional views taken along line C-C' of FIG. 4. FIGS. 10B, 11B, 12D, 13D, 14D, 15D, and 16D illustrate cross-sectional views taken along line D-D' of FIG. 4.

Figure 10A:
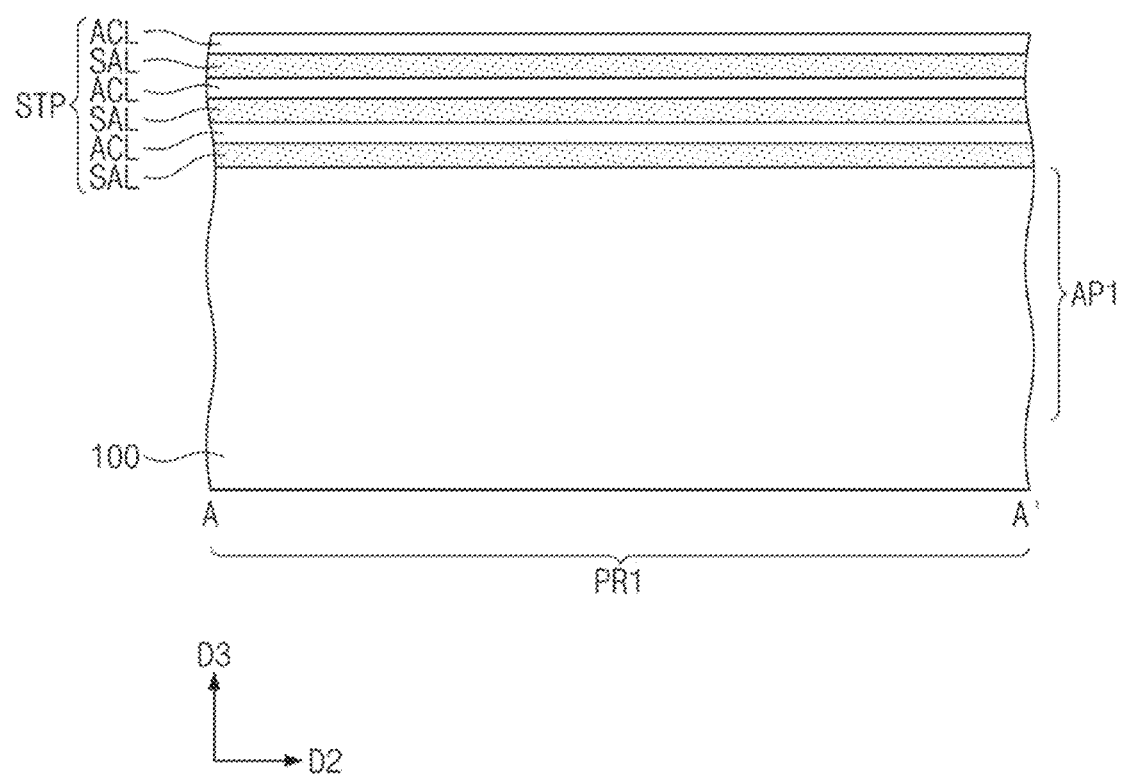
Figure 10B:
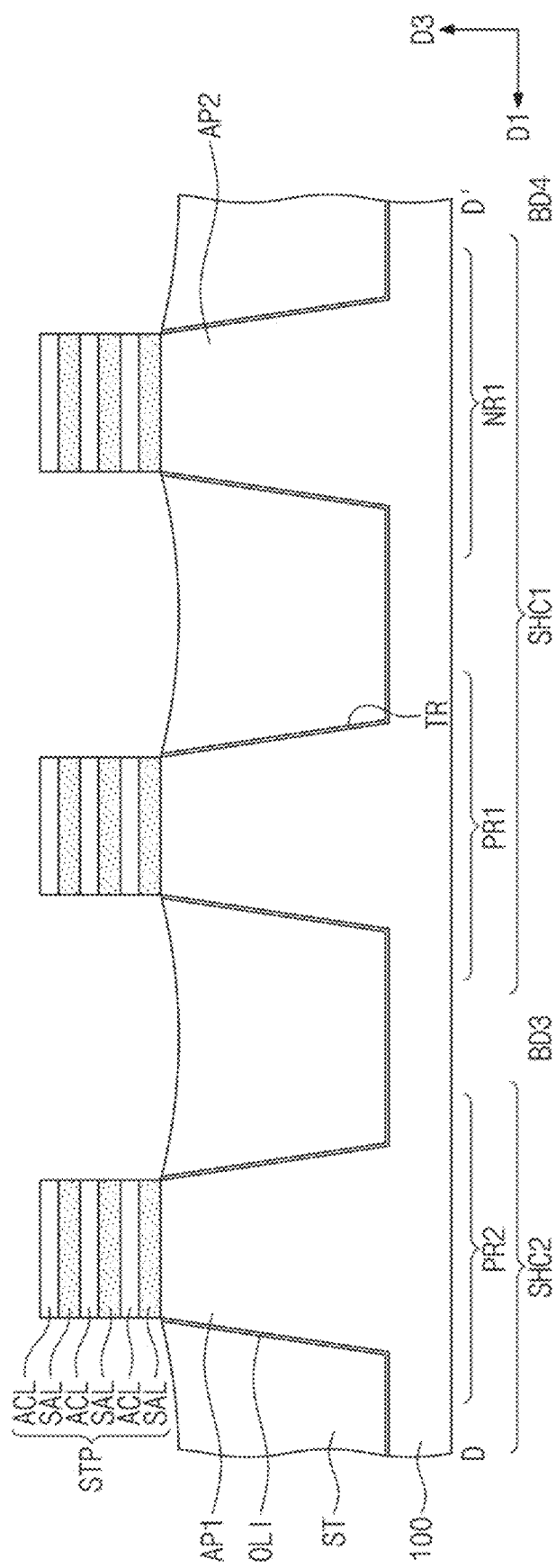

Referring to FIGS. 10A and 10B, a substrate 100 may be provided which includes first and second PMOSFET regions PR1 and PR2 and first and second NMOSFET regions NR1 and NR2. Sacrificial layers SAL and active layers ACL may be alternately formed and stacked on the substrate 100. The sacrificial layers SAL may include one of silicon (Si), germanium (Ge), and silicon-germanium (SiGe), and the active layers ACL may include another of silicon (Si), germanium (Ge), and silicon-germanium (SiGe).

For example, the sacrificial layers SAL may include silicon-germanium (SiGe), and the active layers ACL may include silicon (Si). Each of the sacrificial layers SAL may have a germanium concentration of about 10 at % to about 30 at %.

Mask patterns may be correspondingly formed on the first and second PMOSFET regions PR1 and PR2 and the first and second NMOSFET regions NR1 and NR2 of the substrate 100. The mask patterns may each have a linear or bar shape that extends in a second direction D2.

A patterning process may be performed in which the mask patterns are used as an etching mask to form a trench TR that defines a first active pattern AP1 and a second active pattern AP2. The first active pattern AP1 may be formed on each of the first and second PMOSFET regions PR1 and PR2. The second active pattern AP2 may be formed on each of the first and second NMOSFET regions NR1 and NR2.

A stack pattern STP may be formed on each of the first and second active patterns AP1 and AP2. The stack pattern STP may include the sacrificial layers SAL and the active layers ACL that are alternately stacked with each other. During the patterning process, the stack pattern STP may be formed together with the first and second active patterns AP1 and AP2.

A device isolation layer ST may be formed to fill the trench TR. For example, a dielectric layer may be formed on an entire surface of the substrate 100 to cover the stack patterns STP and the first and second active patterns AP1 and AP2. The dielectric layer may be recessed until the stack patterns STP are exposed, thereby forming the device isolation layer ST.

The device isolation layer ST may include a dielectric material, such as a silicon oxide layer. The stack patterns STP may protrude upwards from the device isolation layer ST. For example, the stack patterns STP may vertically protrude upwards from the device isolation layer ST.

Figure 11A:
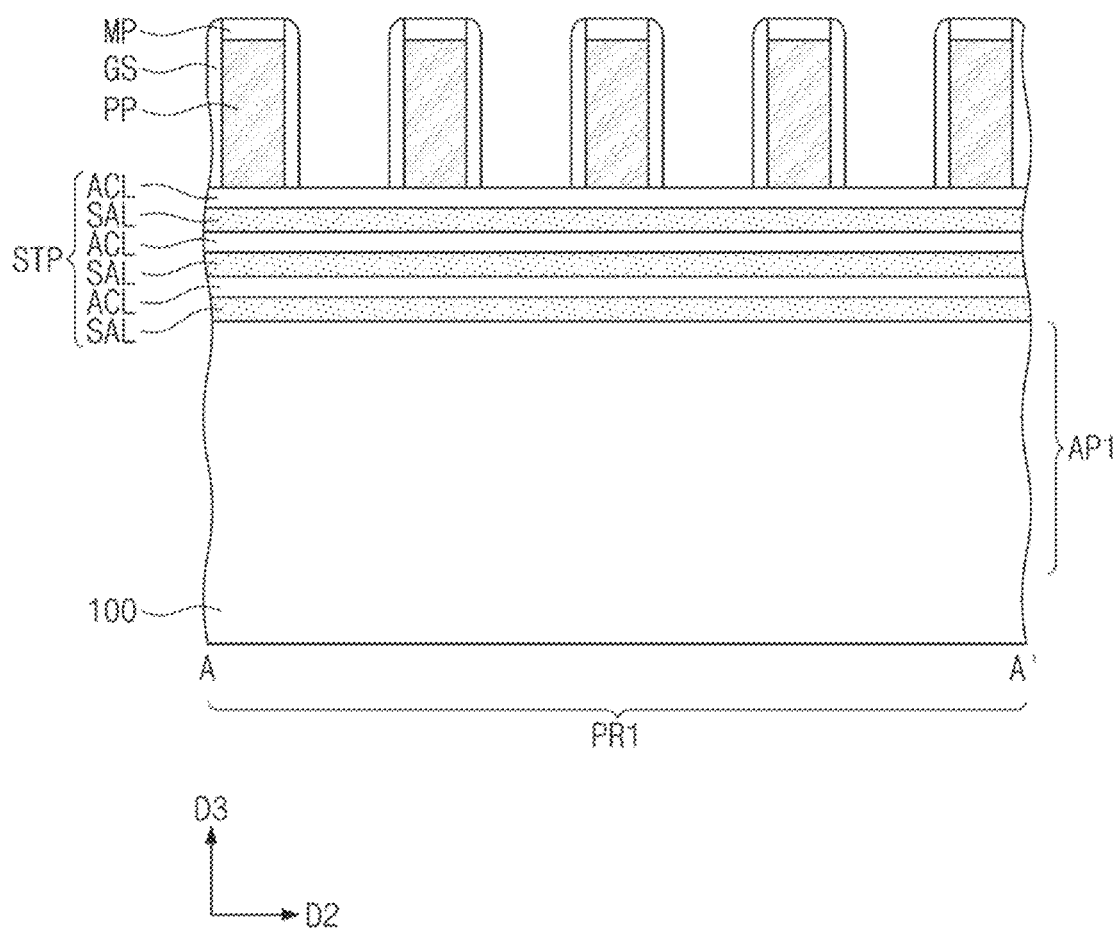
Figure 11B:
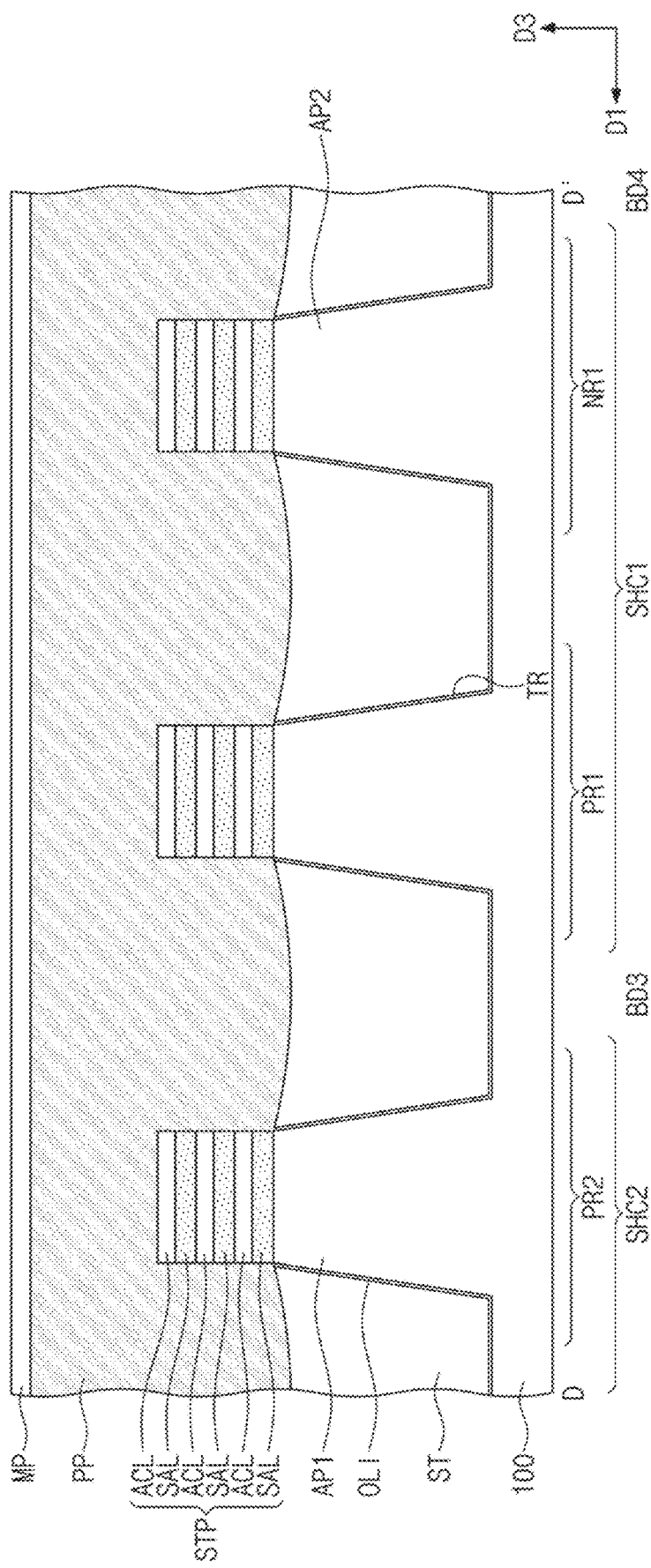
Figure 12A:
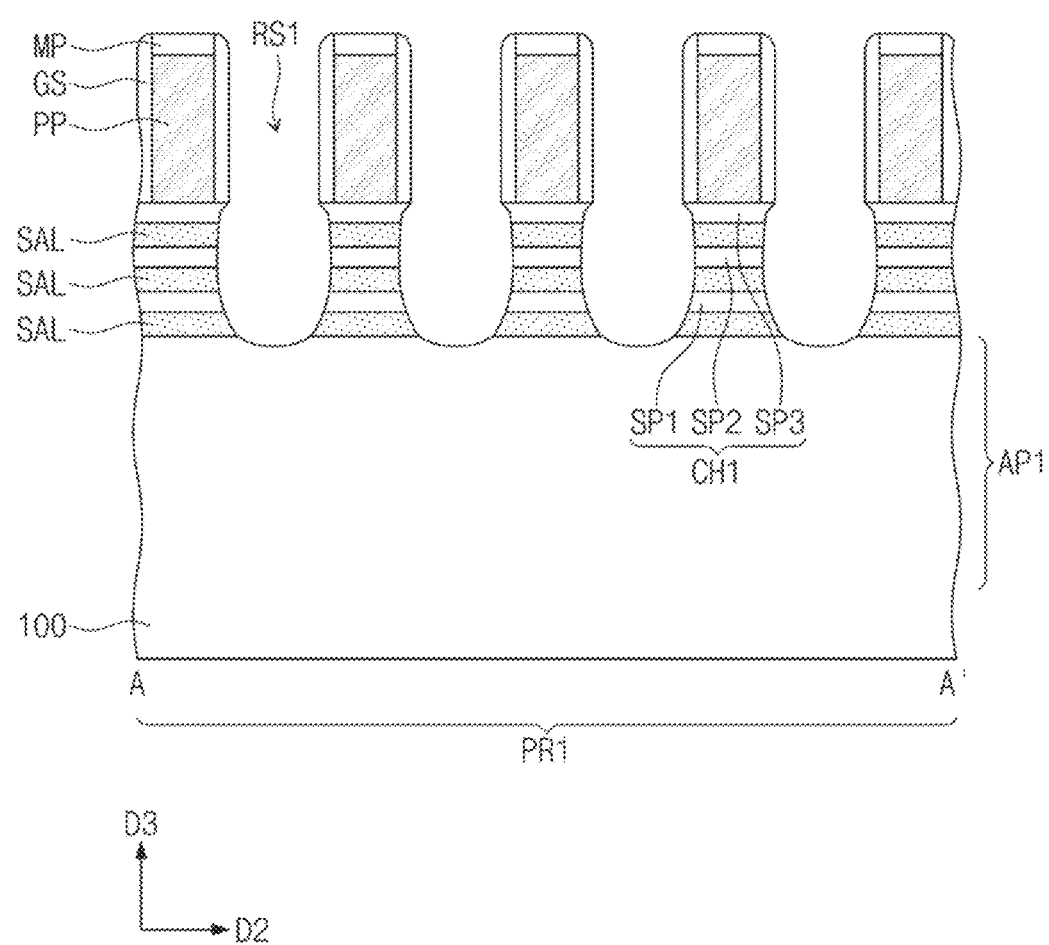
Figure 12B:
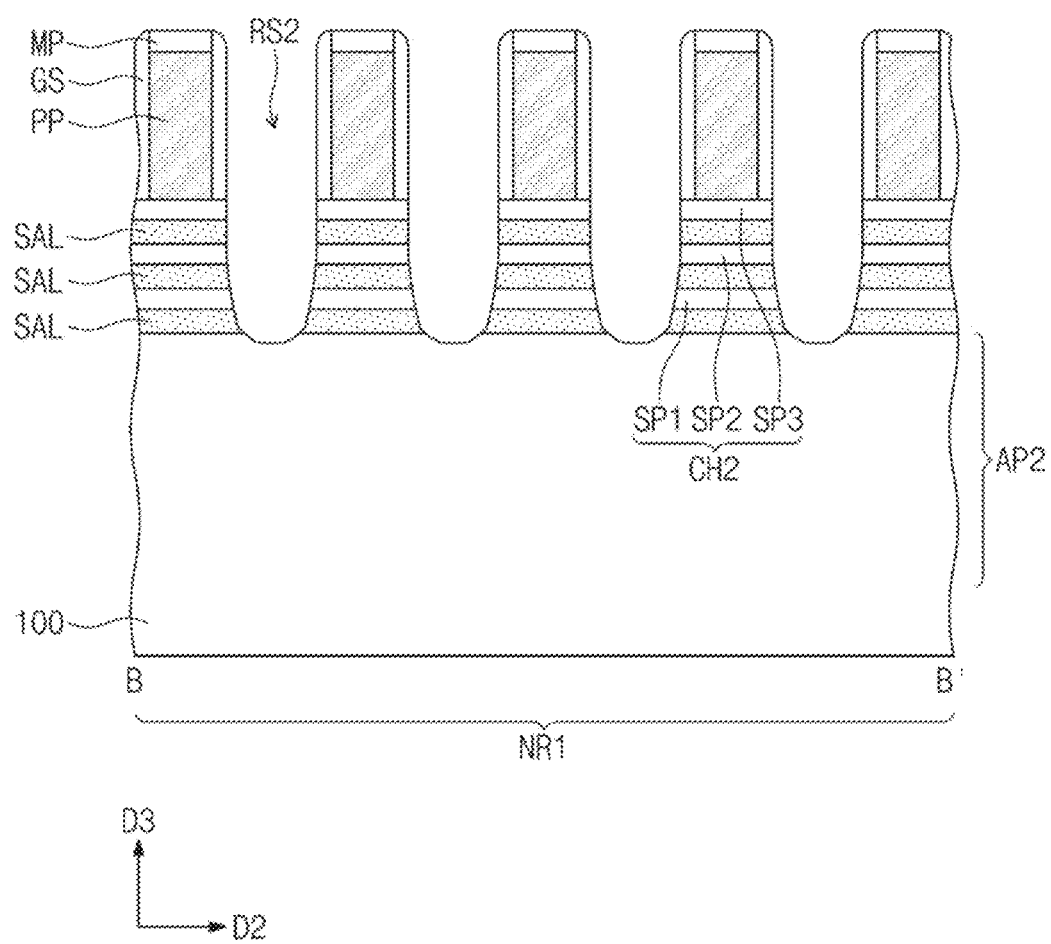
Figure 12D:
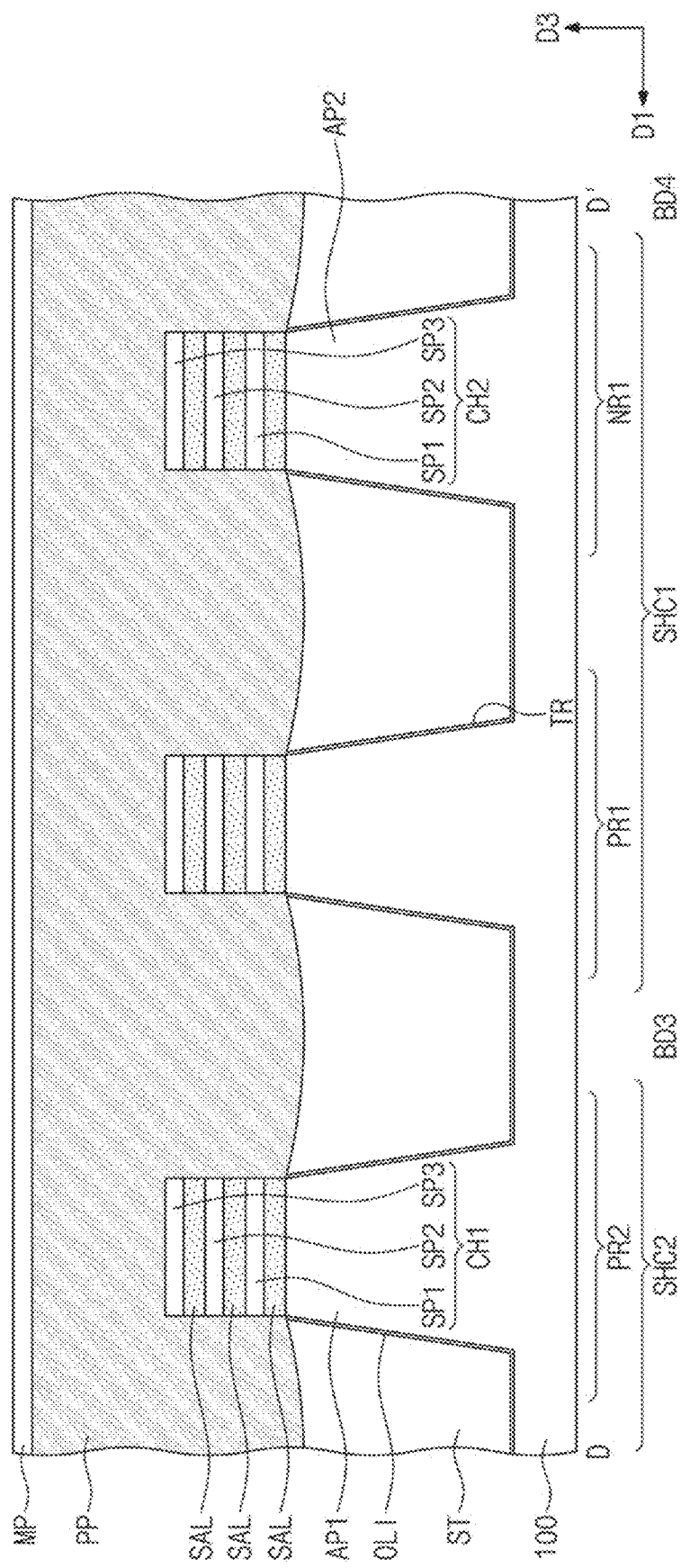
Figure 13A:
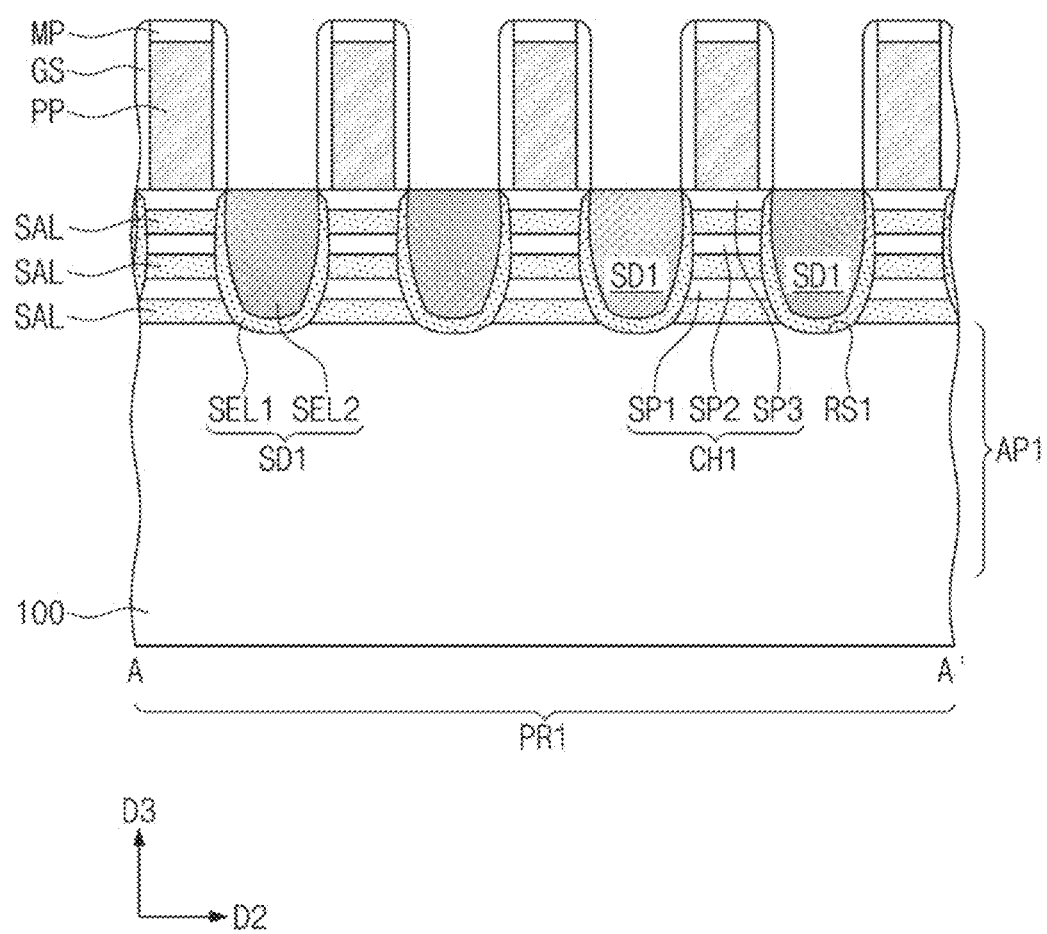
Figure 13B:
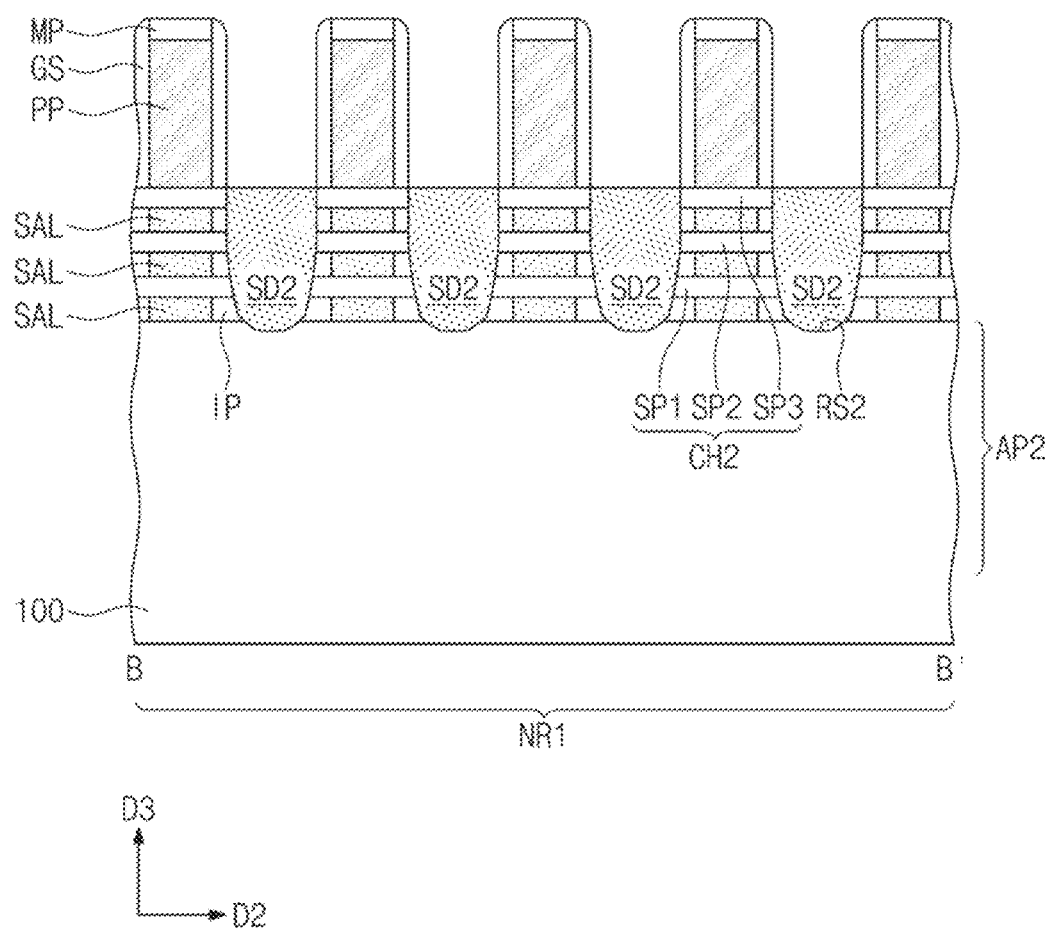
Figure 13C:
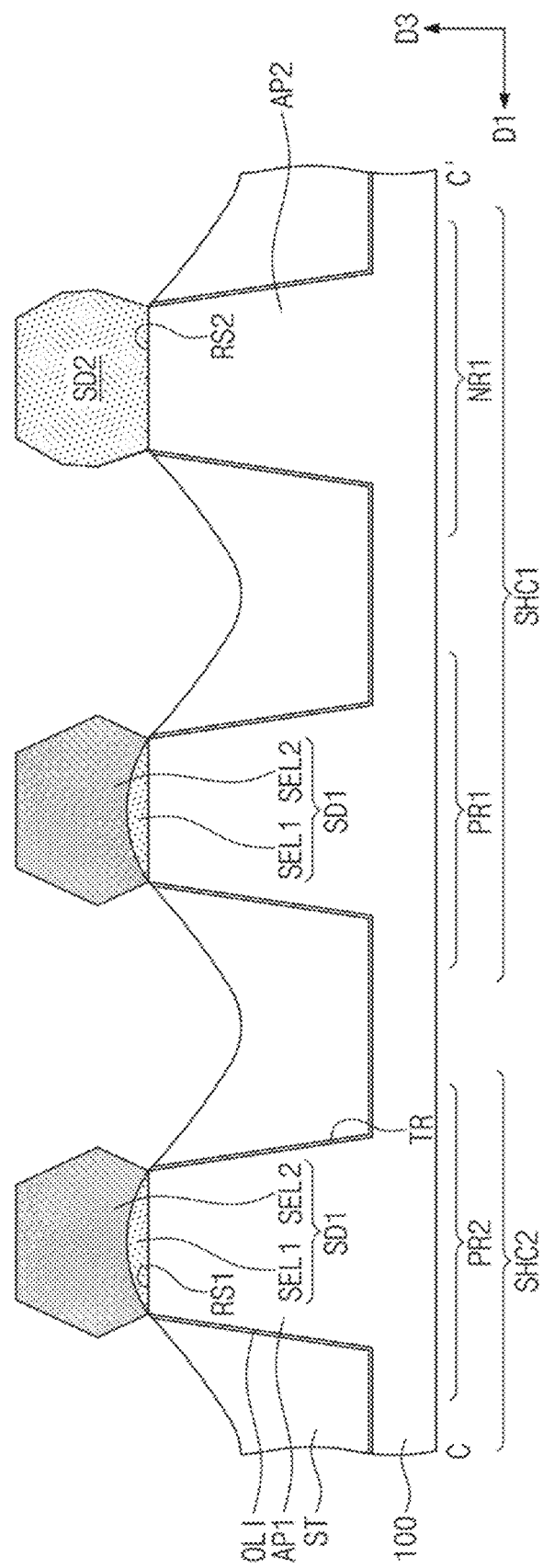
Figure 13D:
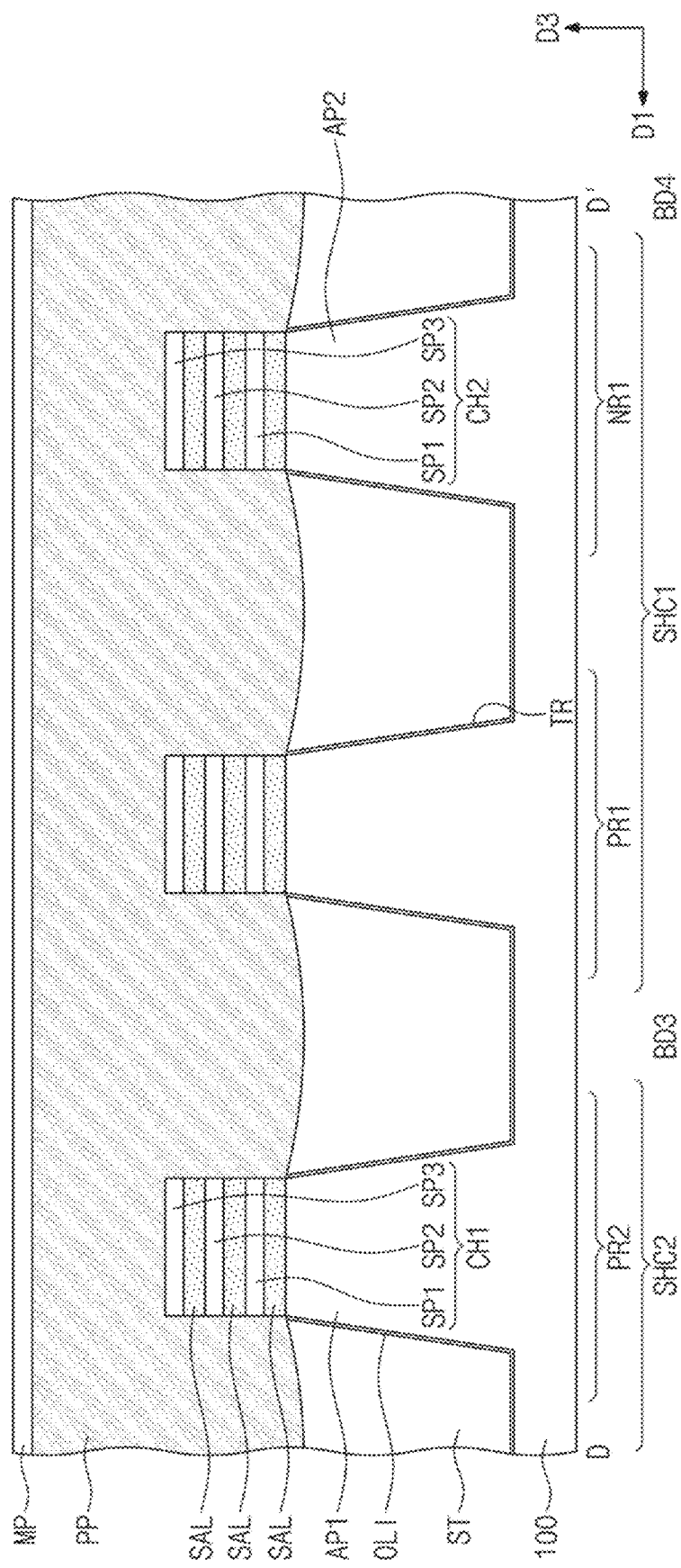
Figure 14A:
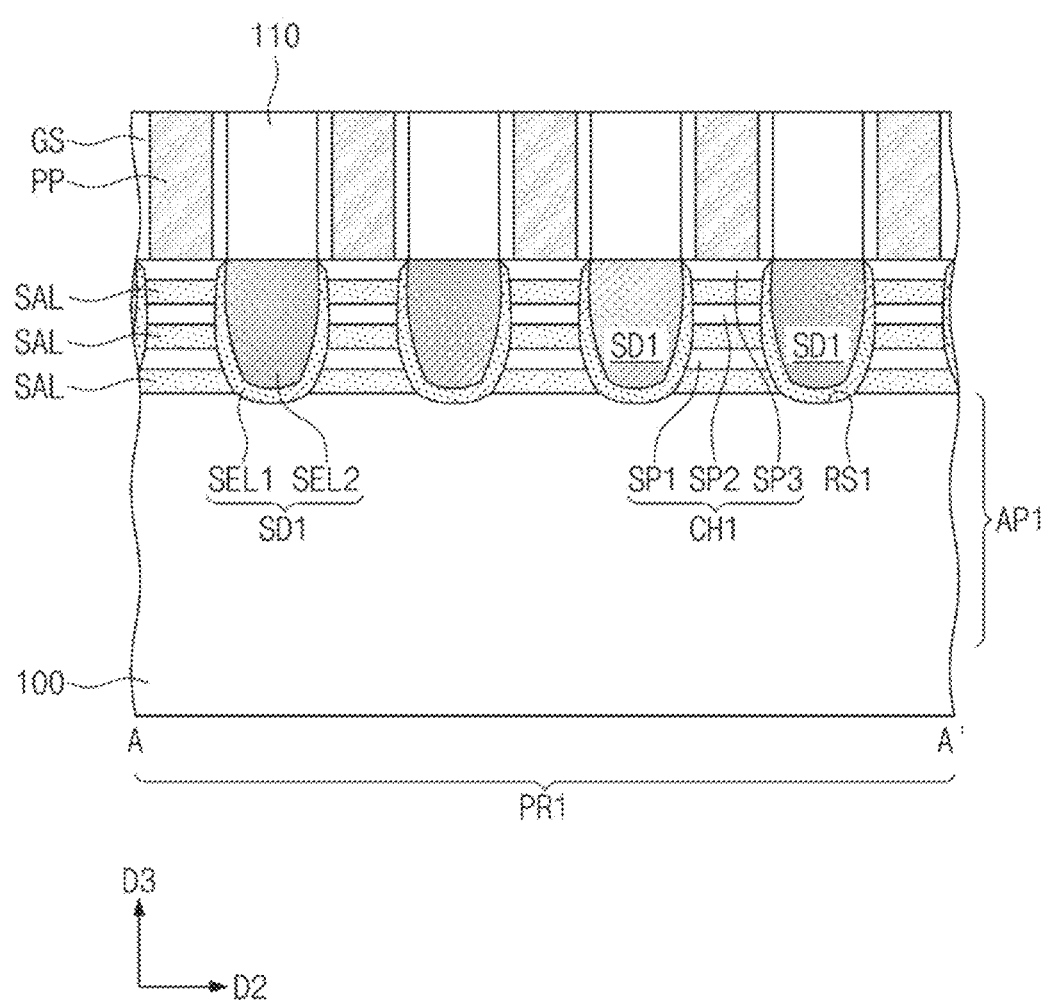
Figure 14B:
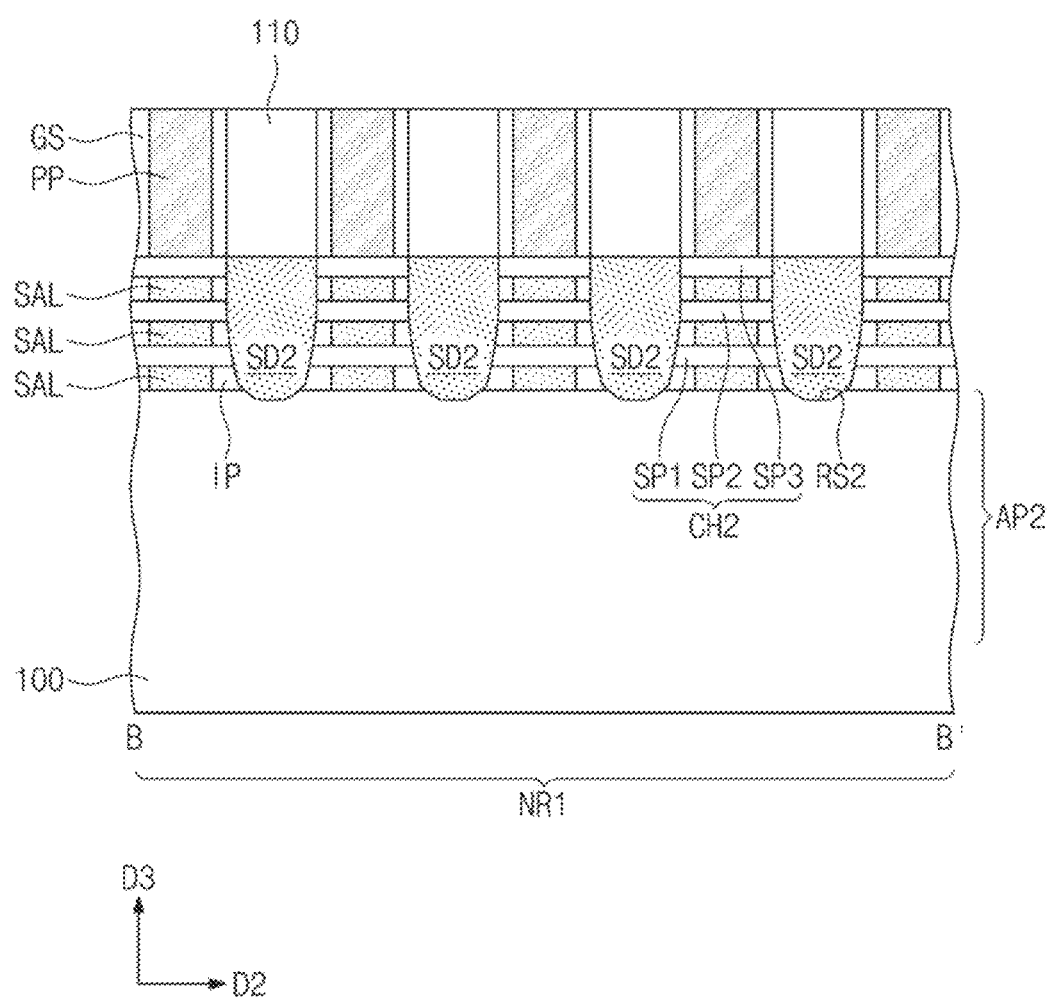
Figure 14C:
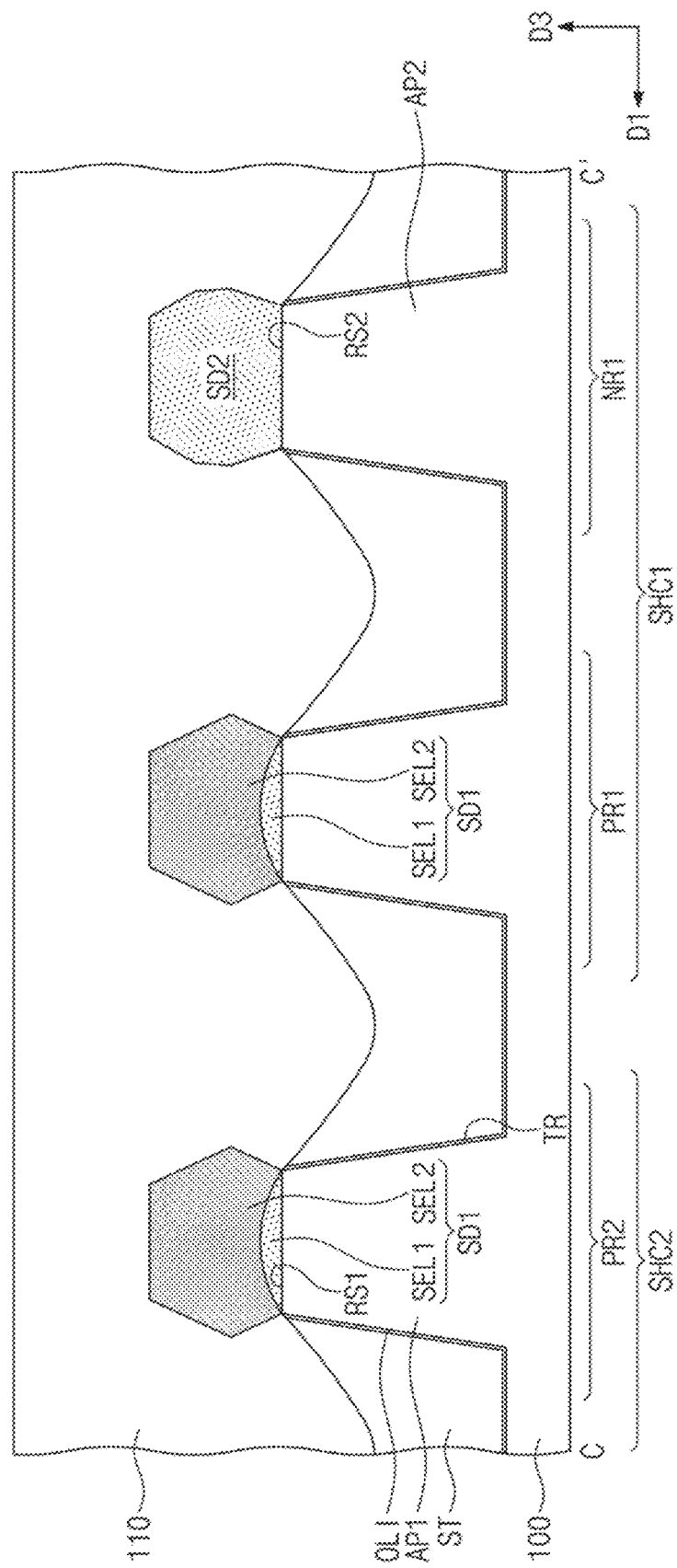
Figure 14D:
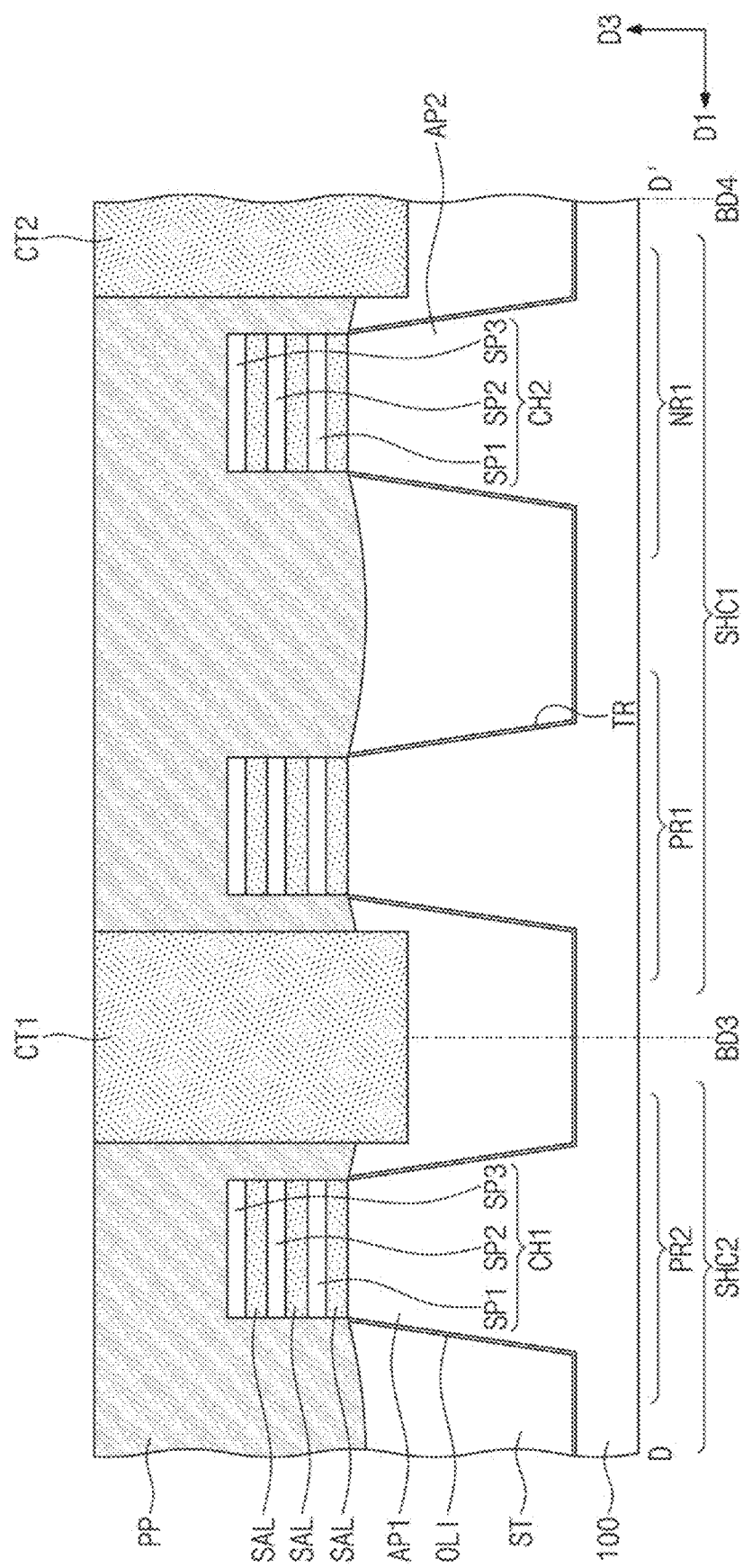

Referring to FIGS. 11A and 11B, sacrificial patterns PP may be formed on the substrate 100 to run (e.g., extend) across the stack patterns STP. Each of the sacrificial patterns PP may be formed to have a linear or bar shape that extends in a first direction D1. The sacrificial patterns PP may be arranged at a certain pitch along the second direction D2.

For example, the formation of the sacrificial patterns PP may include forming a sacrificial layer on the entire surface of the substrate 100, forming hardmask patterns MP on the sacrificial layer, and using the hardmask patterns MP as an etching mask to pattern the sacrificial layer. The sacrificial layer may include a polysilicon layer.

A pair of gate spacers GS may be formed on opposite sidewalls of each of the sacrificial patterns PP. The formation of the gate spacers GS may include conformally forming a gate spacer layer on the entire surface of the substrate 100 and anisotropically etching the gate spacer layer. The gate spacer layer may include at least one selected from SiCN, SiCON, and SiN. Alternatively, the gate spacer layer may be a multi-layer including at least two selected from SiCN, SiCON, and SiN.

Referring to FIGS. 12A to 12D, first recessions RS1 may be formed in the stack pattern STP on the first active pattern AP1. Second recessions RS2 may be formed in the stack pattern STP on the second active pattern AP2. During the formation of the first and second recessions RS1 and RS2, the device isolation layer ST may further be recessed on opposite sides of each of the first and second active patterns AP1 and AP2 (see FIG. 12C).

For example, the hardmask patterns MP and the gate spacers GS may be used as an etching mask such that the stack pattern STP on the first active pattern AP1 may be etched to form the first recessions RS1. The first recession RS1 may be formed between a pair of sacrificial patterns PP, The second recessions RS2 in the stack pattern STP on the second active pattern AP2 may be formed by the same method used for the formation of the first recessions RS1.

The active layers ACL may be used to form first, second, and third semiconductor patterns SP1, SP2, and SP3 that are sequentially stacked between neighboring first recessions RS1. The active layers ACL may also be used to form first, second, and third semiconductor patterns SP1, SP2, and SP3 that are sequentially stacked between neighboring second recessions RS2. A first channel pattern CH1 may be constituted by the first, second, and third semiconductor patterns SP1, SP2, and SP3 between neighboring first recessions RS1. A second channel pattern CH2 may be constituted by the first, second, and third semiconductor patterns SP1, SP2, and SP3 between neighboring second recessions RS2. Accordingly, first and second channel patterns CH1 and CH2 may be constituted by the stack patterns STP.

Referring to FIGS. 13A to 13D, first source/drain patterns SD1 may be formed in corresponding first recessions RS1. For example, a first selective epitaxial growth (SEG) process may be performed in which an inner wall of the first recession RS1 is used as a seed layer to form a first semiconductor layer SEL1. The first, second, and third semiconductor patterns SP1, SP2, and SP3 and the substrate 100 that are exposed to the first recession RS1 may be used as a seed from which the semiconductor layer SEL1 is grown. For example, the first SEG process may include chemical vapor deposition (CVD) or molecular beam epitaxy (MBE).

The first semiconductor layer SEL1 may include a semiconductor element (e.g., SiGe) whose lattice constant is greater than that of a semiconductor element included in the substrate 100. The first semiconductor layer SEL1 may contain germanium (Ge) whose concentration is relatively low. In some example embodiments of the present inventive concepts, the first semiconductor layer SEL1 may include only silicon (Si) and may not include germanium (Ge). The first semiconductor layer SEL1 may have a germanium concentration of about 0 at % to about 10 at %.

The first semiconductor layer SEL1 may undergo a second selective epitaxial growth (SEG) process to form a second semiconductor layer SEL2. The second semiconductor layer SEL2 may be formed to completely fill the first recession RS1. The second semiconductor layer SEL2 may contain germanium (Ge) whose concentration is relatively high. For example, the second semiconductor layer SEL2 may have a germanium (Ge) concentration of about 30 at % to about 75 at %.

The first semiconductor layer SEL1 and the second semiconductor layer SEL2 may constitute the first source/drain pattern SD1. Impurities may be in-situ implanted during the first and second SEG processes. Alternatively, after the first source/drain pattern SD1 is formed, impurities may be implanted into the first source/drain pattern SD1. The first source/drain pattern SD1 may be doped have a first conductivity type (e.g., p-type).

Second source/drain patterns SD2 may be formed in corresponding second recessions RS2. For example, a third selective epitaxial growth (SEG) process may be performed in which an inner wall of the second recession RS2 is used as a seed to form the second source/drain pattern SD2. The second source/drain pattern SD2 may include, for example, the same semiconductor element (e.g., Si) as that of the substrate 100. The second source/drain pattern SD2 may be doped to have a second conductivity type (e.g., n-type). Inner spacers IP may be correspondingly formed between the second source/drain pattern SD2 and the sacrificial layers SAL.

Referring to FIGS. 14A to 14D, a first interlayer dielectric layer 110 may be formed on the sacrificial patterns PP to cover the first and second source/drain patterns SD1 and SD2, the hardmask patterns MP, and the gate spacers GS. For example, the first interlayer dielectric layer 110 may include a silicon oxide layer.

The first interlayer dielectric layer 110 may be planarized until top surfaces of the sacrificial patterns PP are exposed. An etch-back or chemical mechanical polishing (CMP) process may be employed to planarize the first interlayer dielectric layer 110. The hardmask patterns MP may all be removed during the planarization process. As a result, the first interlayer dielectric layer 110 may have a top surface coplanar with those of the sacrificial patterns PP and those of the gate spacers GS.

A photolithography process may be used to selectively open a partial region of the sacrificial pattern PP. For example, it may be possible to selectively open the partial region of the sacrificial pattern PP on the third and fourth boundaries BD3 and BD4 of the first single height cell SHC1. The opened partial region of the sacrificial pattern PP may be selectively etched and removed. A space where the sacrificial pattern PP is removed (e.g., at least a partial region of the sacrificial pattern PP) may be filled with a dielectric material to form a gate cutting pattern CT1 or CT2. Accordingly, a gate cutting pattern CT1 and/or CT2 may be formed to penetrate at least a partial region of the sacrificial pattern PP, and the gate cutting pattern CT1 and/or CT2 may be formed based on using photolithography to selectively open the partial region of the sacrificial pattern PP, selectively removing the partial region of the sacrificial pattern PP, and forming the gate cutting pattern CT1 and/or CT2 based on providing a dielectric material to a space where the sacrificial pattern PP is removed.

Figure 15A:
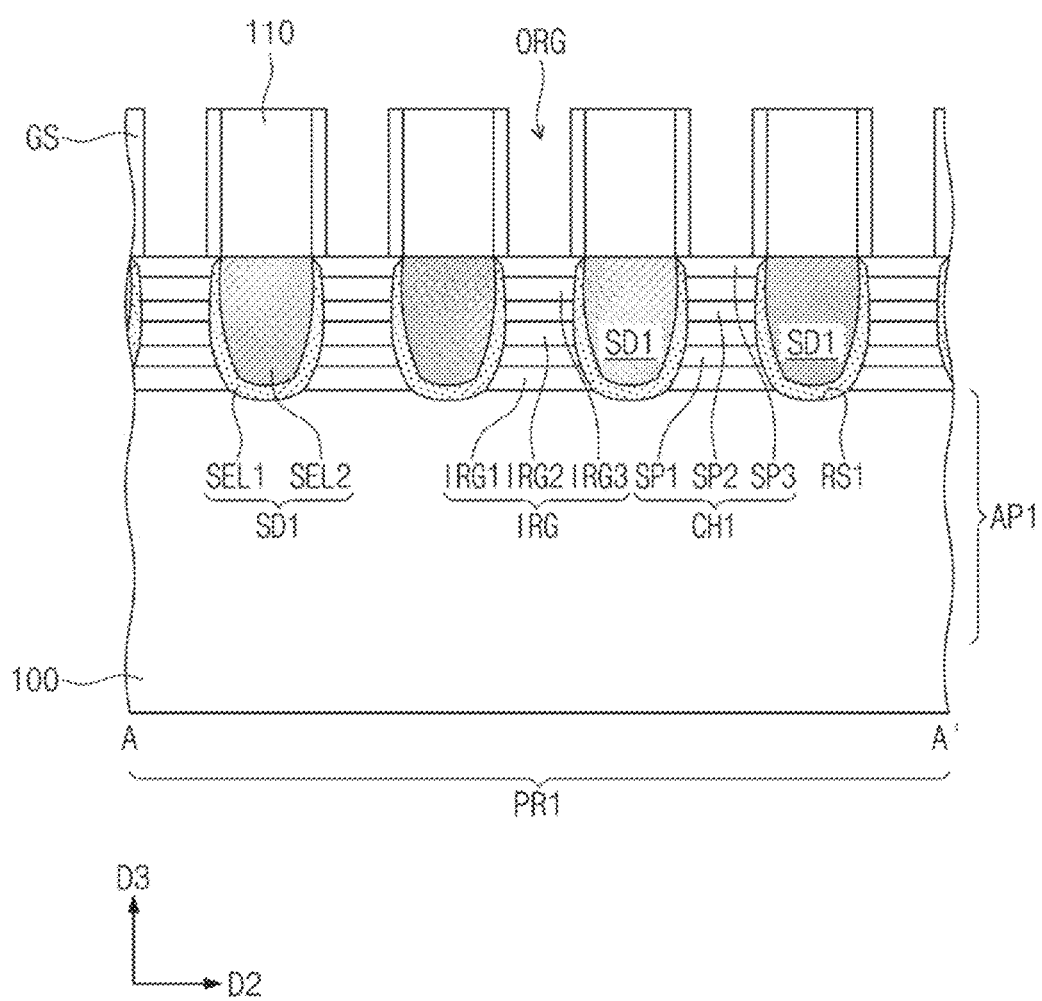
Figure 15B:
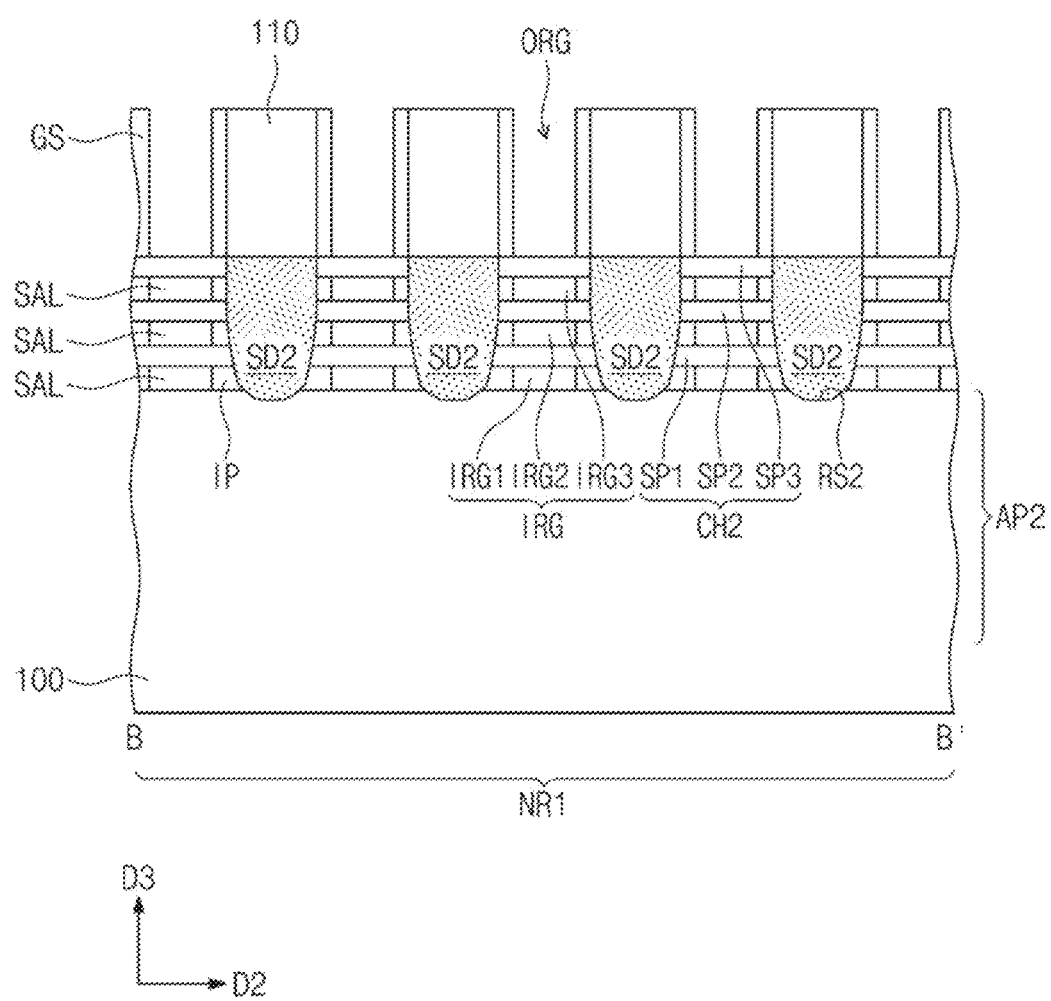
Figure 15C:
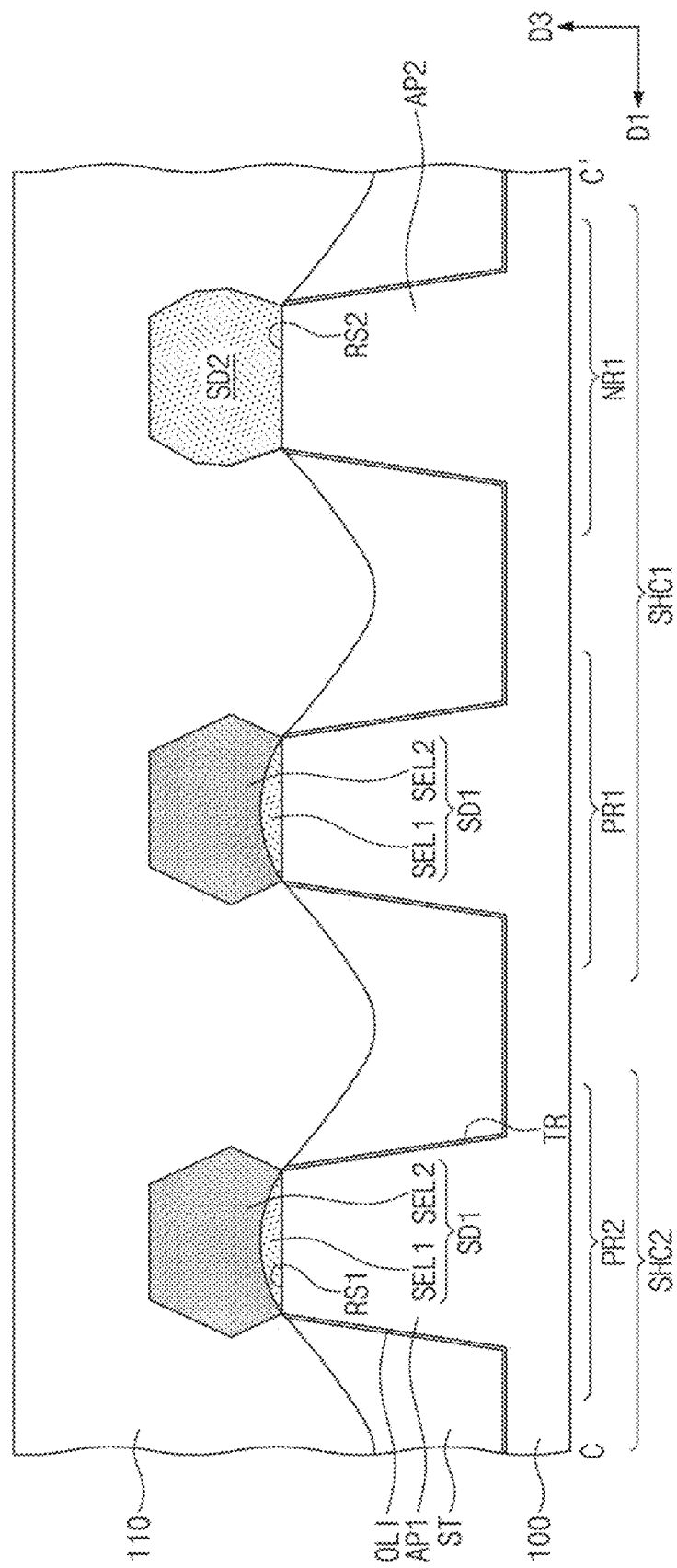
Figure 15D:
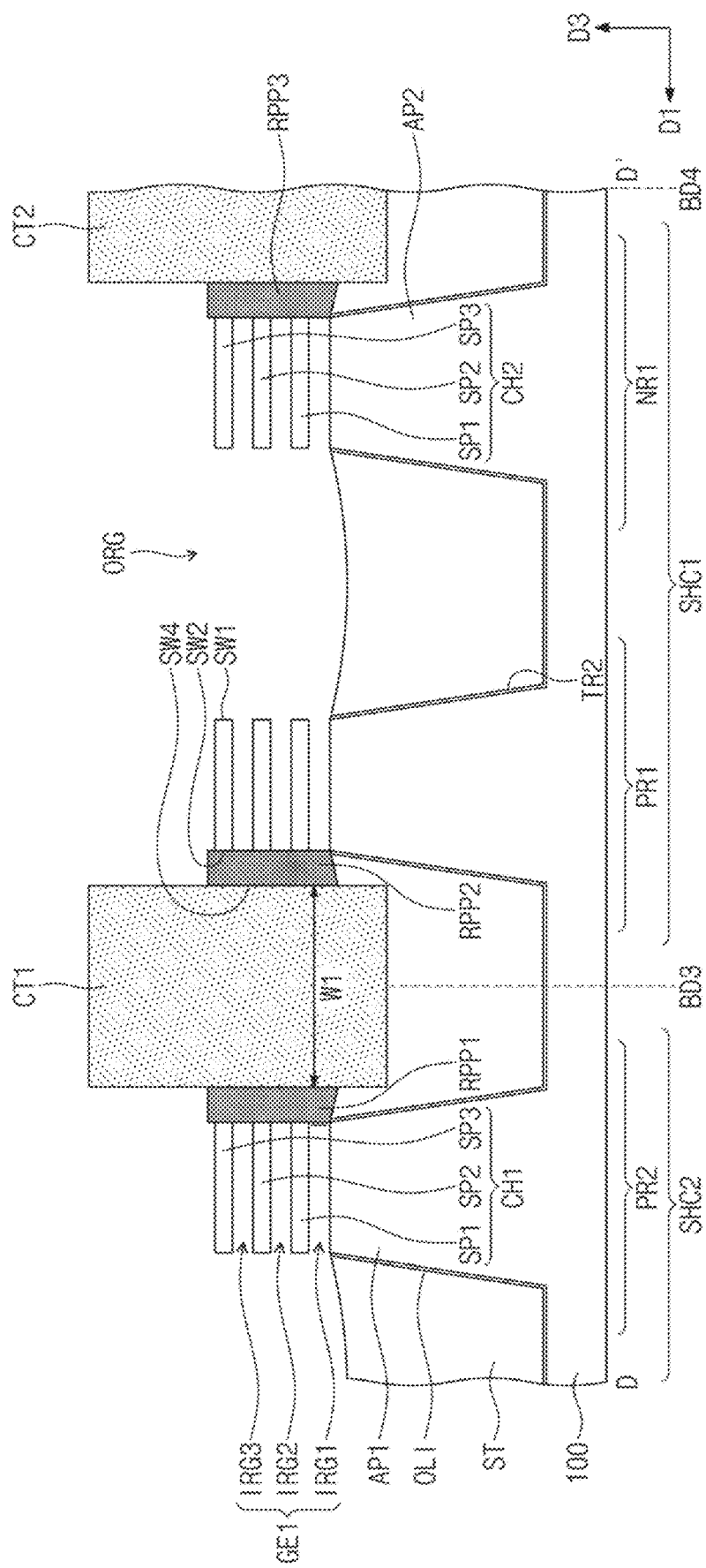
Figure 16A:
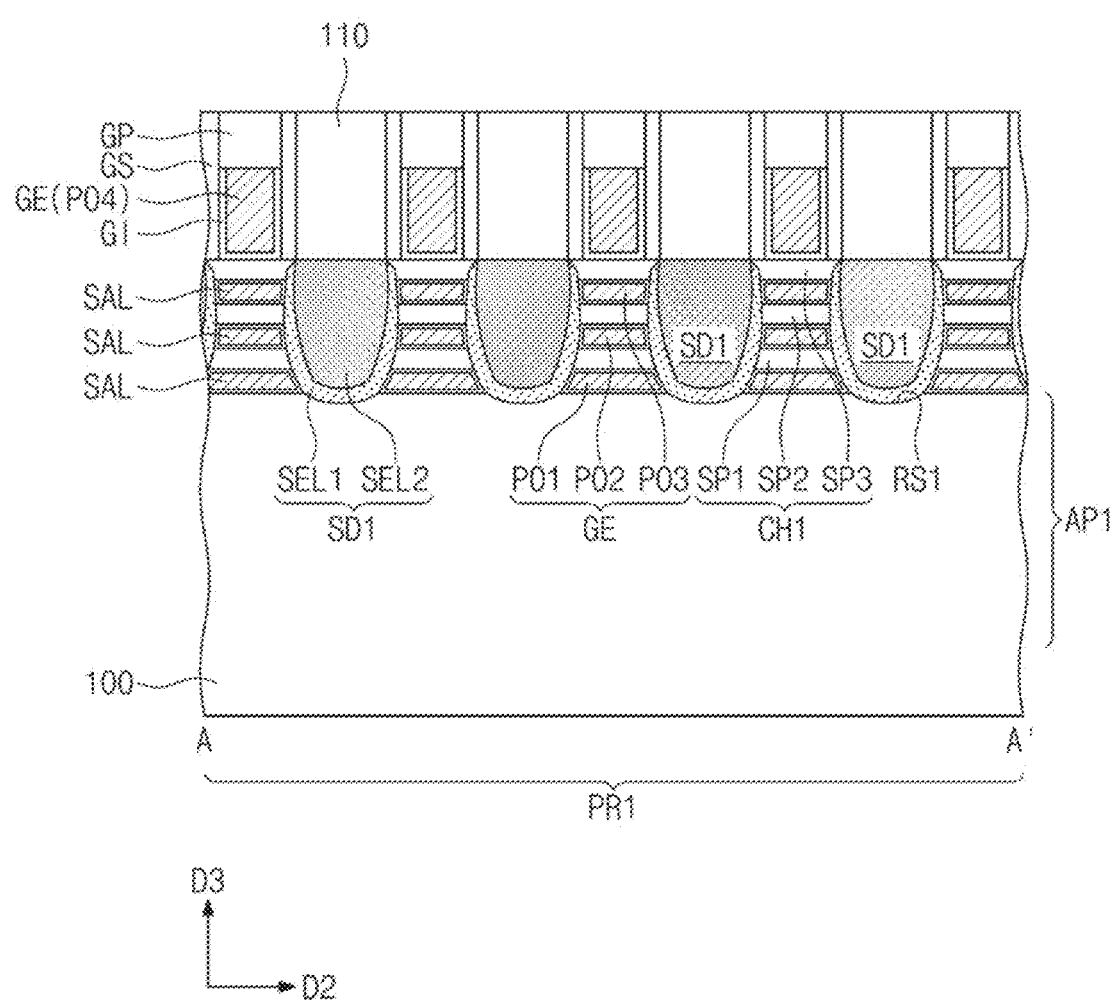
Figure 16B:
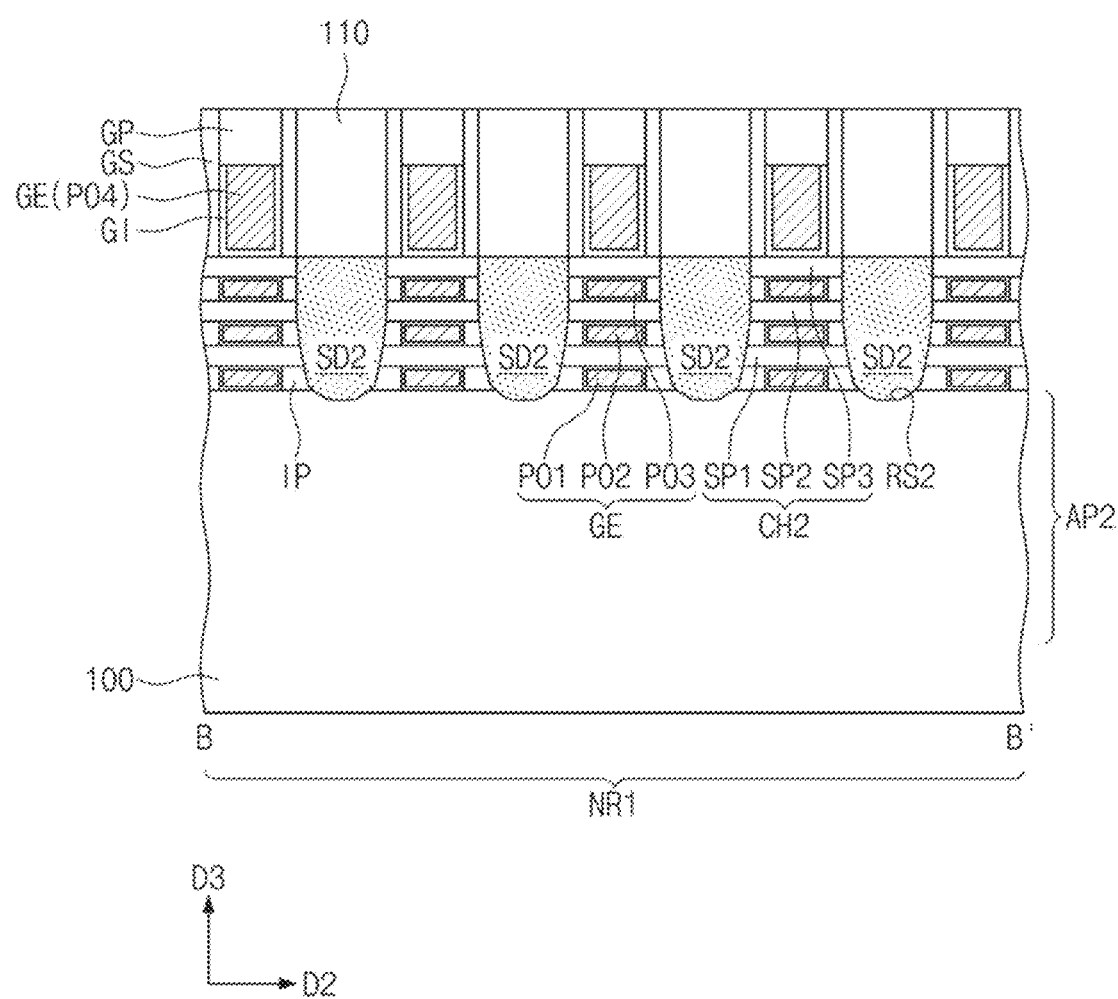
Figure 16C:
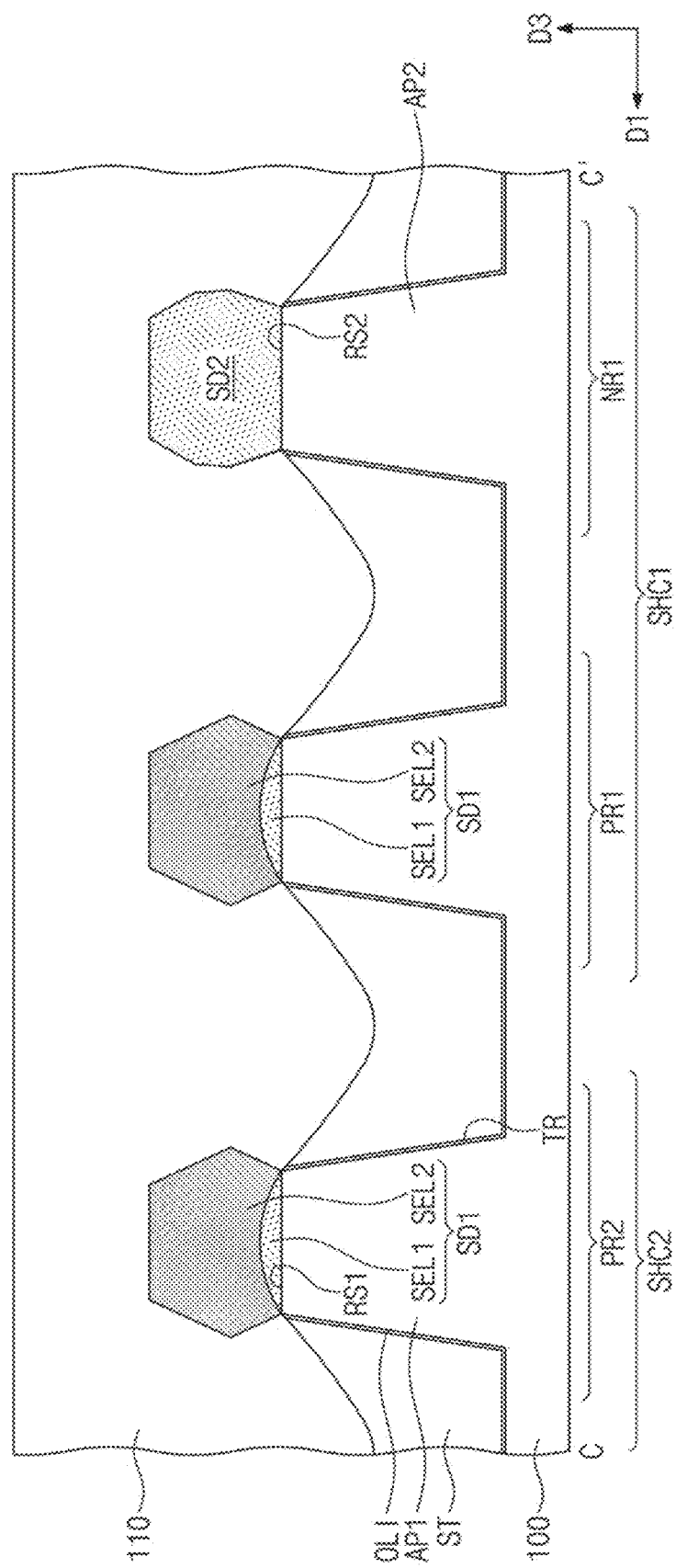
Figure 16D:
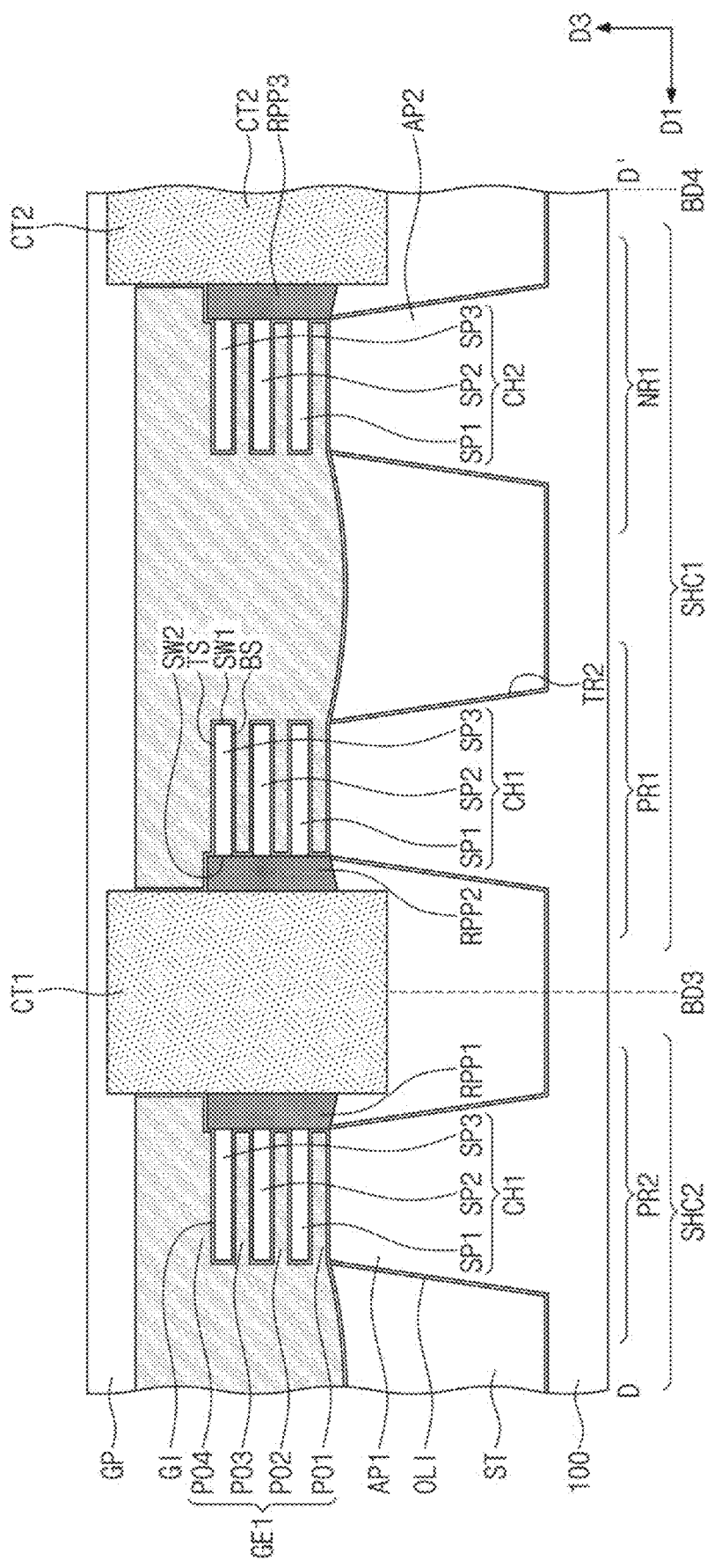

Referring to FIGS. 15A and 15D, exposed sacrificial patterns PP may be selectively removed. The removal of the sacrificial patterns PP may form outer areas ORG that expose the first and second channel patterns CH1 and CH2 (see FIG. 10D). Accordingly, an etching process may be used to selective etch the sacrificial patterns PP to form outer areas ORG that expose one or more of the stack patterns STP (e.g., first and/or second channel patterns CH1 and CH2).

The removal of the sacrificial patterns PP, and thus the etching process of the sacrificial patterns PP, may include performing a wet etching process that uses an etchant capable of selectively etching polysilicon. When a relatively small distance is provided between the gate cutting pattern CT1 or CT2 and the channel pattern CH1 or CH2, it may be difficult to introduce the etchant between the gate cutting pattern CT1 or CT2 and the channel pattern CH1 or CH2. Therefore, the sacrificial pattern PP may remain without being removed between the gate cutting pattern CT1 or CT2 and the channel pattern CH1 or CH2. In this sense, the sacrificial pattern PP may have an etch rate that is much smaller at its portion adjacent to the gate cutting patterns CT1 or CT2 than at its remainder. During the wet etching process, an etch rate with respect to the portion of the sacrificial pattern PP that remains between the gate cutting pattern CT1 or CT2 and the channel pattern CH1 or CH2 (e.g., the stack pattern STP), for example the portion that is adjacent to the gate cutting patterns CT1 or CT2, may be less than an etch rate with respect to a remainder of the sacrificial pattern PP that is removed (e.g., a portion that is distal to the gate cutting patterns CT1 or CT2). Therefore, residual patterns RPP1, RPP2, RPP3 may be constituted by the portion(s) of the sacrificial patterns PP that remain between the gate cutting patterns CT1 and CT2 and the channel patterns CH1 and CH2, while the remainder of the sacrificial patterns PP are removed. Accordingly, residual patterns RPP1, RPP2, and/or RPP3 may be formed during the etching process to form the outer areas ORG based on allowing one or more portions of the sacrificial pattern PP to remain between one or more gate cutting patterns CT1 and/or CT2 and the stack patterns STP.

For example, a first residual pattern RPP1 may be formed between the first gate cutting pattern CT1 and the first channel pattern CH1 on the second PMOSFET region PR2. A second residual pattern RPP2 may be formed between the first gate cutting pattern CT1 and the first channel pattern CH1 on the first PMOSFET region PR1. A third residual pattern RPP3 may be formed between the second gate cutting pattern CT2 and the second channel pattern CH2 on the first NMOSFET region NR1.

The sacrificial layers SAL of the stack patterns STP that are exposed to the outer area ORG may be selectively removed to form inner areas IRG (see FIG. 15D). For example, an etching process that selectively etches the sacrificial layers SAL of the stack patterns STP that are exposed to the outer area ORG may be performed such that the sacrificial layers SAL may be removed, and such that the first, second, and third semiconductor patterns SP1, SP2, and SP3 may remain. The etching process may have a high etch rate with respect to silicon-germanium whose germanium concentration is relatively high. For example, the etching process may have a high etch rate with respect to silicon-germanium whose germanium concentration is greater than about 10 at %.

During the etching process, the sacrificial layers SAL may be removed from the first and second PMOSFET regions PR1 and PR2 and from the first and second NMOSFET regions NR1 and NR2. The etching process may be a wet etching process. The etching material used for the etching process may promptly etch the sacrificial layer SAL whose germanium concentration is relatively high. During the etching process, the first source/drain pattern SD1 on the first and second PMOSFET regions PR1 and PR2 may be protected by the first semiconductor layer SEL1 whose germanium concentration is relatively low. As the first, second, and third residual patterns RPP1, RPP2, and RPP3 also include only polysilicon and do not include germanium, none of the first, second, and third residual patterns RPP1, RPP2, and RPP3 may be removed during the etching process.

Referring back to FIG. 15D, as the sacrificial layers SAL are selectively removed, the stacked first, second, and third semiconductor patterns SP1, SP2, and SP3 may remain on each of the first and second active patterns AP1 and AP2. The removal of the sacrificial layers SAL may form first, second, and third inner areas IRG1, IRG2, and IRG3.

For example, the first inner area IRG1 may be formed between the active pattern AP1 or AP2 and the first semiconductor pattern SP1, the second inner area IRG2 may be formed between the first semiconductor pattern SP1 and the second semiconductor pattern SP2, and the third inner area IRG3 may be formed between the second semiconductor pattern SP2 and the third semiconductor pattern SP3.

The first, second, and third residual patterns RPP1, RPP2, and RPP3 may each directly contact and support the first, second, and third semiconductor patterns SP1, SP2, and SP3. Even though the first, second, and third inner areas IRG1, IRG2, and IRG3 are formed, the first, second, and third residual patterns RPP1, RPP2, and RPP3 may cause the first, second, and third semiconductor patterns SP1, SP2, and SP3 to maintain their shapes without being collapsed.

Referring to FIGS. 16A to 16D, a gate dielectric layer GI may be conformally formed on the first, second, and third semiconductor patterns SP1, SP2, and SP3 that are exposed (e.g., the gate dielectric layer GI may be formed on, and may cover, exposed surfaces of the first, second, and third semiconductor patterns SP1, SP2, and SP3). A gate electrode GE may be formed on the gate dielectric layer GI.

The gate electrode GE may include first, second, and third parts PO1, PO2, and PO3 correspondingly formed in the first, second, and third inner areas IRG1, IRG2, and IRG3, and may also include a fourth part PO4 formed in the outer area ORG. Accordingly, the gate electrode GE may be formed to fill the first, second, and third inner areas IRG1, IRG2, and IRG3, and the outer area ORG.

The gate electrode GE may be recessed to have a reduced height. While the gate electrode GE is recessed, upper portions of first and second gate cutting patterns CT1 and CT2 may also be slightly recessed. A gate capping pattern GP may be formed on the recessed gate electrode GE.

Referring back to FIGS. 4 and 5A to 5E, a second interlayer dielectric layer 120 may be formed on the first interlayer dielectric layer 110. The second interlayer dielectric layer 120 may include a silicon oxide layer. Active contacts AC may be formed to penetrate the second and first interlayer dielectric layers 120 and 110 and to have electrical connection with the first and second source/drain patterns SD1 and SD2. A gate contact GC may be formed to penetrate the second interlayer dielectric layer 120 and the gate capping pattern GP and to have electrical connection with the gate electrode GE.

A pair of separation structures DB may be formed on opposite sides of each of the first and second single height cells SHC1 and SHC2. The separation structure DB may extend from the second interlayer dielectric layer 120 through the gate electrode GE into the active pattern AP1 or AP2. The separation structure DB may include a dielectric material, such as a silicon oxide layer or a silicon nitride layer.

A third interlayer dielectric layer 130 may be formed on the active contacts AC and the gate contacts GC. A first metal layer M1 may be formed in the third interlayer dielectric layer 130. A fourth interlayer dielectric layer 140 may be formed on the third interlayer dielectric layer 130. A second metal layer M2 may be formed in the fourth interlayer dielectric layer 140.

Figure 17:
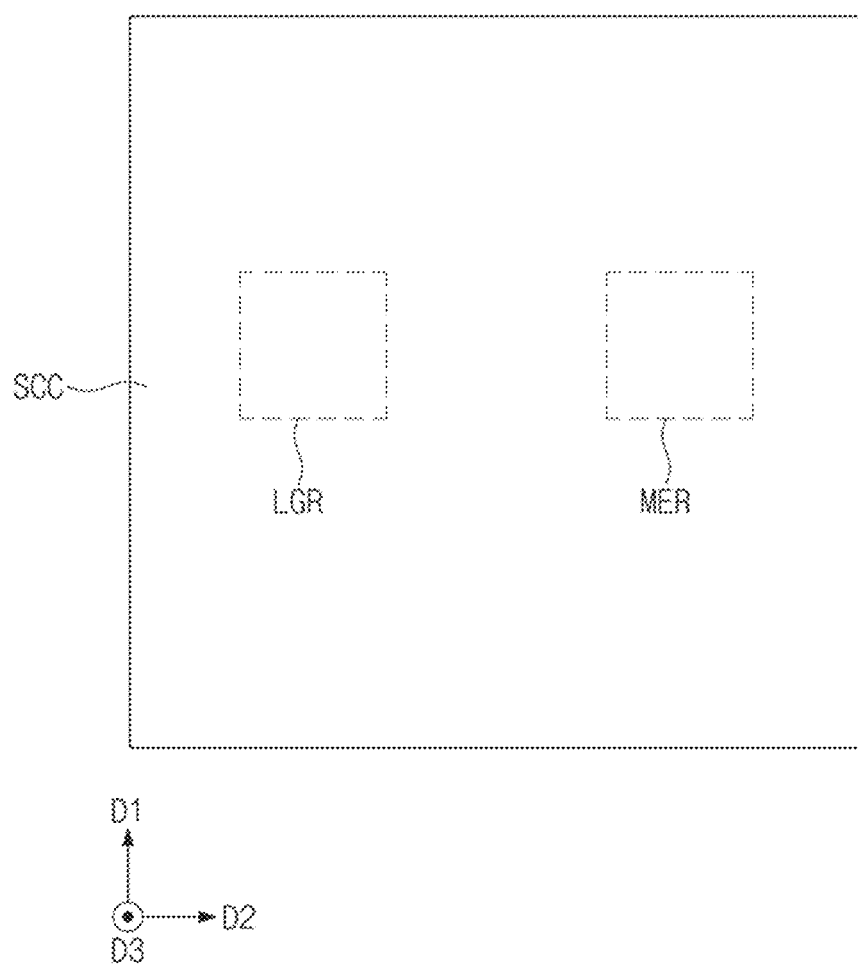
FIG. 17 illustrates a simplified plan view showing a semiconductor chip according to some example embodiments of the present inventive concepts.
Figure 18:
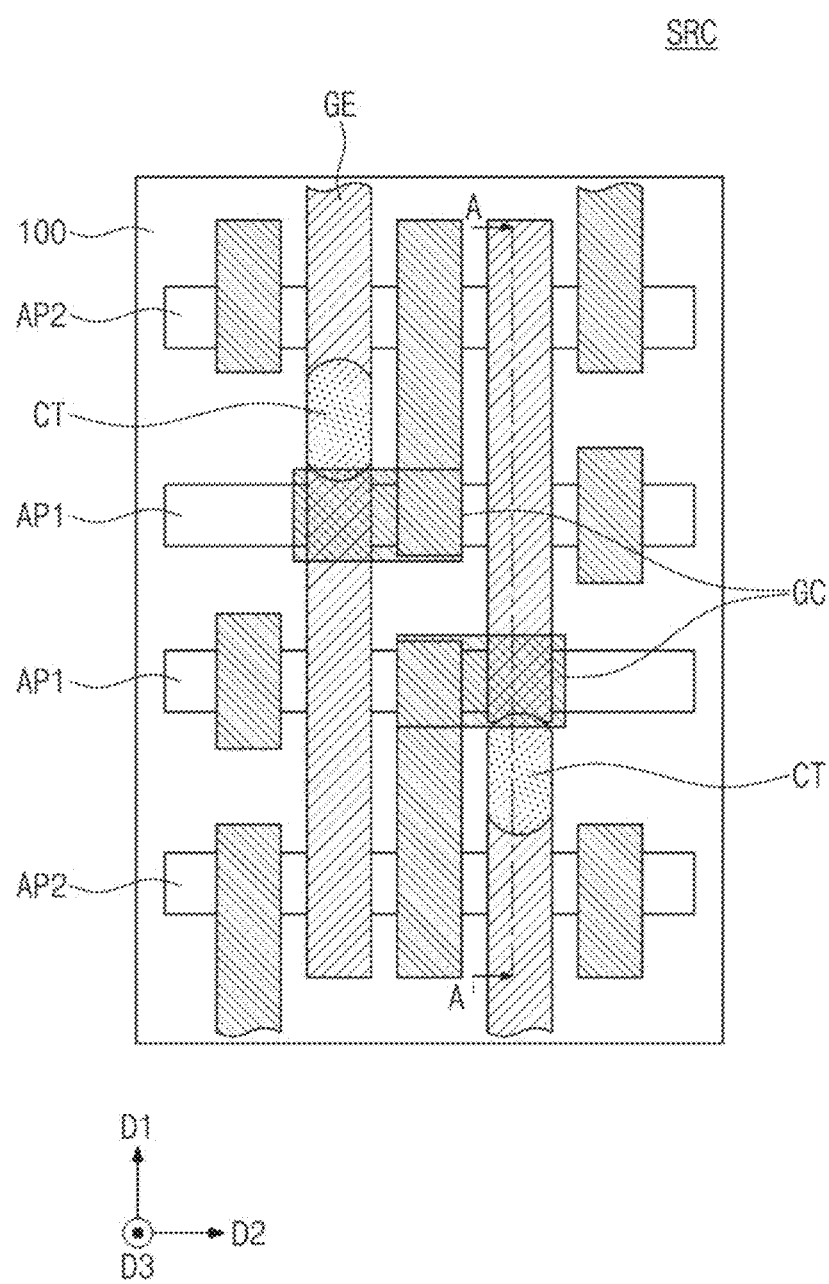
FIG. 18 illustrates a plan view showing an SRAM cell of a memory region depicted in FIG. 17.
Figure 19:
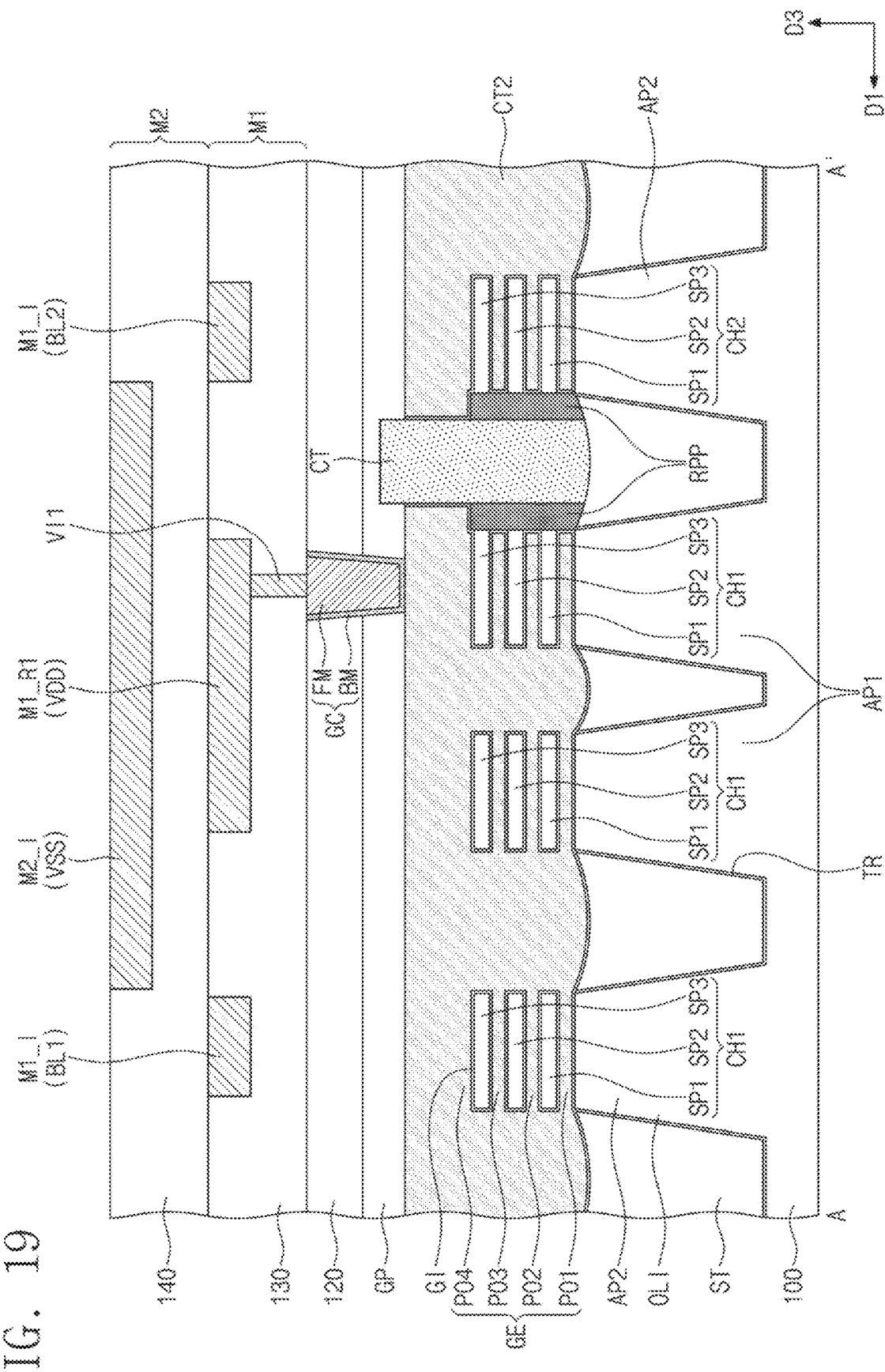
FIG. 19 illustrates a cross-sectional view taken along line A-A' of FIG. 17.

FIG. 17 illustrates a simplified plan view showing a semiconductor chip according to some example embodiments of the present inventive concepts. FIG. 18 illustrates a plan view showing an SRAM cell of a memory region depicted in FIG. 17. FIG. 19 illustrates a cross-sectional view taken along line A-A' of FIG. 18. In the description of the example embodiments shown in FIGS. 17-19 that follows, a detailed description of technical features repetitive to those discussed above with reference to FIGS. 4 and 5A to 5E will be omitted, and a difference thereof will be discussed in detail.

Referring to FIGS. 17 and 18, a semiconductor chip SCC, such as system-on-chip (SOC), processor, or application processor (AP), may include a logic region LGR and a memory region MER. The logic region LGR may include therein logic cells discussed above with reference to FIGS. 4 and 5A to 5E. The memory region MER may include static random access memory (SRAM) cells SRC therein.

Referring to FIGS. 17, 18 and 19, a 6T cell may be adopted as the SRAM cell SRC in the memory region MER of the semiconductor chip SCC. For example, the SRAM cell SRC of FIG. 18 may include first and second pull-up transistors, first and second pull-down transistors, and first and second pass-gate transistors.

The SRAM cell SRC may include first active patterns AP1 and second active patterns AP2. For example, the SRAM cell SRC may include two first active patterns AP1 and two second active patterns AP2.

A pair of gate electrodes GE may be provided to run across the first and second active patterns AP1 and AP2. Gate cutting patterns CT may be provided to penetrate corresponding gate electrodes GE.

Referring to FIG. 19, the gate cutting pattern CT may be provided between the first active pattern AP1 and its adjacent second active pattern AP2. The gate cutting pattern CT may be provided between the first channel pattern CH1 and the second channel pattern CH2. As shown in FIG. 19, the SRAM cell SRC may include a first channel pattern CH1 on the first active pattern AP1, where the first channel pattern CH1 includes a plurality of semiconductor patterns SP1 to SP3 that are stacked and spaced apart from each other. As shown in FIG. 19, the SRAM cell SRC may include a second channel pattern CH2 on the second active pattern AP2, where the second channel pattern CH2 includes a separate plurality of semiconductor patterns SP1 to SP3 that are stacked and spaced apart from each other. As shown, the gate electrode GE may be on the first channel pattern CH1, and the gate cutting pattern CT may be adjacent to the first channel pattern CH1 and may penetrate the gate electrode GE. As shown, the gate electrode GE may be on the second channel pattern CH2, and the gate cutting pattern CT may be adjacent to the second channel pattern CH2 and may penetrate the gate electrode GE.

A residual pattern RPP may be interposed between the gate cutting pattern CT and the first channel pattern CH1 and between the gate cutting pattern CT and the second channel pattern CH2. The residual pattern RPP may be in direct contact with sidewalls of the first, second, and third semiconductor patterns SP1, SP2, and SP3. As shown in FIG. 19, the residual pattern RPP may cover an outermost sidewall (e.g., SW2) of at least one of the semiconductor patterns SP1 to SP3 of the first channel pattern CH1 and/or the second channel pattern CH2, and the gate electrode GE may be on a top surface (e.g., TS), a bottom surface (e.g., BS), and a sidewall of the at least one semiconductor pattern of the first channel pattern CH1 and/or the second channel pattern CH2 and the gate electrode GE is not on the outermost sidewall (e.g., SW2) of the at least one semiconductor pattern of the first channel pattern CH1 and/or the second channel pattern CH2.

In some example embodiments, similarly to FIGS. 6-7, a top surface (e.g., TOS) of the residual pattern RPP may have a concave profile, and the top surface of the residual pattern RPP may have a height that increases in a direction from the first and/or second channel pattern CH1 and/or CH2 toward the gate cutting pattern CT.

In some example embodiments, similarly to FIG. 6, a first sidewall (e.g., SW3) of the residual pattern RPP may be in contact (e.g., direct contact) with the outermost sidewall (e.g., SW), a second sidewall (e.g., SW4) of the residual pattern RPP may be in contact (e.g., direct contact) with the gate cutting pattern CT, where the second sidewall (e.g., SW4) is opposite to the first sidewall (e.g., SW3), and the residual pattern RPP may include at least one protruding region (e.g., PRT) that protrudes beyond the first sidewall (e.g., SW3) and toward the gate electrode GE, for example such that the at least one protruding region overlaps at least a portion of the first channel region CH1 and/or second channel region CH2 in the third direction D3.

In some example embodiments, similarly to FIG. 7, a top surface (e.g., TOS) of the residual pattern RPP may be lower than an uppermost semiconductor pattern (e.g., SP3) of the plurality of semiconductor patterns SP1 to SP3 of the first channel pattern CH1 and/or the second channel pattern CH2, the at least one semiconductor pattern (e.g., SP2) is below the uppermost semiconductor pattern (SP3), and the gate electrode GE surrounds the uppermost semiconductor pattern (e.g., SP3).

In some example embodiments of the present inventive concepts, as shown in FIG. 8, the residual pattern RPP may be omitted from the logic cell of FIG. 4, or the first single height cell SHC1. For example, the SRAM cell SRC that requires a high-speed operation may be configured such that the residual pattern RPP is provided to reduce a parasitic capacitance of the gate electrode GE, and the first single height cell SHC1 that requires a precise operation may be configured such that the residual pattern RPP is omitted to cause the gate electrode GE to have a gate-all-around structure.

In some example embodiments of the present inventive concepts, not only the SRAM cell SRC but also the logic cell of FIG. 4 may include the residual pattern RPP as shown in FIG. 5D. Whether the residual pattern RPP is included or not may depend on cell characteristics as discussed above.

A semiconductor device according to the present inventive concepts may be configured such that a residual pattern is provided between a channel pattern and a gate cutting pattern, and such that a gate electrode decreases in length and volume. Accordingly, a parasitic capacitance of the gate electrode may be reduced to increase an operating speed and electrical characteristics of the semiconductor device.

For the semiconductor device according to some example embodiments of the present inventive concepts, the gate electrode may have a gate-all-around structure by omitting the residual pattern from a region that requires a channel control capacity, and a parasitic capacitance of the gate electrode may be reduced by providing the residual pattern to a region that requires a high-speed operation.

Although some example embodiments of inventive concepts have been discussed with reference to accompanying figures, it will be understood that various changes in form and details may be made therein without departing from the spirit and scope of inventive concepts. It therefore will be understood that the example embodiments described above are just illustrative but not limitative in all aspects.

What is claimed is:

1. A semiconductor device, comprising:
a first active pattern on a substrate;
a pair of first source/drain patterns on the first active pattern and a first channel pattern between the pair of first source/drain patterns, the first channel pattern including a plurality of semiconductor patterns that are stacked and spaced apart from each other;
a first gate electrode on the first channel pattern;
a first gate cutting pattern that is adjacent to the first channel pattern and penetrates the first gate electrode; and
a first residual pattern between the first gate cutting pattern and the first channel pattern,
wherein the first residual pattern covers an outermost sidewall of at least one semiconductor pattern of the plurality of semiconductor patterns of the first channel pattern, and
wherein the first gate electrode includes a first extension on an upper portion of the first gate electrode, and the first extension vertically overlaps the first residual pattern.

2. The semiconductor device of claim 1, wherein
the at least one semiconductor pattern of the plurality of semiconductor patterns of the first channel pattern includes a top surface, a bottom surface, a first sidewall, and a second sidewall opposite to the first sidewall,
the second sidewall constitutes the outermost sidewall of the at least one semiconductor pattern of the plurality of semiconductor patterns of the first channel pattern, and
the first gate electrode is on the top surface, the bottom surface, and the first sidewall, and is not on the second sidewall.

3. The semiconductor device of claim 1, wherein the first residual pattern includes polysilicon, silicon oxide, or any combination thereof.

4. The semiconductor device of claim 1, wherein
a top surface of the first residual pattern has a concave profile, and
the top surface of the first residual pattern has a height that increases in a direction from the first channel pattern toward the first gate cutting pattern.

5. The semiconductor device of claim 1, wherein
a first sidewall of the first residual pattern is in direct contact with the outermost sidewall of the at least one semiconductor pattern of the plurality of semiconductor patterns of the first channel pattern,
a second sidewall of the first residual pattern is in direct contact with the first gate cutting pattern, the second sidewall being opposite to the first sidewall, and
the first residual pattern includes at least one protruding region that protrudes beyond the first sidewall and toward the first gate electrode.

6. The semiconductor device of claim 1, wherein
a top surface of the first residual pattern is lower than an uppermost semiconductor pattern of the plurality of semiconductor patterns of the first channel pattern,
the at least one semiconductor pattern is below the uppermost semiconductor pattern of the plurality of semiconductor patterns of the first channel pattern, and
the first gate electrode surrounds the uppermost semiconductor pattern of the plurality of semiconductor patterns of the first channel pattern.

7. The semiconductor device of claim 1, further comprising:
a second active pattern on the substrate;
a pair of second source/drain patterns on the second active pattern and a second channel pattern between the pair of second source/drain patterns, the second channel pattern including a separate plurality of semiconductor patterns that are stacked and spaced apart from each other, wherein the first gate electrode is on both the first channel pattern and the second channel pattern;
a second gate cutting pattern that is adjacent to the second channel pattern and penetrates the first gate electrode; and
a second residual pattern between the second gate cutting pattern and the second channel pattern,
wherein the second residual pattern covers an outermost sidewall of at least one semiconductor pattern of the separate plurality of semiconductor patterns of the second channel pattern, and
wherein the first gate electrode further includes a second extension on the upper portion of the first gate electrode, and the second extension vertically overlaps the second residual pattern.

8. The semiconductor device of claim 1, further comprising:
a second active pattern on the substrate;
a pair of second source/drain patterns on the second active pattern and a second channel pattern between the pair of second source/drain patterns, the second channel pattern including a separate plurality of semiconductor patterns that are stacked and spaced apart from each other, wherein the first gate electrode is on both the first channel pattern and the second channel pattern; and
a second gate cutting pattern that is adjacent to the second channel pattern and penetrates the first gate electrode,
wherein the first gate electrode surrounds each semiconductor pattern of the separate plurality of semiconductor patterns of the second channel pattern.

9. The semiconductor device of claim 1, further comprising:
a second active pattern on the substrate;
a pair of second source/drain patterns on the second active pattern and a second channel pattern between the pair of second source/drain patterns, the second channel pattern including a separate plurality of semiconductor patterns that are stacked and spaced apart from each other;

a second gate electrode on the second channel pattern; and
a second gate cutting pattern that is adjacent to the second channel pattern and penetrates the second gate electrode,
wherein the second gate electrode surrounds each semiconductor pattern of the separate plurality of semiconductor patterns of the second channel pattern.

10. The semiconductor device of claim 9, wherein
the first active pattern is in a static random access memory (SRAM) cell, and
the second active pattern is in a logic cell.

11. A semiconductor device, comprising:
a logic region including a logic cell; and
a memory region including a static random access memory (SRAM) cell,
wherein the logic cell includes:
  a first active pattern;
  a first channel pattern on the first active pattern, the first channel pattern including a plurality of semiconductor patterns that are stacked and spaced apart from each other;
  a first gate electrode on the first channel pattern; and
  a first gate cutting pattern that is adjacent to the first channel pattern and penetrates the first gate electrode,
wherein the SRAM cell includes
  a second active pattern;
  a second channel pattern on the second active pattern, the second channel pattern including a separate plurality of semiconductor patterns that are stacked and spaced apart from each other;
  a second gate electrode on the second channel pattern;
  a second gate cutting pattern that is adjacent to the second channel pattern and penetrates the second gate electrode; and
  a residual pattern between the second gate cutting pattern and the second channel pattern,
wherein the first gate electrode has a gate-all-around structure in which the first gate electrode surrounds the plurality of semiconductor patterns of the first channel pattern,
wherein the residual pattern covers an outermost sidewall of at least one semiconductor pattern of the separate plurality of semiconductor patterns of the second channel pattern, and
wherein the second gate electrode is on a top surface, a bottom surface, and a sidewall of the at least one semiconductor pattern of the separate plurality of semiconductor patterns of the second channel pattern, and is not on the outermost sidewall.

12. The semiconductor device of claim 11, wherein the residual pattern includes polysilicon, silicon oxide, or any combination thereof.

13. The semiconductor device of claim 11, wherein
a top surface of the residual pattern has a concave profile, and
the top surface of the residual pattern has a height that increases in a direction from the second channel pattern toward the second gate cutting pattern.

14. The semiconductor device of claim 11, wherein
a first sidewall of the residual pattern is in direct contact with the outermost sidewall,
a second sidewall of the residual pattern is in direct contact with the second gate cutting pattern, the second sidewall being opposite to the first sidewall, and
the residual pattern includes at least one protruding region that protrudes beyond the first sidewall and toward the second gate electrode.

15. The semiconductor device of claim 11, wherein
a top surface of the residual pattern is lower than an uppermost semiconductor pattern of the separate plurality of semiconductor patterns of the second channel pattern,
the at least one semiconductor pattern of the separate plurality of semiconductor patterns of the second channel pattern is below the uppermost semiconductor pattern, and
the second gate electrode surrounds the uppermost semiconductor pattern.

16. A semiconductor device, comprising:
a first active pattern and a second active pattern on a substrate;
a pair of first source/drain patterns on the first active pattern and a first channel pattern between the pair of first source/drain patterns;
a pair of second source/drain patterns on the second active pattern and a second channel pattern between the pair of second source/drain patterns, the first channel pattern including a plurality of semiconductor patterns that are stacked and spaced apart from each other, the second channel pattern including a separate plurality of semiconductor patterns that are stacked and spaced apart from each other;
a gate electrode on the first and second channel patterns;
a gate dielectric layer between the gate electrode and the first and second channel patterns;
a gate spacer on at least one sidewall of the gate electrode;
a first gate cutting pattern that is adjacent to the first channel pattern and penetrates the gate electrode;
a second gate cutting pattern that is adjacent to the second channel pattern and penetrates the gate electrode;
a first residual pattern between the first gate cutting pattern and the first channel pattern;
a gate capping pattern on the gate electrode and the first and second gate cutting patterns;
an interlayer dielectric layer on the gate capping pattern;
an active contact that penetrates the interlayer dielectric layer and has electrical connection with at least one source/drain pattern of the pair of first source/drain patterns and/or the pair of second source/drain patterns;
a gate contact that penetrates the interlayer dielectric layer and the gate capping pattern and has electrical connection with the gate electrode;
a first metal layer on the interlayer dielectric layer, the first metal layer including a first power line on the first gate cutting pattern, a second power line on the second gate cutting pattern, and a plurality of first wiring lines between the first and second power lines, the first wiring lines being correspondingly electrically connected to the active contact and the gate contact; and
a second metal layer on the first metal layer,
wherein the second metal layer includes a plurality of second wiring lines electrically connected to the first metal layer,
wherein the first residual pattern covers a first outermost sidewall of at least one semiconductor pattern of the plurality of semiconductor patterns of the first channel pattern, and
wherein a top surface of the first residual pattern has a height that increases in a direction from the first channel pattern toward the first gate cutting pattern.

17. The semiconductor device of claim 16, further comprising:
- a second residual pattern between the second gate cutting pattern and the second channel pattern,
- wherein the second residual pattern covers a second outermost sidewall of at least one semiconductor pattern of the separate plurality of semiconductor patterns of the second channel pattern.

18. The semiconductor device of claim 16, wherein the gate electrode surrounds the separate plurality of semiconductor patterns of the second channel pattern.

19. The semiconductor device of claim 16, wherein
- a first sidewall of the first residual pattern is in direct contact with the first outermost sidewall of the at least one semiconductor pattern of the plurality of semiconductor patterns of the first channel pattern,
- a second sidewall of the first residual pattern is in direct contact with the first gate cutting pattern, the second sidewall being opposite to the first sidewall, and
- the first residual pattern includes at least one protruding region that protrudes beyond the first sidewall and toward the gate electrode.

20. The semiconductor device of claim 16, wherein the top surface of the first residual pattern is lower than an uppermost semiconductor pattern of the plurality of semiconductor patterns of the first channel pattern, the at least one semiconductor pattern of the plurality of semiconductor patterns of the first channel pattern is below the uppermost semiconductor pattern of the plurality of semiconductor patterns of the first channel pattern, and the gate electrode surrounds the uppermost semiconductor pattern of the plurality of semiconductor patterns of the first channel pattern.

* * * * *